United States Patent
Kilen et al.

(10) Patent No.: US 9,853,417 B2
(45) Date of Patent: *Dec. 26, 2017

(54) NONEQUILIBRIUM PULSED FEMTOSECOND SEMICONDUCTOR DISK LASER

(71) Applicant: Arizona Board of Regents on behalf of the University of Arizona, Tucson, AZ (US)

(72) Inventors: Isak R. Kilen, Tucson, AZ (US); Stephan W. Koch, Tucson, AZ (US); Jerome V. Moloney, Tucson, AZ (US)

(73) Assignee: ARIZONA BOARD OF REGENTS ON BEHALF OF THE UNIVERSITY OF ARIZONA, Tucson, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/264,335

(22) Filed: Sep. 13, 2016

(65) Prior Publication Data

US 2017/0133825 A1    May 11, 2017

Related U.S. Application Data

(63) Continuation-in-part of application No. 14/847,908, filed on Sep. 8, 2015, now Pat. No. 9,466,948.

(Continued)

(51) Int. Cl.
*H01S 3/098*    (2006.01)
*H01S 5/065*    (2006.01)
(Continued)

(52) U.S. Cl.
CPC ............ *H01S 5/065* (2013.01); *H01S 3/0604* (2013.01); *H01S 3/1115* (2013.01);
(Continued)

(58) Field of Classification Search
CPC .......... H01S 5/34; H01S 5/042; H01S 5/0657; H01S 5/187; H01S 5/065; H01S 3/1115; H01S 3/0604
See application file for complete search history.

(56) References Cited

U.S. PATENT DOCUMENTS 9,466,948 B2 * 10/2016 Moloney ............... H01S 3/1115

OTHER PUBLICATIONS

Klopp, et al., "Pulse repetition rate of 92 GHz or pulse duration shorter than 110 fs from a mode-locked semiconductor disk laser" APL, 98, 071103 (2011).

(Continued)

*Primary Examiner* — Kinam Park
(74) *Attorney, Agent, or Firm* — Yakov S. Sidorin; Quarles & Brady LLP

(57) ABSTRACT

A surface-emitting semiconductor laser system contains at least one MQW unit of at least three constituent QWs, axially separated from one another substantially non-equidistantly. The MQW unit is located within the axial extent covered, in operation of the laser, by a half-cycle of the standing wave of the field at a wavelength within the gain spectrum of the gain medium; immediately neighboring nodes of the standing wave are on opposite sides of the MQW unit. So-configured MQW unit can be repeated multiple times and/or complemented with individual QWs disposed outside of the half-cycle of the standing wave with which such MQW unit is associated. The semiconductor laser further includes a pump source configured to input energy in the semiconductor gain medium and a mode-locking element to initiate mode-locking.

20 Claims, 63 Drawing Sheets

Related U.S. Application Data

(60) Provisional application No. 62/393,439, filed on Sep. 12, 2016, provisional application No. 62/321,911, filed on Apr. 13, 2016, provisional application No. 62/054,083, filed on Sep. 23, 2014, provisional application No. 62/053,557, filed on Sep. 22, 2014.

(51) Int. Cl.

| | |
|---|---|
| *H01S 5/042* | (2006.01) |
| *H01S 5/187* | (2006.01) |
| *H01S 3/06* | (2006.01) |
| *H01S 3/11* | (2006.01) |
| *H01S 5/14* | (2006.01) |
| *H01S 5/04* | (2006.01) |
| *H01S 5/34* | (2006.01) |
| *H01S 3/094* | (2006.01) |
| *H01S 5/024* | (2006.01) |
| *H01S 5/183* | (2006.01) |

(52) U.S. Cl.
CPC ............ *H01S 3/1118* (2013.01); *H01S 5/042* (2013.01); *H01S 5/0657* (2013.01); *H01S 5/14* (2013.01); *H01S 5/187* (2013.01); *H01S 5/18383* (2013.01); *H01S 3/094026* (2013.01); *H01S 5/02484* (2013.01); *H01S 5/041* (2013.01); *H01S 5/18341* (2013.01); *H01S 5/34* (2013.01)

(56) References Cited

OTHER PUBLICATIONS

Kilen, et al., "Ultrafast Nonequilibrium Carrier Dynamics in Semiconductor Laser Mode-Locking," Optica (2014).

Husaini, et al., "Graphene Saturable Absorber for High Power Semiconductor Disk Laser Mode-Locking," Appl. Phys. Letts, 104, 161107 (2014).

Moloney, et al., Nonequilibrium and Thermal Effects in Mode-Locked VECSELs, Opt. Express, 22, (6) 6422 (2014).

H. A. Haus, "Theory of Mode Locking with a Slow Saturable Absorber," IEEE J. Quantum Electron. 11, pp. 736-746 (1975).

H. A. Haus, "Mode Locking of Lasers," IEEE J. Sel. Top. In Quant. Electron., 6, 1173 (2000).

Sieber, et al., "Experimentally Verified Pulse Formation Model for High-Power Femtosecond VECSELs," Appl. Phys. 8, 113, 133 (2013).

Rudin, et al., "High-power MIXSEL: An Integrated Ultrafast Semiconductor Laser with 6.4 W Average Power," Opt. Exp., 18, 27582, (2010).

Mangold, et al., "Pulse Repetition Rate Scaling from 5 to 100 GHz with a High-Power Semiconductor Disk Laser," Opt. Exp., 22, 6099 (2014).

Scheller, et al. "Passively mode-locked VECSEL emitting 682 fs pulses with 5.1 W of average output power," Electronics Letters, 48, 588-589 (2012).

Zhang, et al., "Operation of an optical in-well-pumped vertical-external-cavity surface-emitting laser," Appl. Opt., 45, 7729 (2006).

Wagner, et al., "Barrier- and in-well pumped GaSb-based 2.3 µm VECSELs," phys. stat. sol. (c) 4, 1597-1600 (2007).

Zhang, et al., "Femtosecond synchronously mode-locked vertical-external cavity surface-emitting laser," Opt. Exp., 14, 1810 (2006).

Barbarin, et al., "Electrically Pumped Vertical External Cavity Surface Emitting Lasers Suitable for Passive Modelocking," IEEE J. Sel. Top. In Quant. Electron., 17, 1779 (2011).

"Ultrashort Pulses in Biology and Medicine," Editors: Markus Braun, Peter Gilch and Wolfgang Zinth, ISBN-13 978-3-540-73565-6 (Springer Berlin Heidelberg NewYork).

* cited by examiner

NONEQUILIBRIUM PULSED FEMTOSECOND SEMICONDUCTOR DISK LASER

CROSS-REFERENCE TO RELATED APPLICATIONS

The present application claims priority from and benefit of the U.S. Provisional Applications No. 62/321,911 filed on Apr. 13, 2016, and No. 62/393,439 filed on Sep. 12, 2016.

The present application is also a continuation-in-part of U.S. patent application Ser. No. 14/847,908, filed Sep. 8, 2015 and published as U.S. 2016/0087407, which in turn claims priority from and benefit of U.S. Provisional Patent Applications No. 62/053,557 filed on Sep. 22, 2014 and No. 62/054,083 filed on Sep. 23, 2014.

The disclosure of each of the above-identified patent documents is incorporated by reference herein in its entirety.

STATEMENT REGARDING FEDERALLY SPONSORED RESEARCH OR DEVELOPMENT

This invention was made with government support under Grant No. FA9550-14-1-0062 awarded by USAF/FOSR. The government has certain rights in the invention.

TECHNICAL FIELD

The present invention is related to a semiconductor gain medium having quantum well layers, and more general to a semiconductor gain medium having multiple quantum well structure including quantum wells placed away from the antinodes of a cavity standing wave formed at the central wavelength.

BACKGROUND

High-power, high-brightness continuous wave (CW) and mode-locked lasers remain of interest to the research community. The use of semiconductor lasers for this purpose provides well-recognized advantages, not the least of which are cost efficiency and ease of handling, in practice. A conventional approach to achieving high laser power outputs from the semiconductor lasers is to utilize a so-called resonant periodic gain (RPG) structure, which includes a multiplicity of sequentially-disposed quantum wells (QWs) limited on one side by a distributed Bragg grating (DBR) reflector and, on the other side, an optical window through which laser emission is delivered outside of the cavity. The optical window sometimes includes anti-reflectance and/or high-reflectance (AR/HR) or other thin-film optical coatings, terminating the cavity at the interface with the ambient medium (such as air). A schematic diagram illustrating such structure is shown in FIG. 1.

While some of the highest power outputs have been demonstrated with the use of such structures (for example, outputs greater than 100 Watts of total power; or 15 Watts for a single-mode narrow-linewidth power output; or about 5 Watts of output via 680-femtosecond duration pulses), practice and related art clearly demonstrate that the RPG-structure-based lasers prove to be quite inefficient in achieving short-pulsed laser operation—for example, in generation of a train of pulses with durations below 100 fs—let alone in generation of sub-100 fs pulses at high average power. While some attempts to reach the pulsed operation (with 100 fs pulses) have been made, the problem of unreliable stability of such operation, caused by depletion of excited carriers at substantially single optical frequency, has not been resolved.

Given that operationally-stable sub-100 fs pulsed lasing with high gain (at high power levels) remains of interest in a multitude of applications (including medicine, biology, sampling/probing of ultrafast processes, and fast optical data communications, to name just a few), there remains a need in a semiconductor laser configuration that differs from the conventional RPG configuration to overcome the existing problems.

SUMMARY

Embodiments of the invention provide a surface-emitting semiconductor laser system configured to operate in a mode-locked regime. The laser system includes a) an optical resonator having an optical axis; b) a semiconductor laser chip; and c) a pump source. The semiconductor laser chip is disposed within the optical resonator and contains a semiconductor gain medium that is characterized by a gain spectrum. The gain spectrum has a bandwidth that includes a first wavelength. The gain medium has a first multiple quantum well (MQW) unit, which first MQW unit is defined by a sequence of at least three first quantum wells (QWs) separated from one another substantially non-equidistantly. The pump source is in operable communication with said laser chip and is configured to pump energy to the semiconductor gain medium to produce excited-state carriers in the first MQW unit. The laser chip is configured to form a standing wave within said chip at a frequency of the first wavelength, such standing wave having first and second immediately neighboring nodes located along the optical axis within the gain medium, which nodes are formed on the opposite sides of said first MQW unit.

Embodiments of the invention further provide a method for generating sub-100 fs pulses with the use of such semiconductor laser system.

BRIEF DESCRIPTION OF THE DRAWINGS

The following disclosure will be better understood in reference to the following accompanying generally not-to-scale Drawings, of which.

Figure 1:
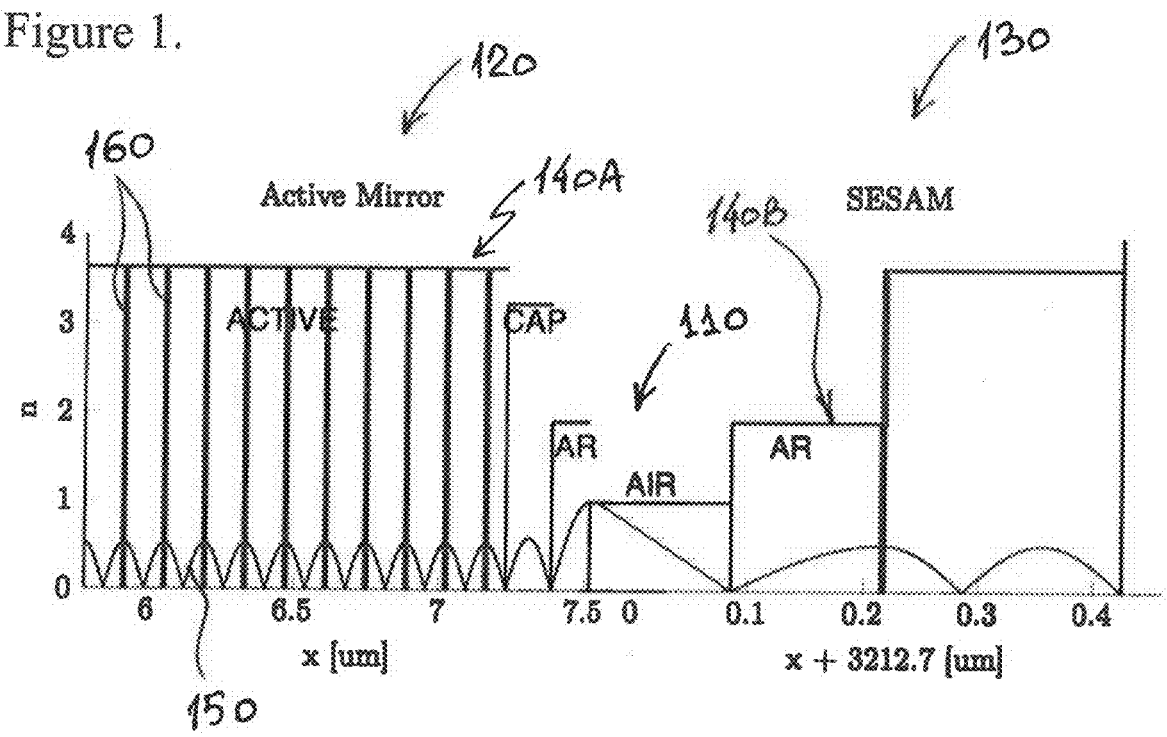
FIG. 1 shows a schematic of a prior art implementation of a mode-locked semiconductor disk laser (VECSEL) consisting of a multiple quantum well resonant-periodic-gain (RPG) active structure with each quantum well placed near the anti-node of the standing wave field (vertical bars near 6 μm and 7 μm) on the left and a semiconductor saturable absorber mirror (SESAM) consisting of a single quantum well (QW) and a partially transmitting mirror (vertical line) on the far right, not shown to the left of the RPG region is a highly reflecting semiconductor distributed Bragg reflector (DBR) consisting of multiple repeats of a pair of semiconductor materials (for example, AlAs/GaAs pairs)

Generally, the sizes and relative scales of elements in Drawings may be set to be different from actual ones to appropriately facilitate simplicity, clarity, and understanding of the Drawings. For the same reason, not all elements present in one Drawing may necessarily be shown in another.

DETAILED DESCRIPTION

Referring again to FIG. 1, a conventionally-utilized in related art RPG structure is configured such that amplification of light (caused by appropriately pumping the RPG-structure-containing semiconductor laser) occurs at substantially only a single frequency. Put differently, conventional RPG structures are designed such as to deliver an output having as high a power as possible. Accordingly, the idea behind the conventional RPG structure, utilized by related art to date, is to utilize the most gain through resonant growth of the internal (intracavity) field through multiple passes within the short semiconductor micro-cavity of the semiconductor chip. To achieve this in operation, a given RPG structure is configured such that, when there is formed a standing electromagnetic wave within the laser cavity, a half-cycle of such standing wave (marked as 110 in FIG. 1) covers or embraces only one QW (such that the anti-node of the corresponding electrical field distribution is located at or near the QW(s) in question).

The characteristic carrier-carrier scattering time in the gain region of semiconductor MQW systems is in the range of 100 fs. Since these carrier scatterings lead to a replenishment of the gain in the spectral region of the pulse, they cause an elongation of the pulse. Therefore, the interest is to form pulses with a sub-100 fs duration such that the pulse-lengthening influence of carrier scattering is minimized and/or can be neglected.

The impact of sub-100 fs mode-locked semiconductor disk laser sources is difficult to overestimate across a wide spectrum of applications such as, for example, medicine and biology (multiphoton cell imaging, minimally invasive sub-cellular nanosurgery), sensor applications, and generation of frequency combs. The ability to generate stable ultra-short pulse trains (<100 fs) using compact and reliable semiconductor devices is expected to enable a new generation of sources at targeted wavelengths not directly accessible with the use of currently employed Ti:sapphire or doped fiber lasers. The high repetition rates achievable with semiconductor sources are particularly useful for LIDAR, optical arbitrary wave-form generation, advanced ultra-high bandwidth communication systems, and coherent detection applications. Semiconductor disk laser sources in particular have been shown to exhibit very good quantum-limited noise performance, especially compared to doped fiber laser counter-parts. Such low noise performance in a compact mode-locked high-repetition rate (1 to 10 GHz) source could prove to be the ideal frequency comb source and for further power scaling such high repetition sources via fiber amplification. Applications include improved and field-usable clocks and ultra-low noise microwave generation for improved timing and synchronization in communication, navigation, and guidance systems.

Attempts to reach 100 fs duration fundamental mode-locked pulses have so far not been successful with RPG structures: the shortest duration demonstrated to-date is around 200 fs at low average power. In reference to FIG. 2, to shorten the duration of a pulse in an RPG-structure configuration, an attempt has been made to change the conventional structure of FIG. 1 to ensure that some anti-nodes (such as anti-node 202, for example) are unpopulated while other individual antinodes (such as antinodes 206, 208, 210) overlap with either one or two QWs 212. This approach, discussed by P. Klopp, U. Griebner, M. Zorn and M. Weyers, (in "Pulse repetition rate of 92 GHz or pulse duration shorter than 110 fs from a mode-locked semiconductor disk laser" APL, 98, 071103, 2011), resulted in a very low average power output 107 fs pulse mode-locking regime of operation, and could, in principle, be utilized in the low gain limit. (For the purposes of this disclosure, the term "low gain limit" implies that the gain (the amplification of the pulse) per round trip to be very weak, for example in the percentage range. This leads to rather weak pulses that do not replete the inversion.)

In the low-gain limit, the structure proposed by Klopp et al. yields mode-locked pulses the bandwidth of which utilizes the bandwidth of the curve representing net linear gain (provided by a given semiconductor gain medium) and approaches the sought-after target of 100 fs-duration pulses, does so without any concern for stability of the pulsed-laser operation. Indeed, the stability of the demonstrated pulsed operation remains a generally unresolved issue, as stable pulses are realized only under low gain conditions (where only a small fraction of available carriers are used).

It is well recognized that, when pumped harder, the operation of the device of Knopp and similar RPG-based devices tend to selectively remove carriers from only a relatively narrow spectral region (the width of which is comparable, similar or is approximately equal to the width of the band of the net linear gain) until such pumping bleaches out the carriers in a very narrow, limited spectral window; the effect often referred to in the art as spectral hole burning. Pumping at ever increasing levels leads amplification of light outside of the initial spectrally-pumped region and causes a multiplicity of generally uncorrelated pulses at different optical frequencies and/or strongly chirped pulses, which is recognized as an undesirable result. Embodiments of the present invention provide the desired solutions. For the purposes of this disclosure, weak pumping implies that the system is just barely above threshold (whatever a threshold may be for the particular device), while harder pumping implies that one increases the pumping in the range of tens of percent.

In the presently provided solution, the distribution of quantum-wells in the gain medium of the laser system is judiciously defined to avoid or at least mitigate the effect of spectral hole burning and, as a result, the effect is achieved of using the exited-state carried at frequencies of the majority of the available full gain spectrum, thereby leading to substantial shortening of pulses in a mode-locked operation of the laser system, reliably and repeatably, beyond the sought-after limit of 100 fs. In addition, in some cases, the reduction or even elimination of pulse chirping is also demonstrated.

A persisting problem of inability of existing semiconductor-based laser structures to generate a train of sub-100 fs duration pulses, which train remains operationally stable at different levels of gain is solved by utilizing a semiconductor laser the gain medium of which is configured to include one or more multiple quantum well (MQW) units, each of which is structured to contain at least three individual quantum wells (QWs). The at least three QWs of a given MQW unit are spaced from one another, along an axis perpendicular to such QWs, by a distance that is shorter than that corresponding to a reference wavelength (in one case, a wavelength from the gain spectrum characterizing the semiconductor gain medium at hand).

In doing so, the semiconductor gain medium is structured such that (when pumped by a judiciously chosen pump source) the immediately neighboring nodes of a standing wave created through the gain medium are formed on opposite sides of a given MQW unit. The term "standing wave" is referred to a wave in a medium, in which each point on the axis of the wave has an associated constant amplitude. The locations at which the amplitude is minimum are referred to as nodes, and the locations where the amplitude is maximum are called antinodes.

A goal of achieving a spectrally- and temporally stable (at various levels of gain) mode-locked operation of a semiconductor laser with pulse durations below 100 fs is achieved by configuring the semiconductor gain medium inside an optical resonator to include at least one MQW unit that, on one hand, has at least three constituent QWs and, on the other hand, the spatial extent of which along an optical axis preferably but optionally exceeds a distance corresponding to a quarter-of-a-cycle of a standing wave formed by an electric field throughout the gain medium when the latter is pumped by an appropriate pump source to cause lasing.

A problem of inability of the existing semiconductor lasers to operate in a mode-locked regime characterized by high-power, stable pulses with durations below 100 fs at different levels of pumping the gain medium is solved by structuring the multiple QWs in the gain medium such that amplification of light (with the use carriers excited by the pump power) is effectuated within an operational spectral bandwidth that, on one hand, exceeds the bandwidth of the net-gain curve characterizing the gain medium and, on the other hand, is a subset of a bandwidth of the fill-gain curve characterizing such gain medium.

Embodiments of the invention demonstrate that the use of a semiconductor gain medium containing judiciously configured MQW structure(s) overcomes the problem of strong chirping of pulses produced by a conventional RPG structure, and allows for a realization of an ultrashort (<100 fs) pulsed mode-locked laser operation.

Figure 3:
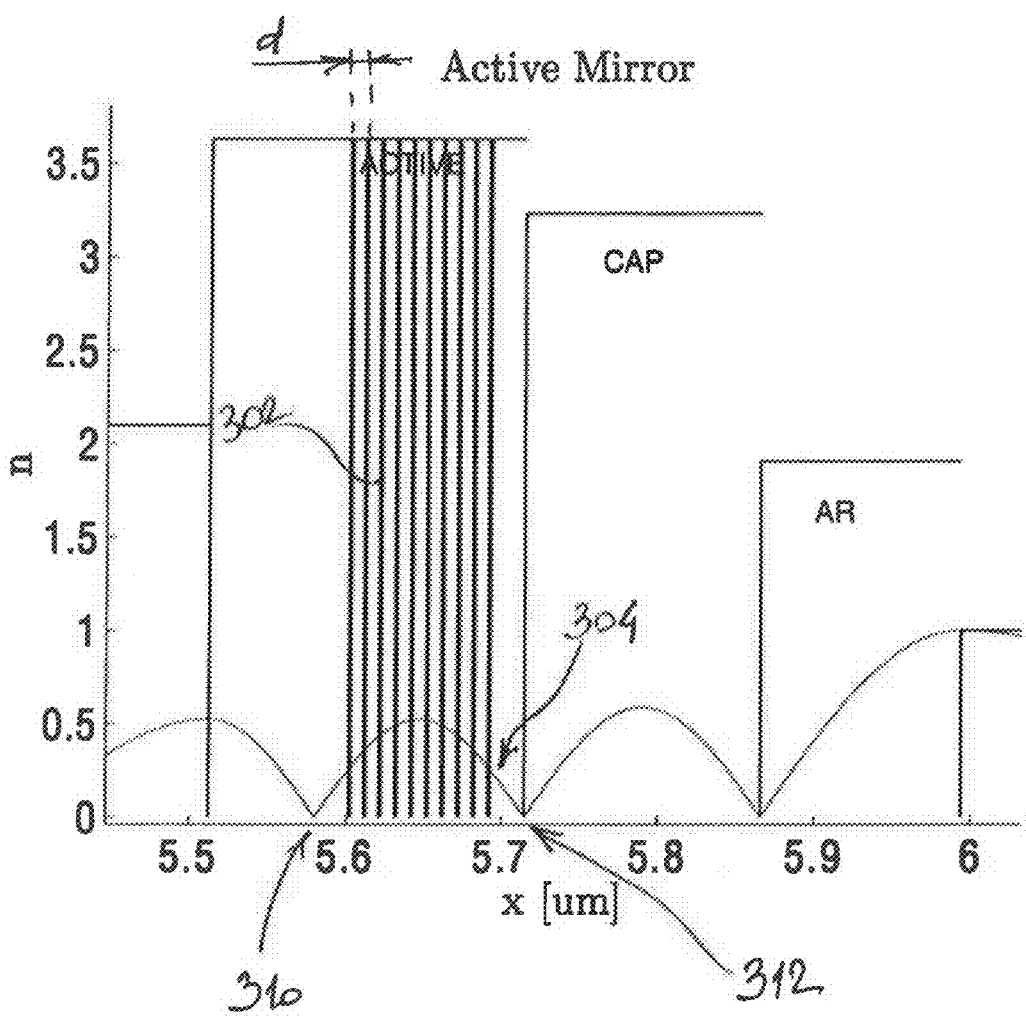
FIG. 3 shows a schematic of an implementation of a gain medium having a multiple quantum well gain architecture having 10 QWs spaced by 10 nanometers packed inside a single field anti-node, wherein the other layers to the right are a standard cap layer to prevent carrier leakage and an anti-reflection (AR) coating.
Figure 4A:
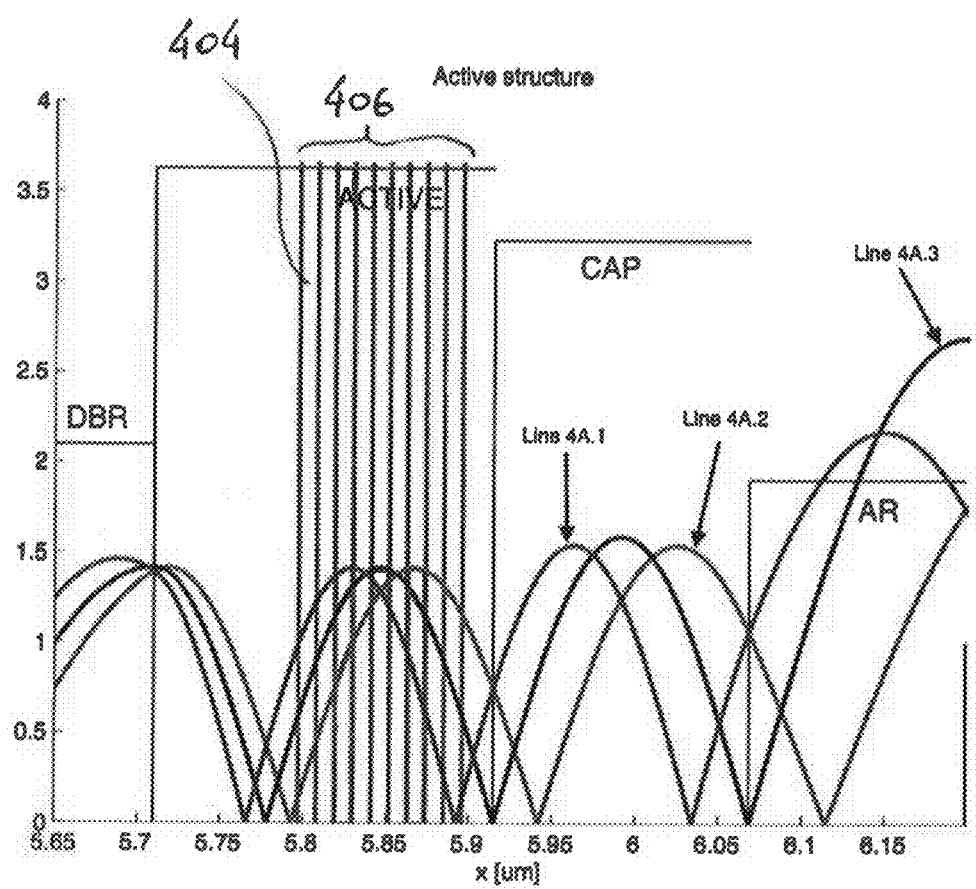
FIG. 4A is a schematic diagram illustrating an implementation of a gain medium having a multiple quantum well gain architecture having 10 QWs (spaced by 10 nanometers) that are packed inside a single field anti-node; the other layers shown to the right of the QWs are a standard cap layer (configured to prevent carrier leakage) and an anti-reflection (AR) coating. Standing waves corresponding to a central wavelength, a short and long wavelengths are also shown.
Figure 8:
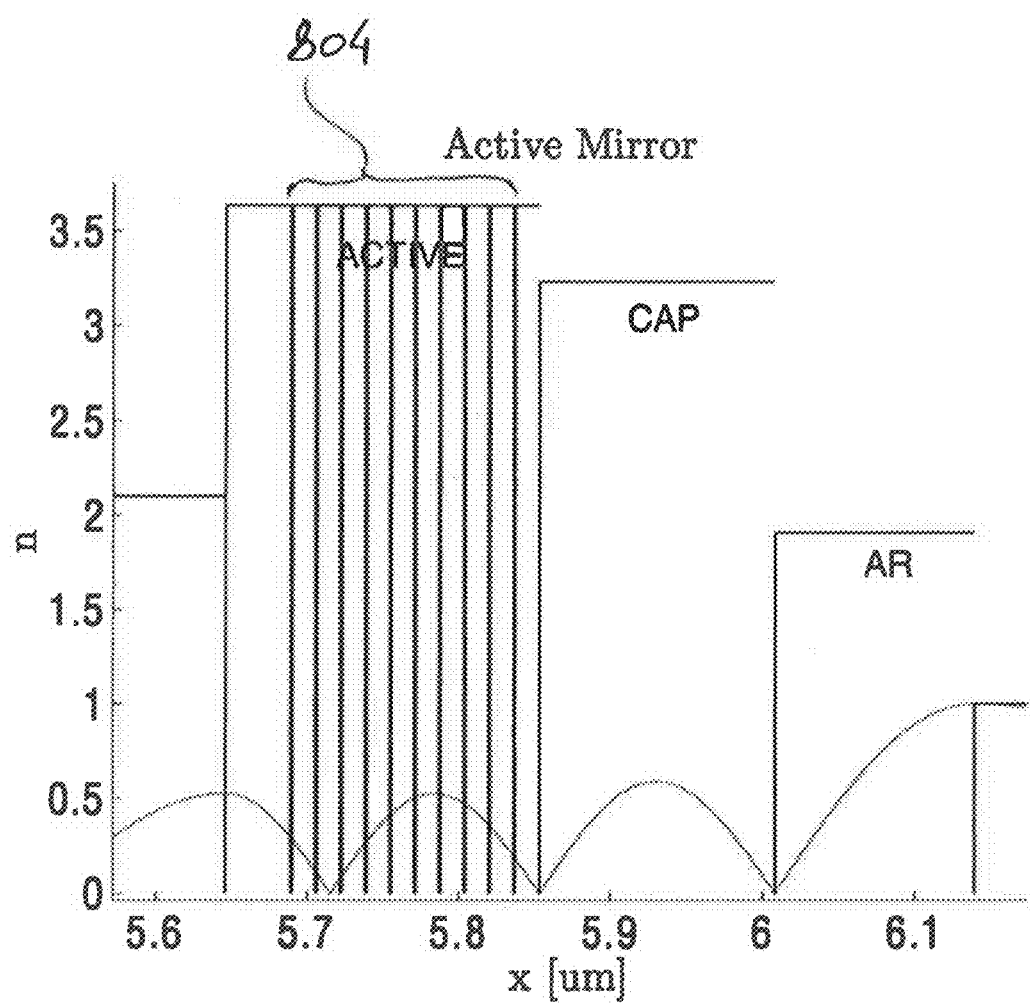
FIG. 8 shows a schematic of an implementation of a MQW structure with 10 QWs packed at sub-wavelength spacing into a single half-cycle (half period) of the intracavity field.
Figure 17:
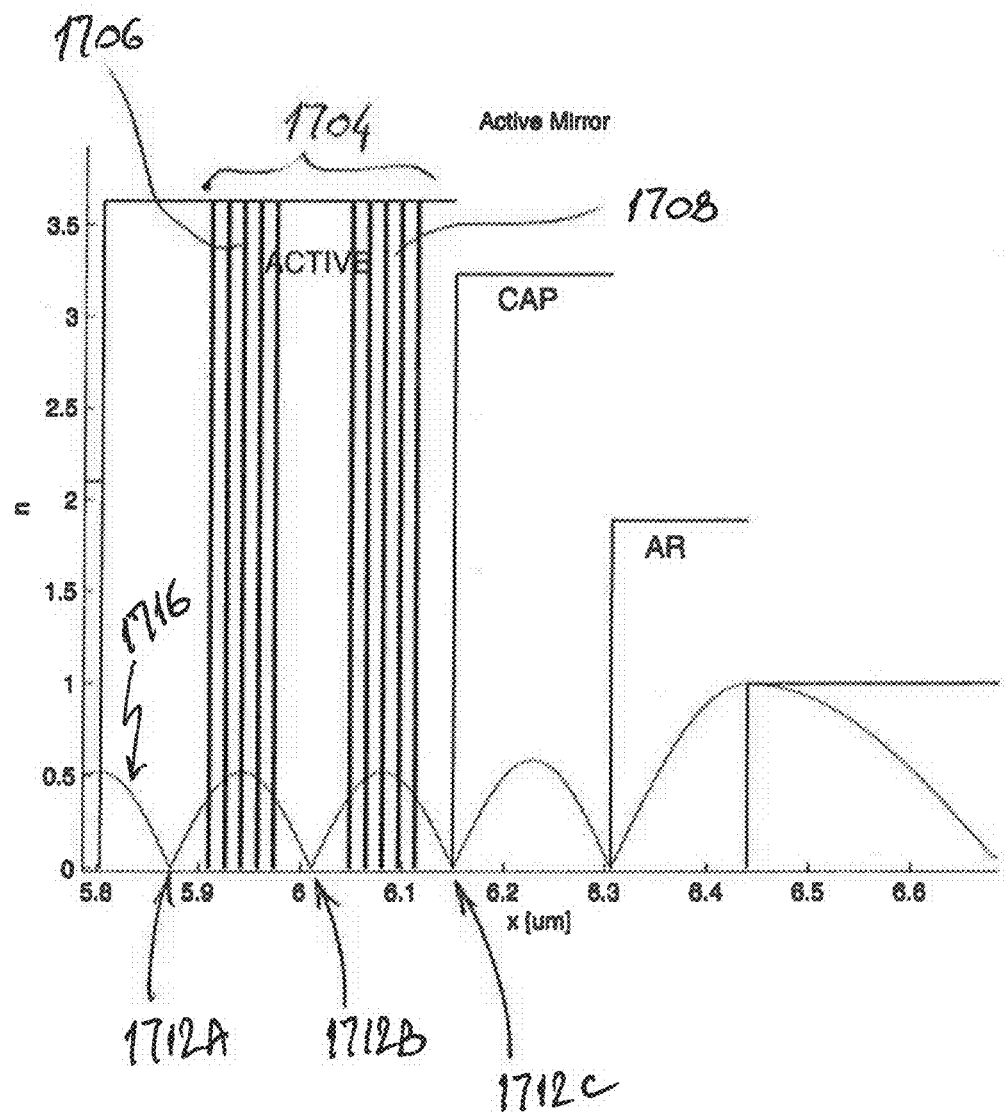
FIG. 17 shows a schematic of an implementation of a MQW arrangement where a 5 QW unit cell is replicated to produce a 5:5 structure.

According to the idea of the invention, the gain medium (in which mode-locking is initiated via a phase transition) is designed to include sub-wavelength spaced three or more quantum wells forming at least one group of densely packed QWs (referred to as a MQW unit) at a judiciously chosen location along the optical axis in the thin active semiconductor section of the resulting laser system. Such location is defined to correspond to a space between two immediately neighboring nodes of a standing-wave formed by an electrical field at a frequency from the gain spectrum characterizing the gain medium (for example, at a frequency corresponding to the central portion of the gain spectrum, referred to as a central frequency) as a result of external pumping thereof with energy. So structured, the gain medium drives a nonlinear phase transition that sweeps out most of the carriers, defined in the semiconductor electron-hole plasma within the full gain spectrum. One or more of MQW units in optional combination with any additional QWs, created in the semiconductor gain medium at hand, form and defined what is referred to as a cumulative MQW structure of an embodiment of the invention. In an MQW unit of the resulting cumulative MQW structure at least some of individual QWs are offset from the nearest antinode of the standing wave pattern (for example, some of the offset QWs can be positioned approximately midway between the node and antinode of the standing wave pattern as shown in the examples of FIGS. 3 and 17 below, or closer to a node than to an antinode of the standing wave pattern as shown in the examples of FIGS. 4A and 8).

One of optional but operationally advantageous features of a configuration of the cumulative MQW structure of the invention is that, in a laser oscillator, the individual QWs are stacked in a sequence and spaced apart by sub-wavelength distances to effectuate, during the operation, the use of most if not all of the inversion in the semiconductor electron/hole plasma to form, in a mode-locked regime, a train of pulses with ultrashort duration (<100 fs), high peak and average power, and high energy. The sub-wavelength spacing of the individual quantum wells in an MQW unit is preferred to promote a strong coherent emission of a giant pulse of very short duration and, in a specific case, having a substantially spectrally—lat phase front (resulting in no chirp) as the pulse builds up over multiple passes around the optical resonator of the laser system of the embodiment. It will be recognized by a skilled artisan that phase-locked sub-wavelength spaced QW emitters that have been packed, as a group, between the two immediately-neighboring nodes of the field distribution formed along the optical axis of the semiconductor chip during the operation, produce, in cooperation, laser emission that saturates at much higher intensities than a standard resonant-periodic-gain (RPG) structure.

Related art methodologies used for design of QW-based semiconductor structure (such as, for example an RPG structure) are turning on and depend exclusively on utilizing the net linear gain of a given semiconductor medium (which linear gain is defined by a difference between the full linear gain and the semiconductor saturable absorber loss). The use of the net linear gain characteristic(s) provides the basis for estimation of the duration of the mode-locked pulses produced by the resulting laser, with no consideration to non-linear optimization whatsoever. The present invention stems from the recognition that such net linear gain approach provides for reasonable estimation of operation of the laser system only in the low gain limit, far away from the strong pumping regime where carriers are typically bleached out. In this limited situation, the spectrum of a generated pulse is very narrow, which inevitably defines a pulse of long duration typically well exceeding 100 femtoseconds. A reader is referred to discussion of mode-locking regime of operation of a laser system utilizing RPG structures, presented by J. V Moloney, I. Kilen, A. Bäumner, M. Scheller, and S. W. Koch, Nonequilibrium and thermal effects in mode-locked VECSELs, Opt. Express, 22, (6) 6422 (2014), incorporated herein in by reference in its entirety, In stark contradistinction with the systems and method of the related art, the initial strategy for defining the locations and parameters of individual QWs of the cumulative MQW structure of an embodiment of the invention is based on assessment of the bandwidth of the full linear gain spectrum at a reference carrier density for which the system is inverted (and is, therefore, capable of laser emission). According to the idea of the invention, for a semiconductor gain medium with chosen parameters individual QWs are initially positioned at such locations inside such gain medium as to that maximally extract carriers (and, consequently, generate photons) across the majority—and, in a specific case—full span of the spectral bandwidth of the available gain. As shown below, even such initial, linear approach to the determination of the locations of the individual QWs of the cumulative MQW structure of the embodiments of the invention already provides a substantially-superior—as compared with the results achieved by related art—operational characteristics of the laser system of the invention in a mode-locking regime, which includes sought-after sub-100-fs durations of pulses and reduced chirping.

However, to improve the structure of the laser chip even further, such initial arrangement strategy is optionally additionally optimized with the use of a full non-linear optimization algorithm, whereby the full nonequilibrium Semiconductor Bloch equations (SBE) coupled to the Maxwell equations describing light propagation in the laser cavity are solved directly. (Full details of the underlying theory can be found in H. Haug, and S. W. Koch. *Quantum theory of the optical and electronic properties of semiconductors.* World scientific, 2009, which is incorporated herein by reference in its entirety.) For additional details, the reader is referred to I. Kilen, J. Hader, J. V Moloney, and S. W. Koch, *Ultrafast Nonequilibrium Carrier Dynamics in Semiconductor Laser Mode-Locking,* Optica (2014), incorporated herein in by reference in its entirety.

General

In the simulations discussed below (which were carried out for both the RPG structure and various embodiments of the cumulative MQW structures of the invention, the full cavity length was considered to be about 3.2 centimeters (to simplify the computational complexity of resolving the interacting microscopic many-body electron-hole system). In the following description, most of the parameters used in the simulations are listed as insets in related figures. Parameters not listed in this manner are otherwise explicitly provided. Except as otherwise stated, the simulation assumed an output coupling of 2%, a light roundtrip time of 21 picoseconds (corresponding to the 3.212 cm cavity length), a saturable absorber recovery time of 0.5 ps, and a QW recovery time in the active chip of 30 ps. However, the final simulation observations reproduced the observed mode-locking behavior of more complex different length linear, v-shaped and z-shaped cavities for example.

Referring now to the drawings, wherein like reference numerals designate identical or corresponding parts throughout the several views, FIG. 1 schematically illustrates a conventional RPG-structure-containing laser cavity arranged to produce a train of mode-locked pulses via passive mode-locking. The break denoted as 110 just beyond 7.5 microns signifies a free space gap between the RPG structure 120 on the left of FIG. 1 and SESAM structure 130 on the right of the Figure. This non-limiting example of a conventional RPG-based laser structure is chosen to simplify already complex many-body simulations. In FIG. 1 (also in FIGS. 2-4, 7, 8, 17, 19, 21, 23, 25, 27, and 31) the index of refraction of various layers are indicated by the inverted "L" shaped lines, such as lines 140A, 140B for example. The line in the shape of an absolute value of a sine wave (such as line 150 of FIG. 1, for example) represents the in-cavity standing wave of the electric field. The vertical bars (such as bars 160 of FIG. 1) represent groupings of one or more quantum wells (QWs)—a narrow line representing a single QW (for example, lines 212 near 5.95 and 6.2 microns in FIG. 2) and a wider line or grouped lines representing multiple QWs (for example, double lines 212 near 6.4 mm in FIG. 2).

Figure 2:
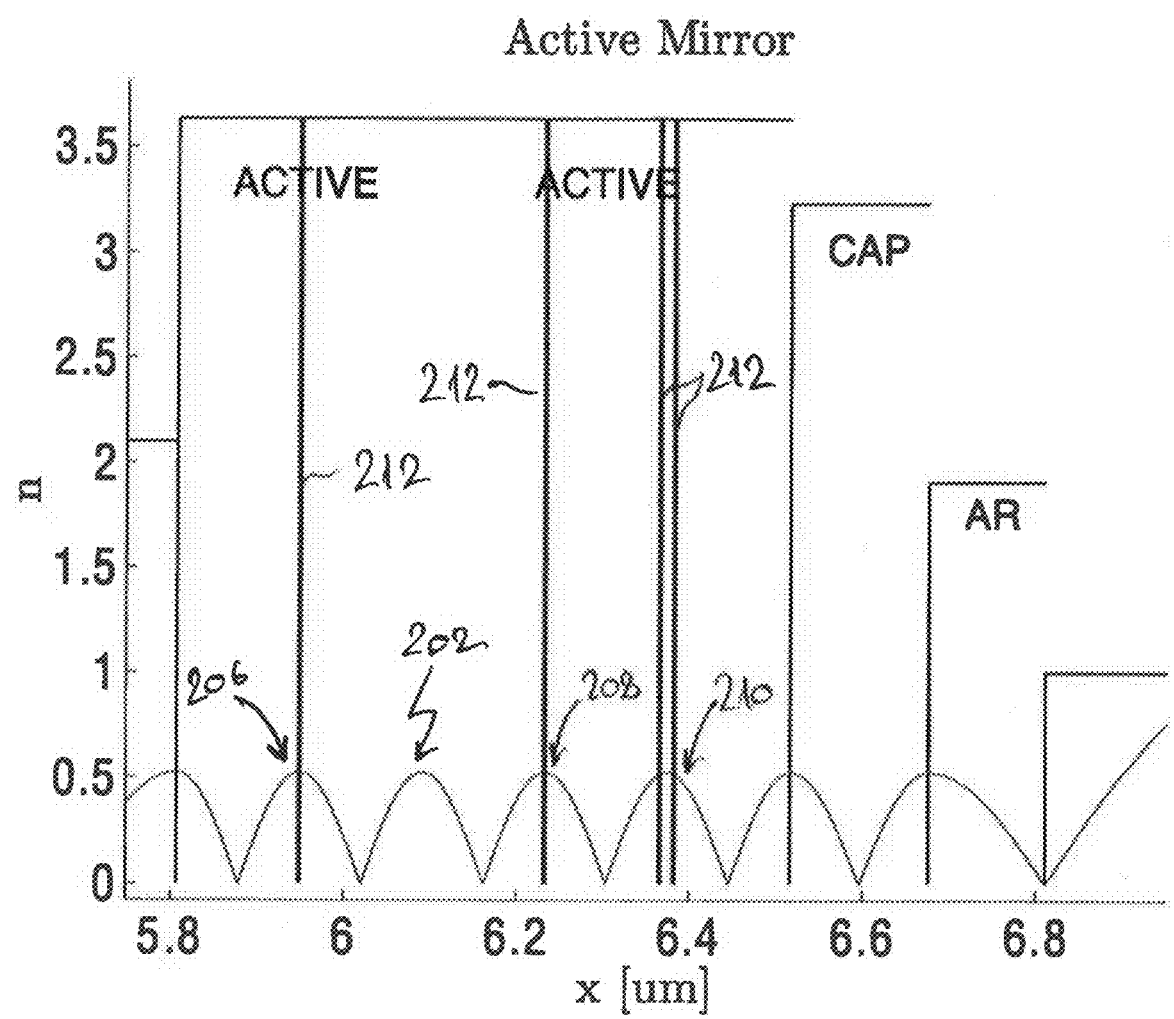
FIG. 2 shows a schematic of an implementation of a modified conventional RPG arrangement in which the QWs are configured to optimize the amount of pump light absorbed and broaden the net linear gain.

As seen from the FIGS. 1 and 2, in a conventional RPG-structure-based semiconductor laser, the resonant and anti-resonant periodic gain structures and other variants of these have arrangements that focus on placement of one (and maybe two) individual QW (s) at anti-node of a standing-wave formed in the laser a central wavelength of operation. Conventionally, there may be multiple half-wavelength repeats of so-configured QW structures (for example, the 10 repeats shown in FIG. 1), each with one (possibly two or none of) QWs placed near each half wavelength peak. The faithfulness and adherence of related art to the RPG arrangement is quite understandable—it proved to be successful in achieving record high power performance for continuous wave (CW) beams, resulting from the advantage of the structure in achieving near optimal gain at a very narrow range of wavelengths by placing individual QWs at field maxima in the standing wave pattern within the semiconductor chip. At the same time, however, this very cause of the high-power operation of an RPG structure inevitably and critically limits its spectral performance, both in terms of utilization of gain spectrum and the duration of the resulting pulses.

In contrast to conventional RPG based semiconductor lasers, the cumulative MQW structure configured according to embodiment of the present invention is capable of and effective in generating gain across the entire available gain bandwidth of the active region of the semiconductor medium. By generating photons effectively across the entire available gain bandwidth, all or most of the carriers in the electron-hole subsystem are utilized—which is not achieved at all by structured of related art—with the result of light amplification across the optimized, often maximum possible, frequency bandwidth.

Such unexpected result is enabled by packing at least three—and preferably more—QWs with subwavelength at locations (along the optical axis) that fall under a half-cycle of the standing wave field oscillation. So configured QWs, although tightly packed with thin barriers, typically have the individual QW electron and hole ground state wavefunctions decoupled. Another possible arrangement would have the QWs be so tightly spatially packed as to comprise a superlattice structure—in this case, the electron and hole quantum wavefunctions are delocalized across the QW stack instead of being decoupled. Table 1 provides an example, for illustration, of arrangement of a cumulative MQW structure configured according to the idea of the invention.

TABLE 1

Parameters (such as number of repeats, material thicknesses in nanometers, material types and compositions and refractive indices) for a specific example of an embodiment of a barrier pumped MQW structure containing two repeats of 5 QWs placed around 2 standing wave field anti-nodes. It is assumed that the pump wavelength is 808 nm and the laser wavelength is 980 nm.

| Repeats | Thickness [nm] | Material GaAs-substrate | $n_r$ |
|---|---|---|---|
| 1 | 155.40 | $In_{0.49}Ga_{0.51}P$ | 3.1954 |
| 1 | 34.00 | $GaAs_{0.90}P_{0.10}$ | 3.4607 |
| 5 | 2.50 | $GaAs_{0.90}P_{0.10}$ | 3.4607 |
|   | 8.00 | $In_{0.155}Ga_{0.845}As$ | 3.5053 |
|   | 2.50 | $GaAs_{0.90}P_{0.10}$ | 3.4607 |
| 1 | 68.00 | $GaAs_{0.90}P_{0.10}$ | 3.4607 |
| 5 | 2.50 | $GaAs_{0.90}P_{0.10}$ | 3.4607 |
|   | 8.00 | $In_{0.155}Ga_{0.845}As$ | 3.5053 |
|   | 2.50 | $GaAs_{0.90}P_{0.10}$ | 3.4607 |
| 1 | 34.00 | $GaAs_{0.90}P_{0.10}$ | 3.4607 |
| 1 | 76.00 | $GaAs_{0.56}P_{0.44}$ | 3.3248 |
| 23 | 83.01 | AlAs | 2.9459 |
|   | 71.14 | $Al_{0.12}Ga_{0.88}As$ | 3.4345 |
| 1 | 83.01 | AlAs | 2.9459 |
| 1 | 142.00 | $Al_{0.12}Ga_{0.88}As$ | 3.4345 |
| 10 | 67.21 | AlAs | 3.0054 |
|   | 56.60 | $Al_{0.12}Ga_{0.88}As$ | 3.5682 |
| 1 | 120.00 | GaAs | 3.5110 |

An implementation, such as that shown in Table 1, is just one of many possibilities and would be grown as a bottom emitter (upside down) so that the entire GaAs substrate could be removed to enable more efficient cooling of the mounted semiconductor chip. This removal would expose the $In_{0.49}Ga_{0.51}P$ 155.40 nm cap layer to air. Additionally this cap layer could be AR-coated as shown in the arrangements of FIGS. 1, 3, 4A, 8, 17, 19, 21, 23 and 25. This is one of many arrangement options for a barrier pumped setup at 808 nm and a laser signal at 980 nm. It corresponds to one possible realization of the 5:5 MQW structure shown in FIG. 17 below.

In addition to a reflecting DBR for the signal wavelength at 980 nm (23 repeats in the example of Table 1), it also has a pump-light reflecting DBR at 808 nm (10 repeats), allowing for multiple passes of the pump beam. (A similar DBR has already been implemented for a variant on an RPG structure, called a MIXSEL by B. Rudin, V. J. Wittwer, D. J. H. C. Maas, M. Hoffmann, O. D. Sieber, Y. Barbarin, M. Golling, T. Sudmeyer, and U. Keller, *High-power MIXSEL: an integrated ultrafast semiconductor laser with 6.4 W average power*, Opt. Exp., 18, 27582, (2010), incorporated herein by reference in its entirety.)

In one implementation, a superlattice structure can be configured as a variant by thinning the QWs and barriers further. For example, a superlattice structure is formed by 3.4 nm QWs and 1.7 nm barriers with electron and hole wavefunctions delocalized across the structure. Other configurations of conventional (and possibly superlattice) structures utilizing barrier, in-well or electrical pumping are within the scope of the invention and target different pump wavelengths (optical pumping) and emission wavelengths and optionally are based on different material compositions, thicknesses and material types. One of ordinary skill in the art will understand that similar structures can be implemented at other pump wavelengths and center laser wavelengths.

Example I

FIG. 3 provides a schematic illustration of a related implementation of the laser gain medium according to the idea of the invention. One significant feature of this specific implementation is that more than three (as shown—ten) QWs 302 are packed in a single MQW unit, forming the cumulative MQW structure of the invention, with sub-wavelength spacing d and under only one half-cycle 304 of a single standing wave that is formed in operation of the structured in a laser cavity. Generally, however, sub-wavelength spaced densely packed quantum wells can be packed within an extended structure covering multiple field periods (as is further discussed below). The fundamental physics of mode-locked behavior is now fundamentally changed from that representing the mode-locking operation of the conventional lasers. Using an embodiment of the cumulative MQW structure configured according to an idea of the invention, there is an emergence of full nonequilibrium, nonlinear dynamics, where the interacting electron/hole subsystems within their respective bands act in concert to effectively sweep out most of or possibly the entire carrier inversion and generate an optimal ultrashort mode-locked pulse train. In this disclosure, a basic structure illustrated in FIG. 3 (namely, a MQW unit containing at least three QWs and located between the immediately neighboring nodes 310, 312 of a standing wave formed along an optical axis in the semiconductor gain medium during the lasing operation) is used as the base unit cell that can be replicated multiple times to produce an extended cumulative MQW structure of the invention.

Example II

FIG. 4A shows a schematic of one implementation of the cumulative MQW structure for a mode-locking laser of the invention. Here, line 4A.3 shows a standing wave pattern at a first wavelength (such as the center wavelength corresponding to the central carrier frequency of the resulting pulse), while lines 4A.1 and 4A.2 show standing wave patterns corresponding respectively to a short wavelength and a long wavelength of the full gain spectrum indicated by the arrows in FIG. 4B at 1.35 eV and 1.15 eV respectively.

Figure 4B:
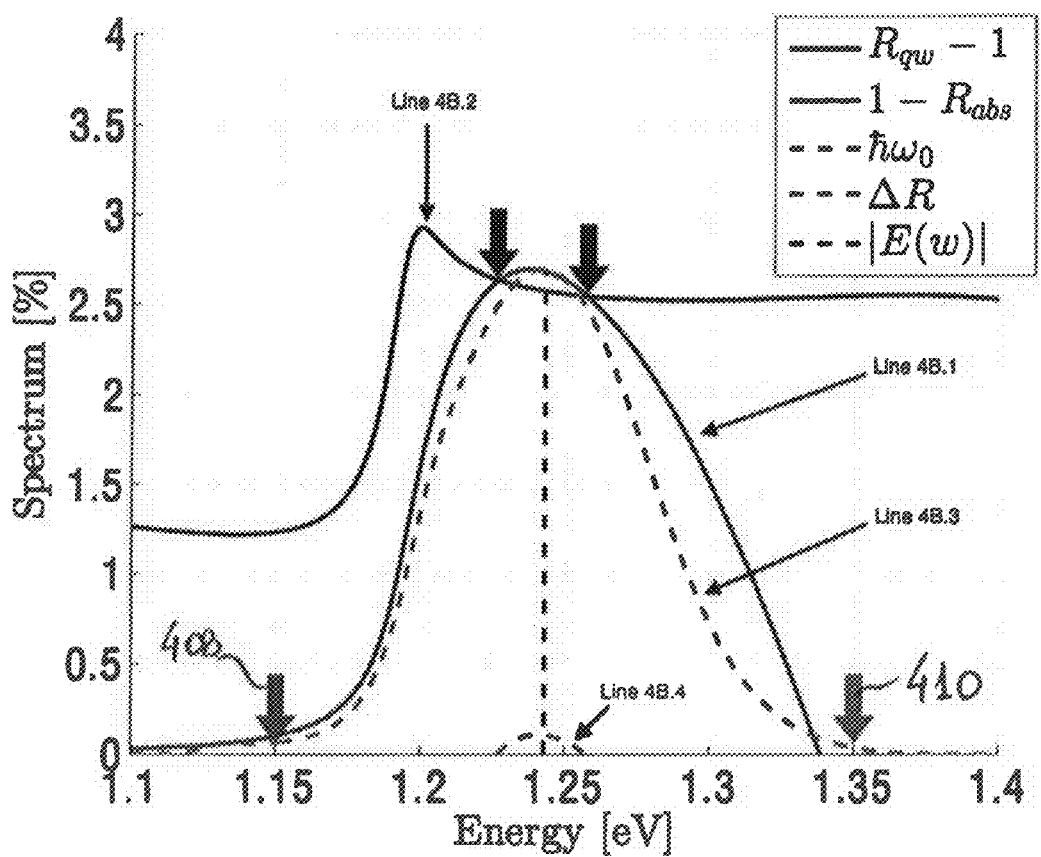
FIG. 4B shows plots representing the multiple QW (MQW) structure of FIG. 4A, including the full linear gain spectrum (lower solid line 4B.1), the absorption curve of the single QW saturable absorber (upper solid line, 4B2), and the net gain curve (representing the difference between the full linear gain spectrum curve and the absorption curve; shown as a dashed curve 4B4). Also shown is the mode-locked pulse bandwidth (upper dashed curve, 4B.3), that has a bandwidth greater than that of the net gain.

FIG. 4A depicts a single half-wavelength structure with ten (10) QWs 404 packed at sub-wavelength spacing across a region occupied by single half-wavelength cycle of the standing wave formed during the lasing operation. In addition to the single standing wave at the central pulse wavelength (line 4A.3), standing wave fields corresponding to those wavelengths (frequencies) at the short (line 4A.1) and long (line 4A.2) wavelength extremes of the full linear gain spectrum shown by line 4B.1 in FIG. 4B are also included. These latter standing waves are very much smaller in amplitude but are artificially enhanced in amplitude for clarity of presentation. The arrow 410 to the right in FIG. 4B extends just beyond the end of the linear gain spectrum (line 4B.1) indicating that the generated pulse has nonlinearly excited energy outside of this linear gain spectral window. Considering the time-bandwidth product of transform limited pulses, the ability to arrange QW stacks within ca cumulative MQW structure to extract photons across the full spectral width enables an MQW-based laser system of the invention to generate pulses with the shortest possible duration. By tightly packing thin QWs with very thin barriers (as shown, for example, in FIG. 4A) the goal of being able to convert all or most of the available carriers in the conduction/valence bands of the semiconductor active structure into light is achieved.

FIG. 4B provides a plot of the full linear gain spectrum (line 4B.1), the absorption of the single QW saturable absorber (line 4B.2), the net gain (difference between the lines 4B.1 and 4B.2) shown as line 4B.4 and, the dashed upper curve showing the spectrum of a mode-locked pulse produced by the arrangement in FIG. 4A (line 4B.3). In stark contradistinction with the net gain approach based on which lasers of the related art are defined, it was observed that the spectrum represented by line 4B.3 is so broad that it closely matches the full linear gain spectrum (line 4B.1) and produces a dramatically shorter duration pulse than would be expected from considering only net gain of line 4B.4. It is noted that even the solution described in FIGS. 4A, 4B is not necessarily optimal. In fact, the linear gain concept shown in FIGS. 4A and 4B provides only an initial cumulative MQW structure, which is further optimized, according to the idea of the invention, with the use of full nonlinear optimization on the running mode-locked laser.

The cumulative MQW structure of FIG. 4A contains only one, single MQW unit 406, and can further be used as a building block for related implementations of cumulative MQW structures of the invention by extending the concept to multiple half-wavelength repeats of the MQW unit 406 throughout the length of the gain medium, although care must be exercised in placement of the QWs downstream in a multi-repeat structure. The reason for this is that the standing wave fields are locked in place at the DBR-active region boundary and they rapidly run out of phase as one moves further to the right. Multiple repeat structures beyond that described in the present document may require different strategies for placement of QWs.

Figure 5A:
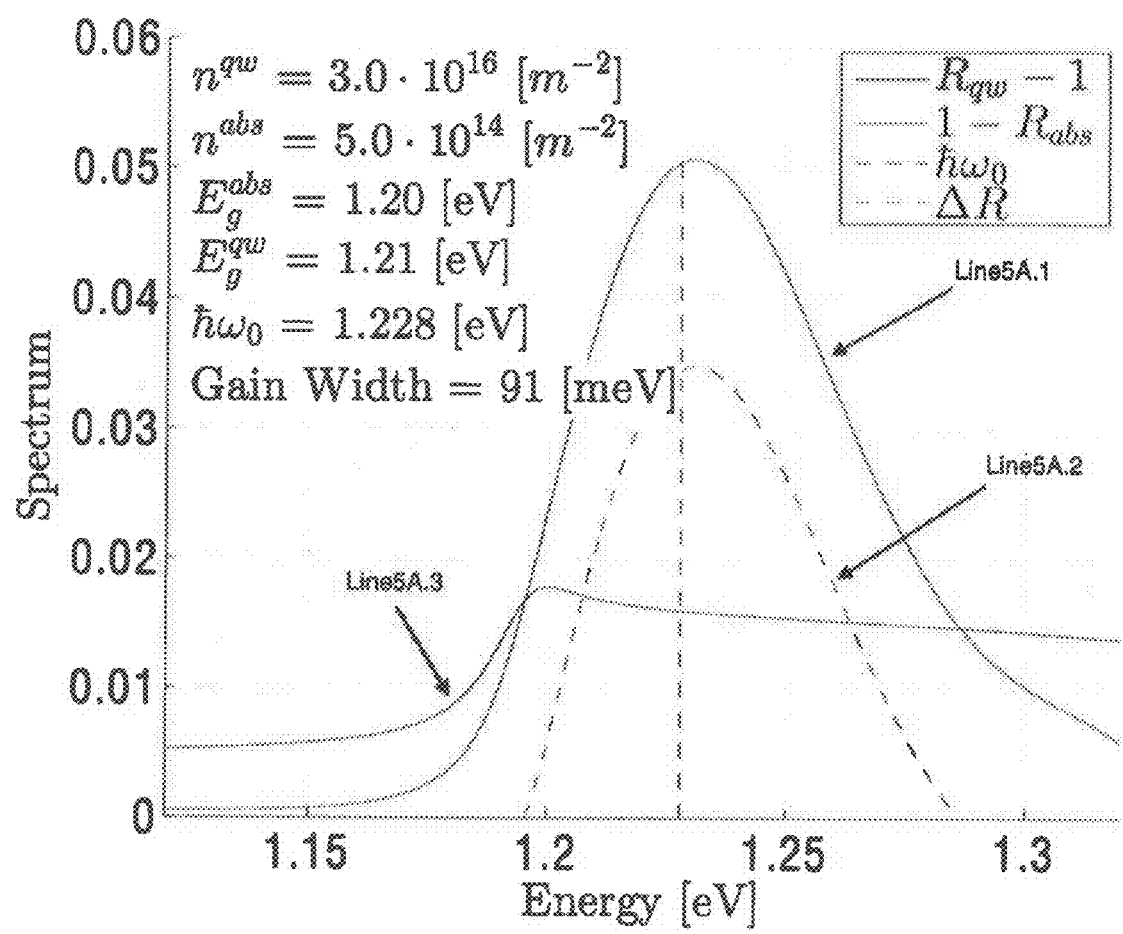
FIG. 5A shows a plot of the linear gain, SESAM absorption, and their difference for an initial inversion $n^{qw}=3\times10^{16}$ $m^{-2}$ corresponding to the embodiment shown in FIG. 1; parameters are provided in the inset.
Figure 5B:
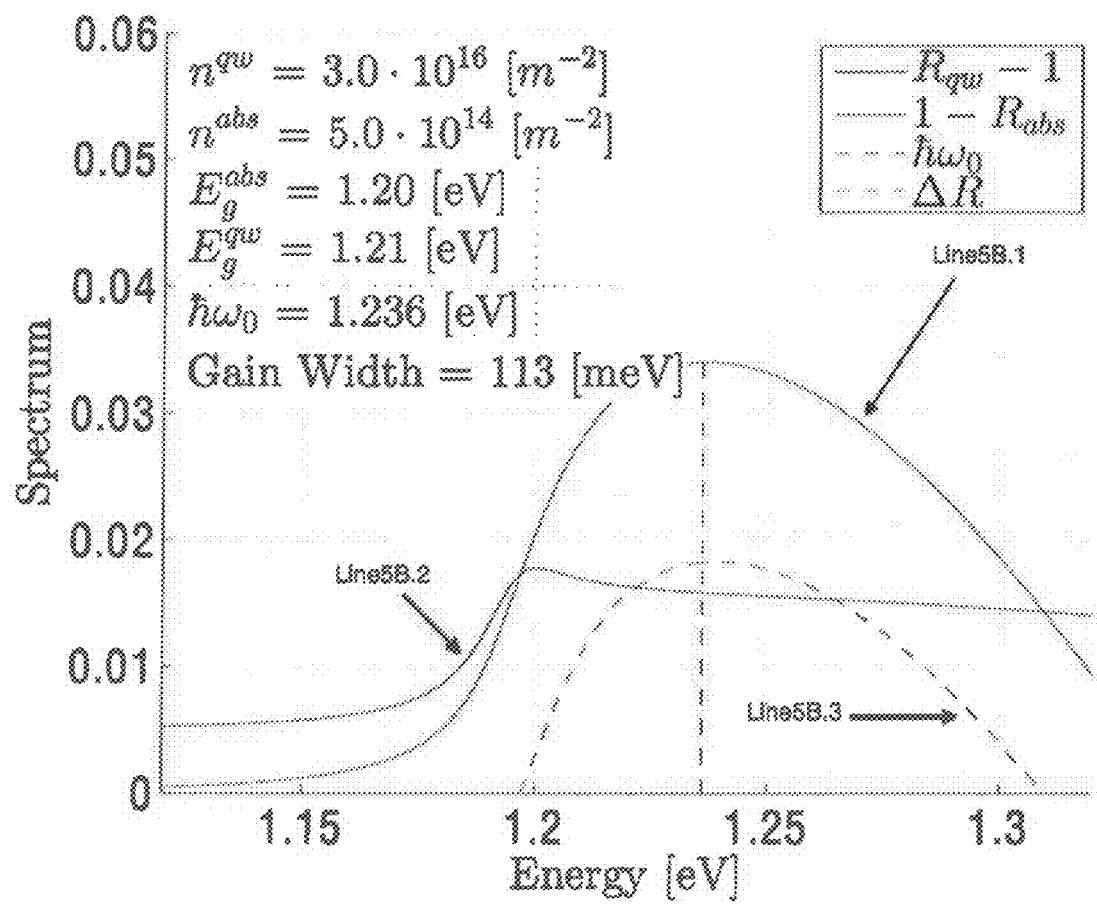
FIG. 5B shows a plot of the linear gain, SESAM absorption, and their difference for an initial inversion $n^{qw}=3\times10^{16}$ $m^{-2}$ corresponding to the embodiment of FIG. 3; parameters are given in the inset.

Example III is discussed in reference to FIGS. 1, 3, 5A, and 5B. FIG. 5A illustrates the linear gain (line 5A.1), SESAM absorption (5.A.3) and net gain (line 5A.2) for a conventional RPG structure (such as that of FIG. 1). In comparison, FIG. 5B illustrates the calculated linear gain (line 5B-1), SESAM absorption (line 5B-2) and net gain (line 5B-3) for the cumulative MQW structure of the embodiment of FIG. 3. It is readily apparent that the conventional RPG structure has a significantly larger net gain than the cumulative MQW structure of the invention, and the the RPG gain bandwidth is likewise narrower than that of the cumulative MQW structure. Based on this traditional linear net gain picture, the RPG demonstrates pulses that, while growing faster from noise, end up with broader time duration that those produced by a cumulative MQW structure of FIG. 3, due to the narrower gain bandwidth.

It should be noted that, while the presence of optical elements (such as quantum well, graphene, carbon nanotube saturable absorbers or even transparent Kerr Lens based mode-locking elements) in the optical cavity may facilitate the mode-locking operation of an embodiment o the invention, such presence is not necessarily required, and in some implementations a system of the invention may be configured to operate in a self-mode-locking regime.

The basic principle of mode-locking with a saturable absorber was discussed in H. A. Haus, "Theory of Mode Locking with a Slow Saturable Absorber," IEEE J. Quantum Electron. 11, pp. 736-746 (1975), incorporated herein by reference in its entirety, and in H. A. Haus, "Mode Locking of Lasers," IEEE J. Sel. Top. In Quant. Electron., 6, 1173 (2000), each of which disclosures are incorporated herein by reference in its entirety. The idea is that the combination of gain, over a broad range of frequencies (wavelengths), and saturable absorption results in a net gain (gain minus absorption) as shown in FIG. 4B as an example. The net gain is depicted by the narrow window indicated by the two solid black arrows pointing down in that figure and is plotted as the curve (line 4B.4) at the base of this figure. This net gain window is much narrower than the total gain spectrum indicated by the solid (line 4B.1) curve on the same figure. Based on the net gain window, one would expect the pulse duration to be relatively long due to the narrow frequency band available for amplification of light. However, contrary to conventional expectations, the net gain window does not adequately predict the behavior of the novel MQW structure. I. Kilen, J. Hader, J. V Moloney, and S. W. Koch (in *Ultrafast Nonequilibrium Carrier Dynamics in Semiconductor Laser Mode-Locking,* Optica, 2014) show that instead of the net gain, one has to refer to the spectral width of the carrier inversion to predict the correct behavior of novel MQW modelocking structures. The linear gain model concept has been employed in modeling a broad class of solid state mode-locked laser systems and applied to VECSELs recently by O. D. Sieber, M. Hoffmann, V. I. Wittwer, M. Mangold, M. Golling, B. W. Tillma, T. Sudmeyer and U. Keller, *Experimentally verified pulse formation model for high-power femtosecond VECSELs,* Appl. Phys. B. 113, 133 (2013), incorporated herein by reference in its entirety.

Example IV

Figure 6:
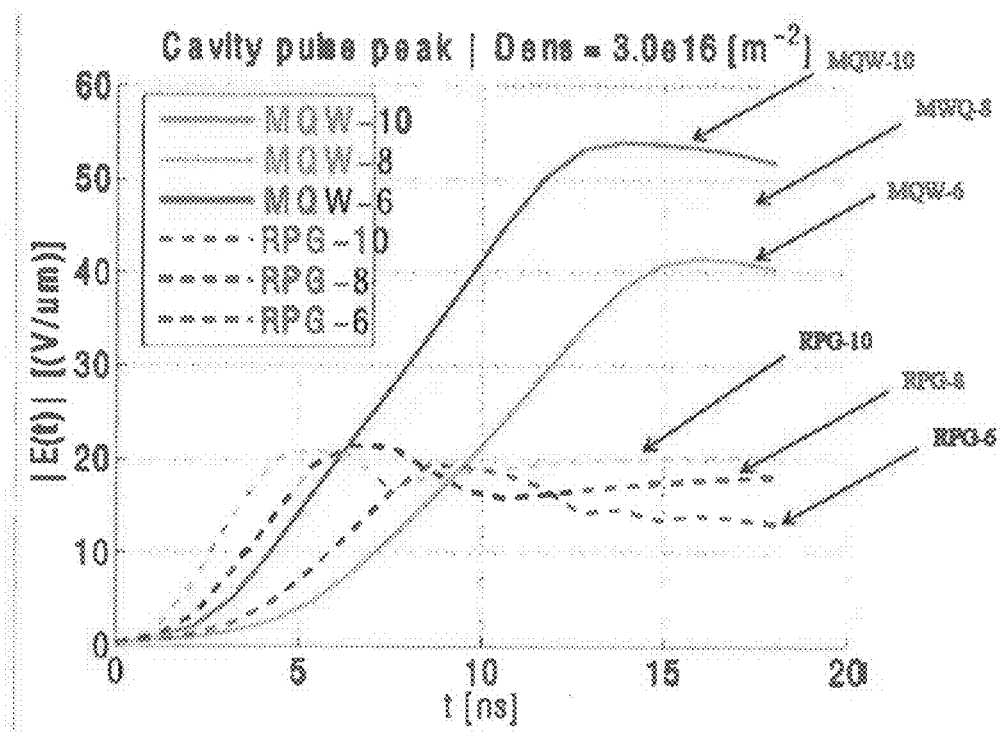
FIG. 6 presents plots of the dynamic evolution of the pulse peak in the mode-locked cavity for three implementations of an RPG structure RPG-6, RPG-8, RPG-10 (containing, respectively, 6, 8 and 10 QWs) and for three implementations of an MQW structure MQW-6, MQW-8, MQW-10 (with 6, 8, 10 QWs, respectively)

FIG. 6 provides modeling results of comparison among several conventional RPG structures (one containing 6 individual QWs, each at a corresponding node of the standing wave; another containing similarly positioned 8 QWs; and yet another having 10 QWs to it) and several embodiments of a cumulative MQW structure of the invention (configured according to the principle of FIG. 3 but containing 6, 8, and 10 QWs, respectively) are provided in FIG. 6. In each of the considered cumulative MQW structures, respectively corresponding 6, 8, and 10 QWs are packed around a single anti-node of the standing wave field, under one cycle of the standing wave.

FIG. 6 indeed confirms that peak pulse amplitudes for each of the 6, 8 and 10 QW structures in the RPG initially grow more rapidly than their cumulative-MQW counterparts. Later in the dynamical evolution it is observed that a dramatic switch occurs in growth rate of the pulse peaks. The peak pulse amplitude for each of the MQW structures sweeps past the RPG counterparts and saturates at peak amplitudes that are a factor of approximately 2.5 larger. Stated differently, the peak intensities become about 6 times larger. Not shown in FIG. 6 are the corresponding pulse durations. However, all the RPG pulses are significantly longer than 100 fs, whereas the pulses produce by any of the assessed cumulative MQW structures are sub 100 fs in duration.

Example V

It was also demonstrated that a further dramatic difference in dynamical behavior occurs by contrasting robustness of lasing operation of a laser system that contains a cumulative MQW structure of the invention over that containing a conventional RPG structure. The comparison takes two nominally identical (with the same starting inversion in each well) structures that initially demonstrate a comparable net positive gain. These structures are the one shown in FIG. 7 (i.e., an RPG structure with 10 QWs) and the one shown in FIG. 8 (i.e., a cumulative MQW structure containing a single MQW unit 804 with ten QWs; unit 804 spaced across a distance exceeding the axial extent of a single cycle of the standing wave representing intensity of the field formed during the laser operation along the gain medium). Once mode-locking operation is established, the inversion is systematically reduced below the zero net gain limit.

Figure 7:
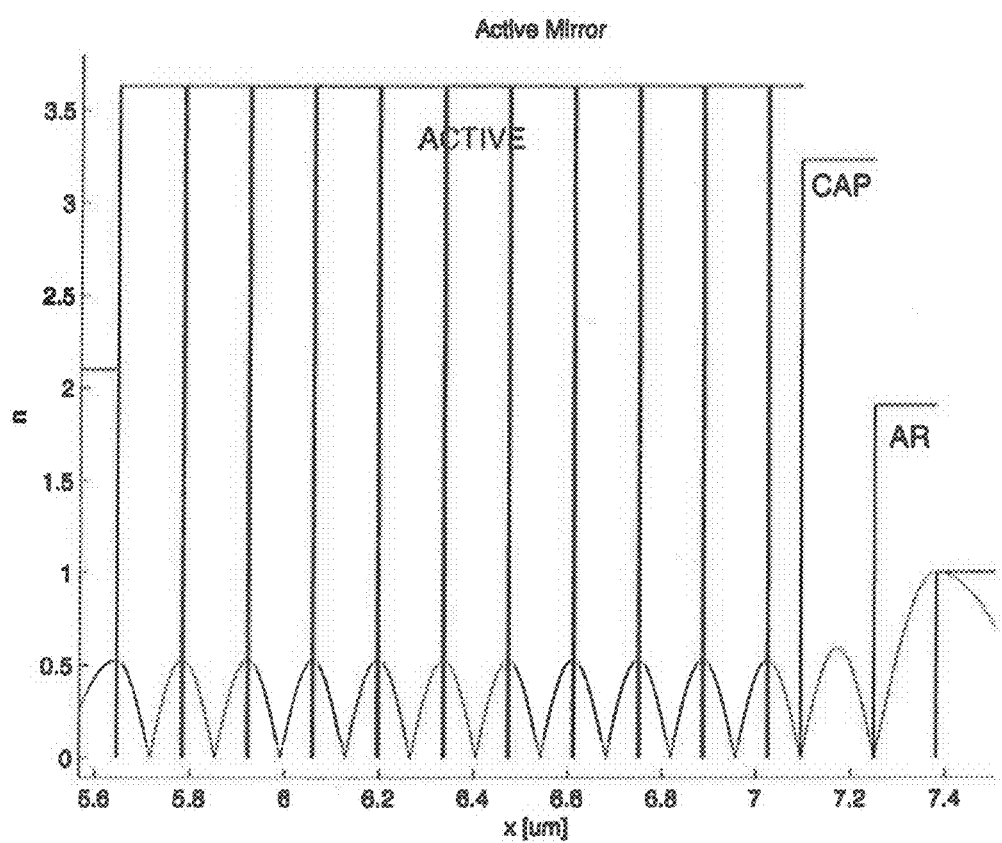
FIG. 7 shows a schematic of an implementation of a conventional 10 QW RPG structure with a single QW located between two immediately-neighboring nodes of the field.
Figure 9:
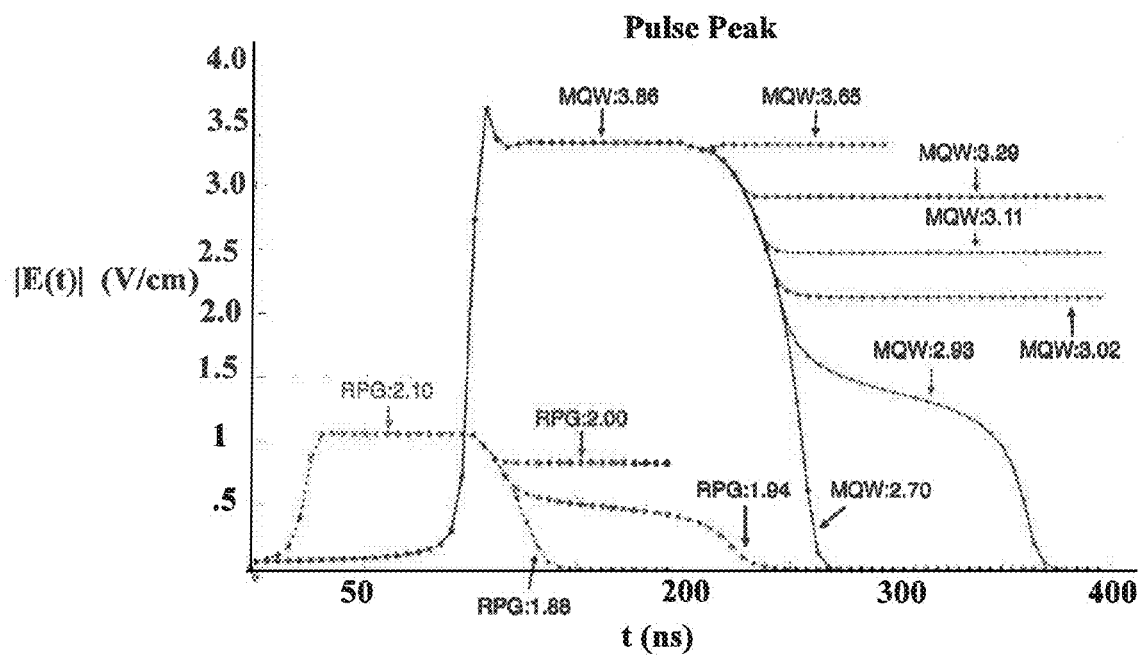
FIG. 9 shows a plot of the transient temporal behavior (before stable mode locking is realized) of the RPG structure and the MQW structure towards a stable mode-locked state, once in this state the initial inversion for each structure is systematically decremented initially towards a net gain of zero for RPG and for the MQW; after the gain depletion the inversion is decremented further entering the net absorption region until such a point that the mode-locking is lost and the system returns to the CW lasing state, the sets of curves for the MQW structure on the right show that mode-locking is sustained well into the net linear absorption region.
Figure 10:
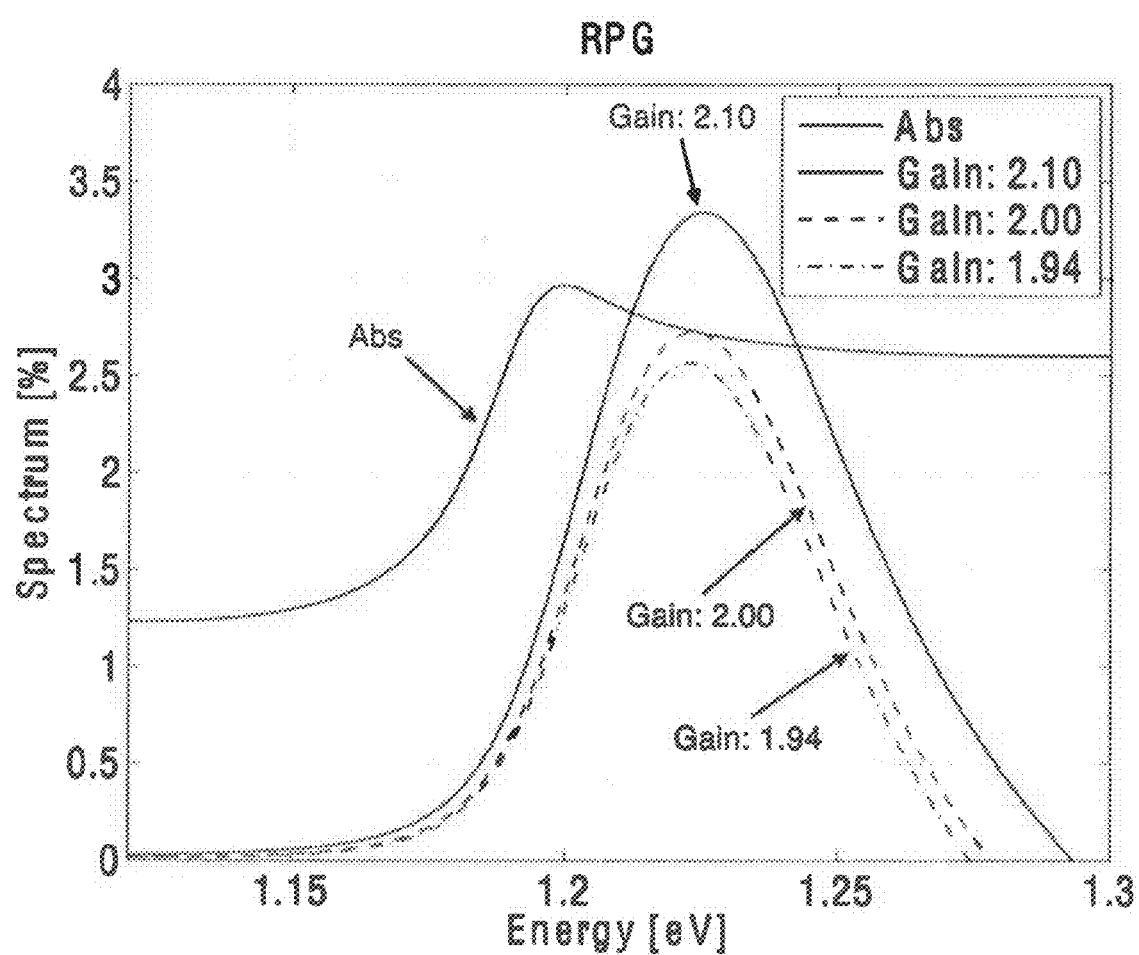
FIG. 10 shows a plot of linear gain as a function of carrier density of the RPG structure for the densities the dynamics of which are shown in FIG. 9 and displayed in the inset, the upper curve shows the absorption of the SESAM for each of the cases.
Figure 11:
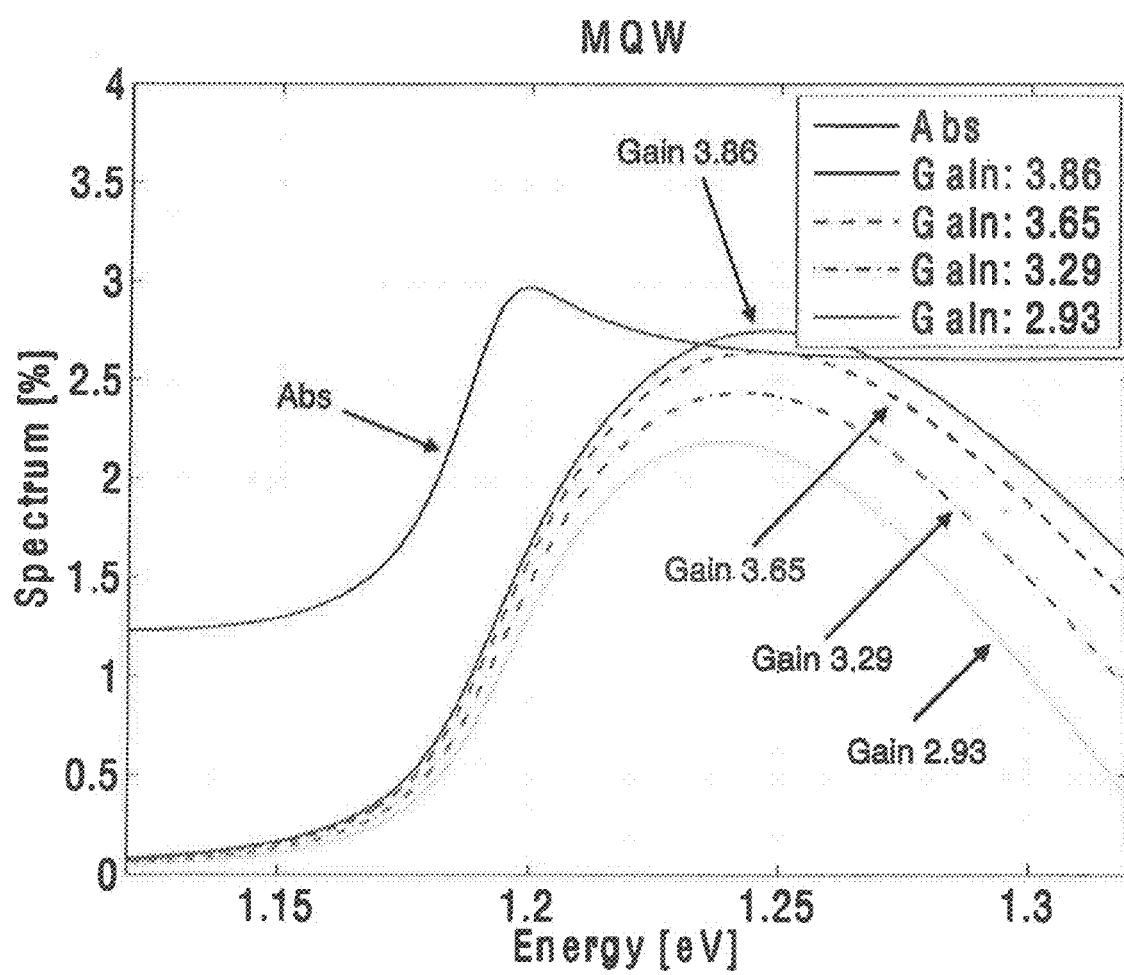
FIG. 11 shows a plot of linear gain as a function of carrier density of the MQW structure for the densities the dynamic of which are shown in FIG. 9 and displayed in the inset, the upper curve is the fixed SESAM absorption for each case.

FIG. 9 displays the initial time development towards a stable mode-locked state for the RPG structure of FIG. 7 (lower peaked line RPG: 2.10) corresponding to an initial carrier density of $2.10 \times 10^{16}$ m$^{-2}$, and that for the cumulative MQW structure of FIG. 8 (higher peaked line MQW: 3.86), corresponding to an initial carrier density of $3.86 \times 10^{16}$ m$^{-2}$. Once the stable mode-locked state has been reached and the mode-locking operation is established, the initial inversion for each structure is systematically decremented initially towards a net gain of zero (line RPG-2.00) for the RPG and (line MQW-3.65) for the MQW, corresponding respectively to a carrier density of $2.00 \times 10^{16}$ cm$^{-2}$ and $3.65 \times 10^{16}$ m$^{-2}$ for the RPG and MQW structures, respectively. Following this, the inversion is decremented further entering the net absorption region until such a point that the mode-locking is lost and the system returns to the CW lasing state. The operation of the RPG structure immediately returns to the CW state below zero net gain. The sets of curves for the cumulative MQW structure on the right show that mode-locking is sustained well into the net linear absorption region (see FIG. 11). In FIGS. 9, 10, and 11, each curve associated with a gain level is labeled accordingly, and these curves illustrate the gain and energy extraction dynamics with respect to the carrier density being decremented.

From the results of FIG. 9, a dramatic difference in the dynamical evolution of each of the mode-locked systems of FIG. 7 (conventional RPG) and FIG. 8 (an embodiment of the cumulative MQW of the invention) is verified, as one moves into a net absorption limit. Indeed, the RPG structure remains mode-locked at zero net gain but then switches back to CW operation below this point. In stark contrast, the much higher peak amplitude and shorter duration of pulses produced by the mode-locked cumulative MQW structure remain mode-locked well into the net absorption region, thereby displaying a strong and robust hysteresis behavior. The cumulative MQW structure is a truly nonequilibrium nonlinear dynamical system that remains in its mode-locked state even though the system exhibits a strong net linear absorption. While hysteresis might be observed in mode-locked lasers in general, those hysteresis phenomena are the result of residual thermal effects in contrast to the situation observed here where such long term thermal effects are not considered and the hysteresis is intrinsic due to many-body effects.

FIG. 10 and FIG. 11 contrasts the RPG and cumulative MQW structures the dynamics of which are shown in FIG. 9. FIG. 10 shows the linear gain for decreasing carrier densities (line Gain: 2.10, line Gain: 2.00, line Gain: 1.94) of the RPG structure for the densities whose dynamics are shown in FIG. 9 and displayed on the curves. The black curve (line Abs) is the fixed SESAM absorption for each case. FIG. 11 shows the linear gain versus carrier density for the cumulative MQW structure of FIG. 8 the dynamics of which are displayed in FIG. 9. Usually the difference of the gain and absorption defines the net gain, although here a net absorption is obtained when the peak gain lies below the absorption.

FIG. 10 and FIG. 11 plot the linear gain and SESAM absorption for the different carrier densities used in FIG. 9. When the linear gain exceeds the SESAM absorption, the difference yields the net linear gain. A finite net linear gain is necessary to cause the buildup of the intra-cavity field and establishment of mode-locked behavior. It is noted that the RPG mode-locking survives even when the net gain is zero (peak gain=absorption in the left figure) but the mode-locking reverses to a CW state for any finite net absorption (peak gain<absorption). On the other hand, the cumulative MQW structure is remarkably robust and remains mode-locked even for large linear net absorption leading to a hysteresis cycle in pump power.

This dramatic enhancement of peak intensities of laser output obtained with the use of the cumulative MQW structure based architecture is explained by better extraction of carriers from the entire inversion spectrum. This can be understood in terms of the nonequilibrium electron and hole carrier density dynamics, or in this context, nonequilibrium inversion ($n_e + n_h - 1$), where $n_e, n_h$ are the electron and hole carrier densities respectively. Initially in the dynamical evolution, each QW in the subwavelength stack of the cumulative structure of FIG. 8 acts independently and those close to the maximum of the field (at the antinode) grow fastest although slower than the RPG structure of FIG. 7, which also has 10 such QWs seeing an identical peak gain. However, while the RPG structure is restricted to drawing carriers from the same rather narrow spectral window centered about its central pulse frequency, the subwavelength spaced QWs in the cumulative MQW structure act together so as to efficiently sweep out a much broader swath of carriers (in some cases almost all) and convert them into a giant sub 100 fs pulse. When optimized, the QW sub-wavelength spacing or QW composition can be adjusted to sweep out most of the inversion leading to the shortest possible duration fs pulse train.

Example VI

It has been established numerically that the use of a cumulative MQW structure in a laser system of the invention delivers much higher pulse peak powers than the use of an RPG structure as illustrated in FIG. 9, which is not obvious at all from the FIG. 9 plots.

Figure 14:
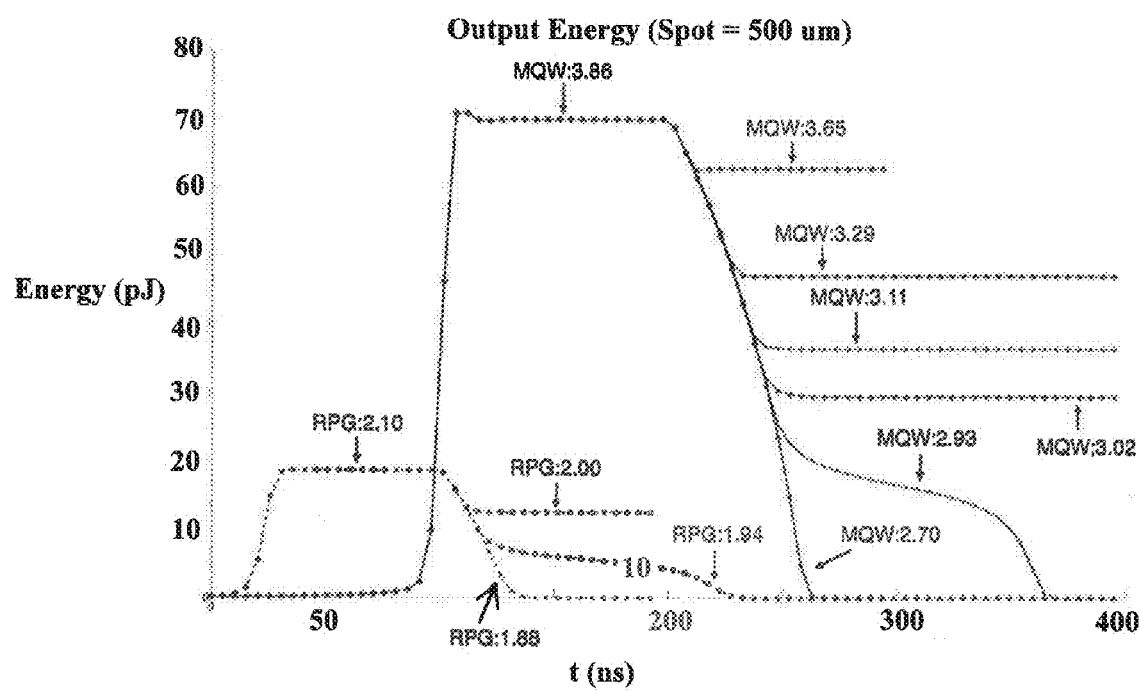
FIG. 14 shows plots of pulse energy (measured in pJ) for the RPG and MQW structures of FIGS. 7 and 8; the MQW structure delivers much higher pulse energies than the RPG up to 80 pJ. The presented simulation results are just above threshold (corresponding to the situation when the gain just compensates the loss) so the pulse energies are low.

To this end, FIG. 14 shows that the performance of the cumulative MQW structure is much better than that of the RPG structure from the point of view of delivering pulses of substantially higher energy. This case corresponds to the inversion being just above threshold for lasing so that the energies represent the lowest achievable. If pumped at a higher level, however, the difference in energy output becomes even larger.

Figure 15:
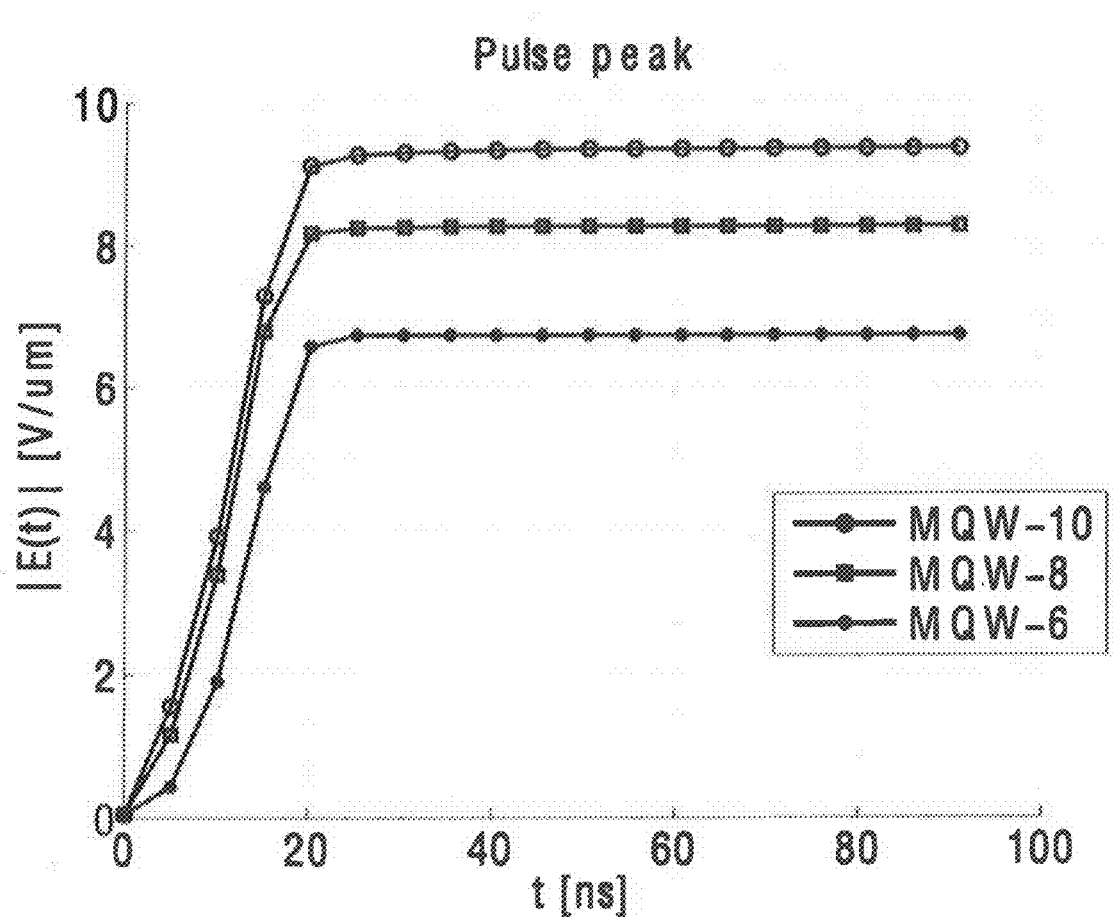
FIG. 15 shows plots of mode-locked pulse peak amplitudes for the MQW structure with 10, 8 and 6 QWs packed in a single half-cycle of the standing wave field between two immediately neighboring nodes of the standing wave field.
Figure 16:
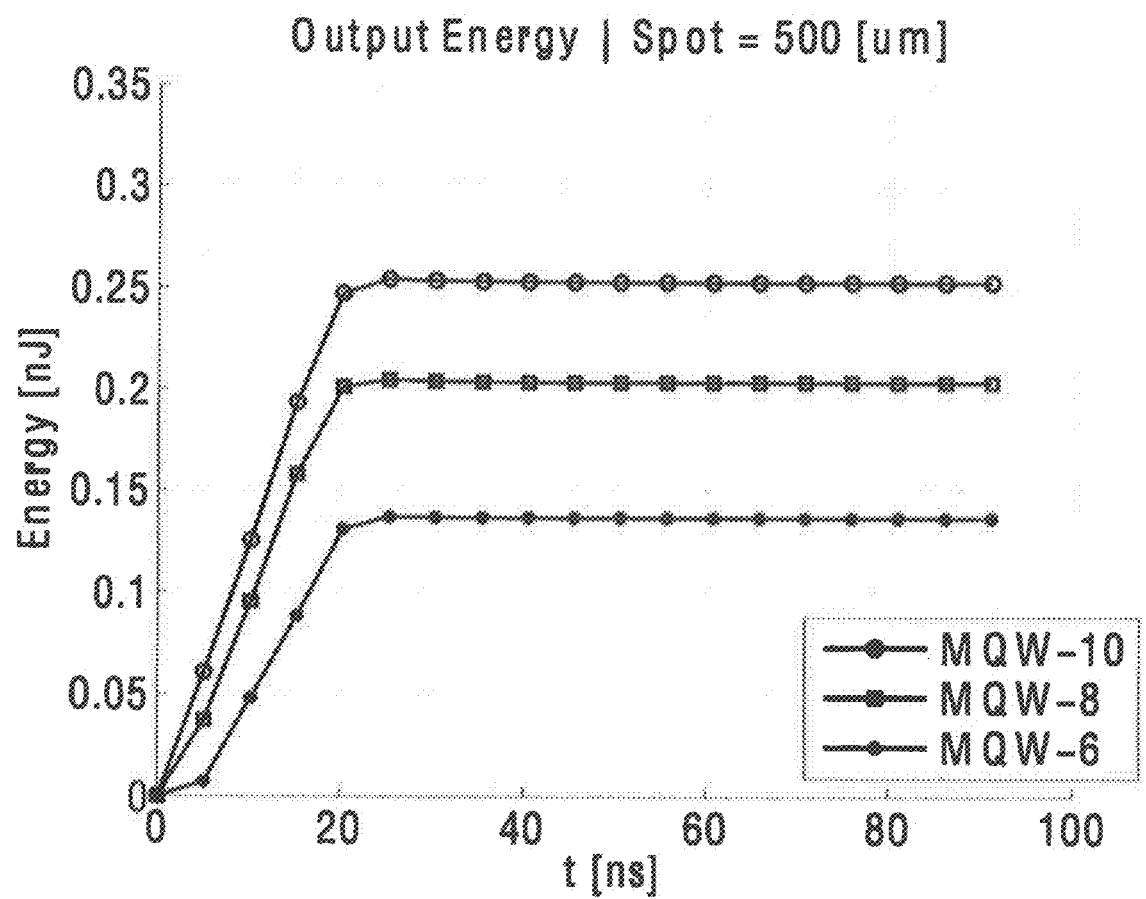
FIG. 16 shows plots of mode-locked pulse energies for the MQW structure with 10, 8 and 6 QWs packed in a single half-cycle of the standing wave field between two immediately neighboring nodes of the standing wave field.

Further to this end, FIG. 15 shows mode-locked pulse peak powers for the laser systems including, respectively, cumulative MQW structures discussed in reference to FIG. 6 (with 10, 8 and 6 QWs packed at a single anti-node of the standing wave field). FIG. 16 shows the corresponding energy fluencies for a 500 μm spot of the pump radiation on the laser chip containing such cumulative MQW structures. FIG. 15 and FIG. 16 confirms the observations about advantageously higher power output from the cumulative MQW structure as the pulse energies reach 0.25 nJ for the 10 MQW structure. Here 6-, 8- and 10-MQW structures are compared and show the time evolution towards fixed mode-locked peak amplitudes on the left and the corresponding pulse energies on the right.

Example VII

Figure 21:
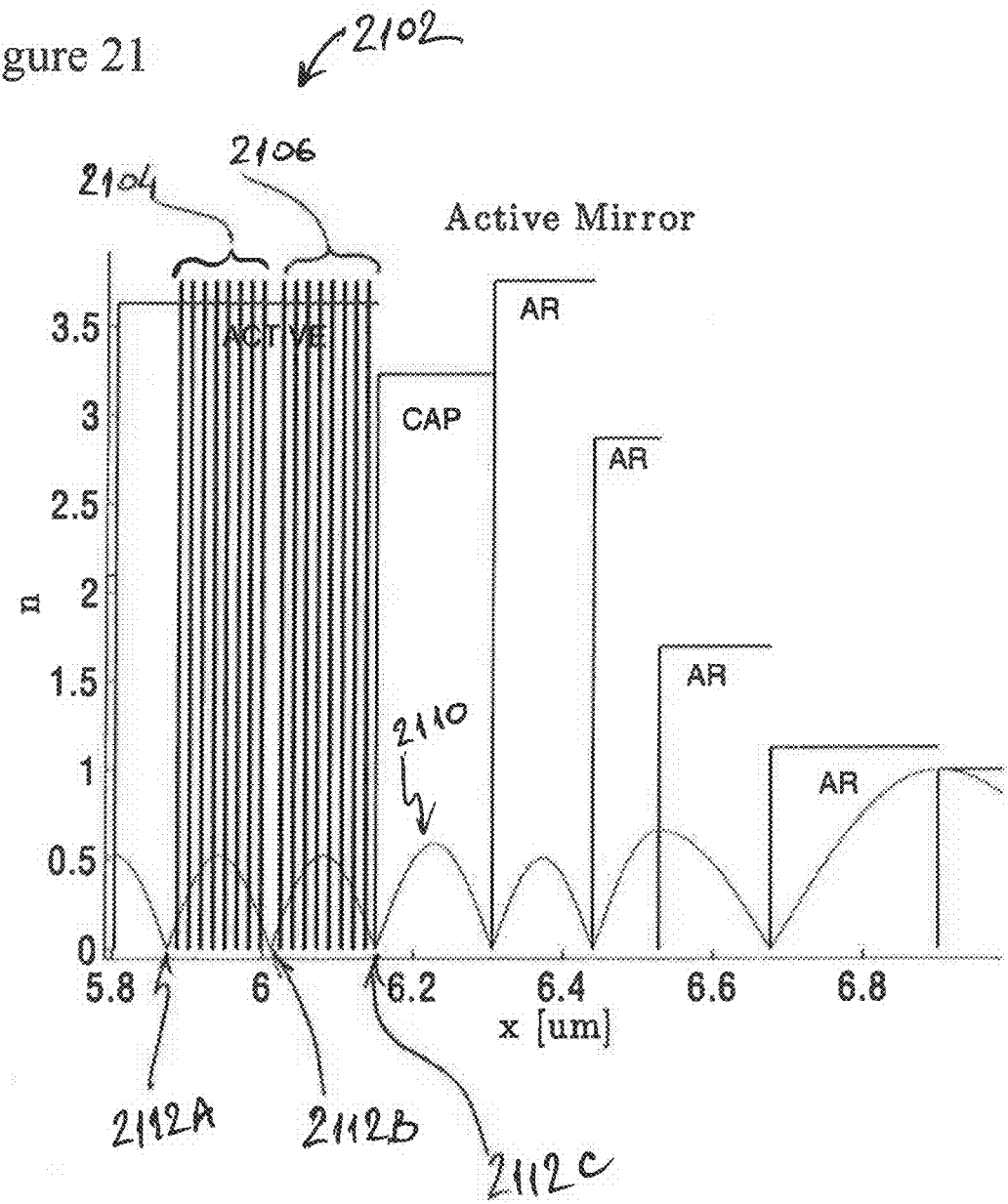
FIG. 21 shows a schematic of an implementation containing an 8:8 MQW structure where 8 QWs are packed within each half cycle of field intensity distribution along the optical axis.
Figure 22:
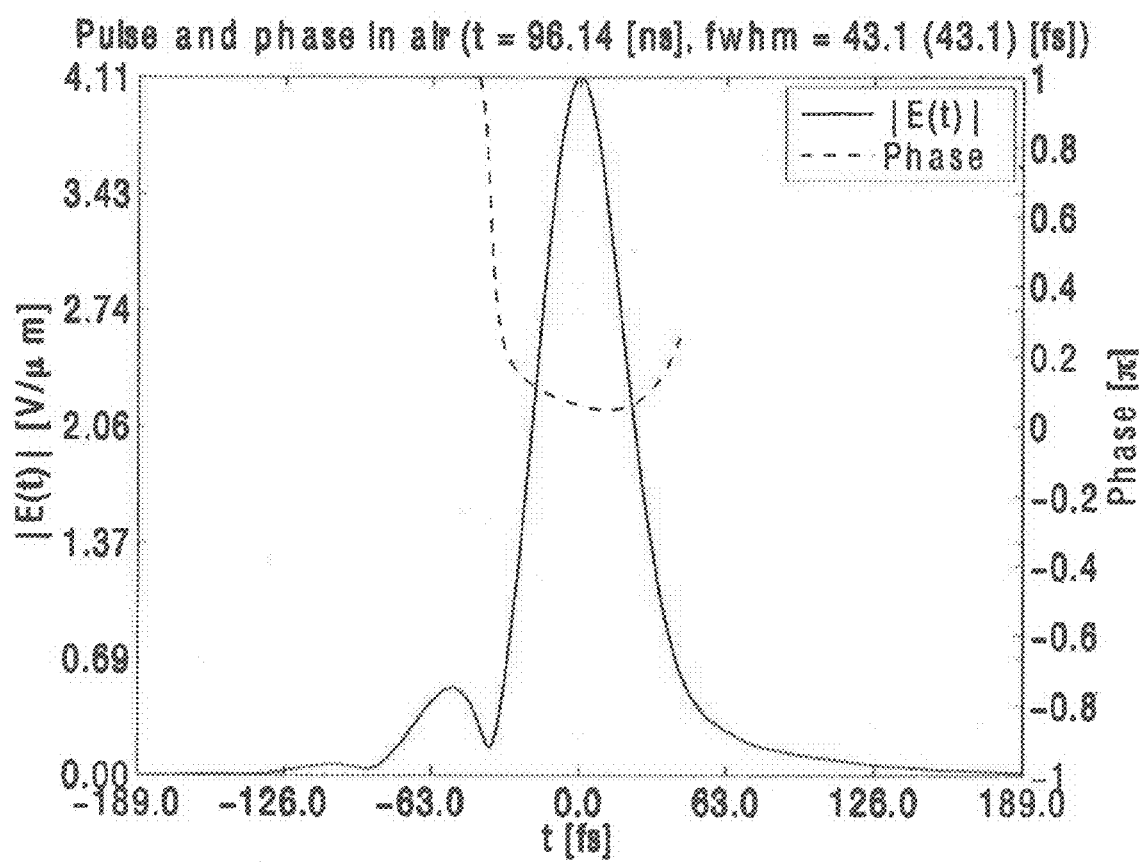
FIG. 22 illustrates a mode-locked pulse corresponding to the structure of FIG. 21, with a pulse duration of about 43 fs and a weak chirp.

As shown in FIG. 21, a related implementation of the cumulative MQW structure of the invention includes an 8:8 MQW structure 2102, which contains two MQW units (or base cells) 2104, 2106. Each of the units 2104, 2106 includes 8 QWs packed within a respectively-corresponding cycle of axial field intensity distribution shown as 2110. The immediately neighboring nodes 2112A, 2112B of the intensity distribution 2110 are located on the opposite sides of the MQW unit 2104, while the immediately neighboring nodes 2112B, 2112C are located on the opposite sides of the MQW unit 2016. FIG. 22 shows the mode-locked pulse formed with the use of the cumulative MQW structure 2102, with a pulse duration of 43.1 fs and a quadratic chirp.

Figure 12:
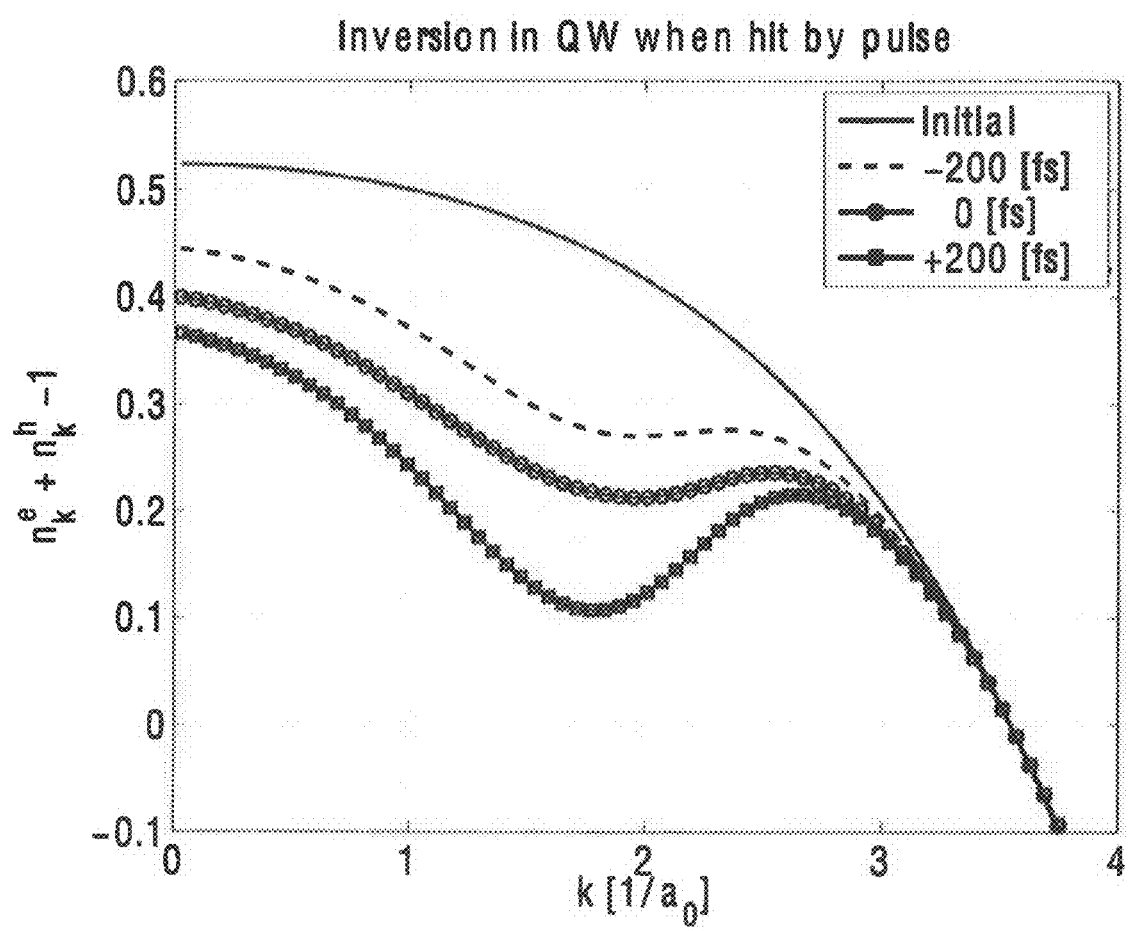
FIG. 12 shows a plot of snapshots, representing inversion depletion at particular moments in time, for the RPG structure as the pulse sweeps through the gain chip, wherein the initial Fermi distribution of carriers for the inverted system is shown at time t=0 for reference.
Figure 13:
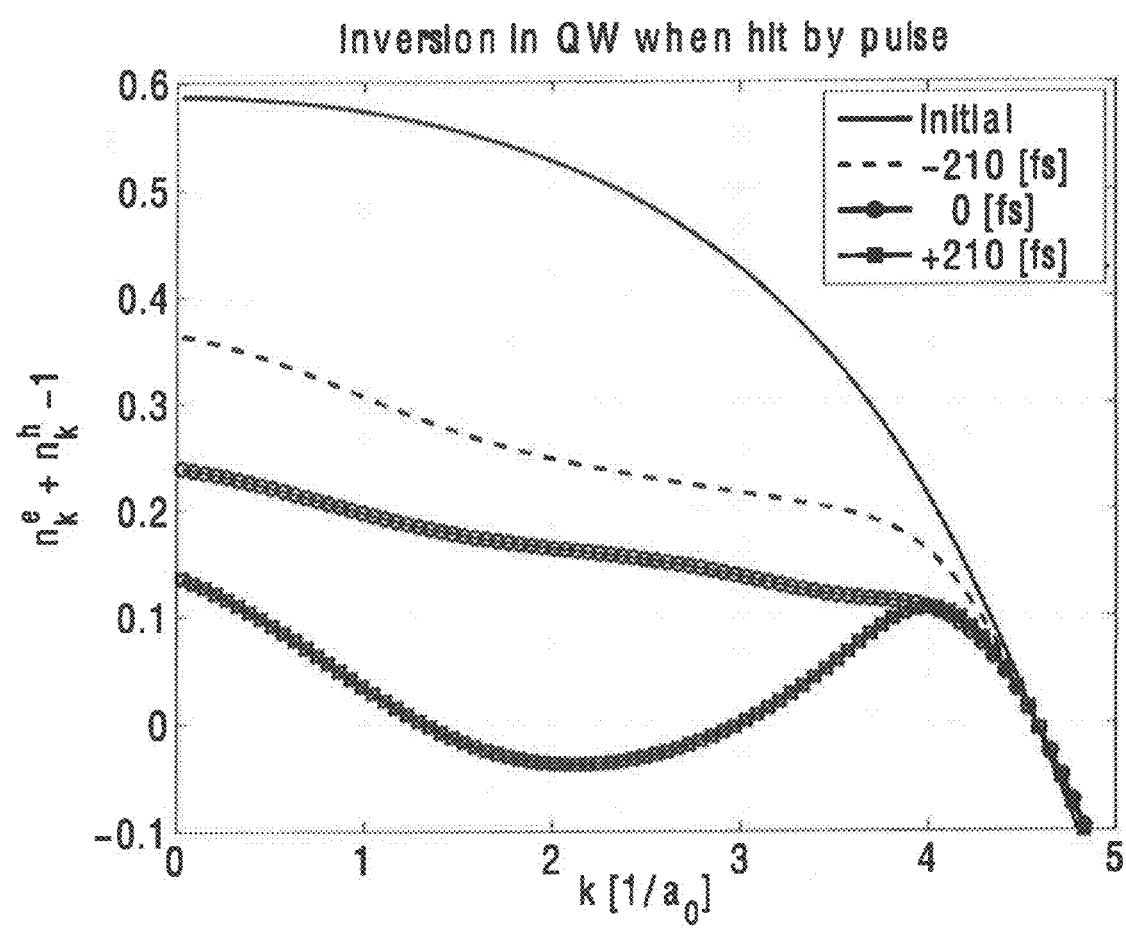
FIG. 13 shows a plot of snapshots of the inversion depletion for the 8:8 MQW structure as the pulse sweeps through the gain chip, wherein the initial Fermi distribution of carriers for the inverted system is shown at time t=0 for reference.

FIG. 12 and FIG. 13 contrast the inversion dynamics of the conventional RPG and the cumulative MQW structures. FIG. 12 shows snapshots of the inversion depletion for the RPG structure as the pulse sweeps through the gain chip. FIG. 13 shows snapshots of the inversion depletion for the 8:8 MQW structure 2102. The carrier depletion of the RPG structure leaves much more unsaturated (unused) carriers after the pulse has exited the gain chip. On the other hand, the cumulative MQW structure 2102 is depleting carriers across the entire spectral range (line 13.1). This yields a mode-locked pulse duration of approximately 43 fs with a relatively small chirp. Such very short pulse duration supports the conjecture that the shortest pulse possible can be generated if the placement of the QWs could be arranged to sweep out the entire inversion. Line 13.1 in FIG. 13 shows that the inversion is indeed depleted over a wide spectral range. Note that there is still unused inversion in the wings of line 13.1 for this case. Possible optimization of structure 2102 may include optimization of the QW spacing and well compositions, for example, such that there is no inversion left in the system after the pulse has passed. This would produce the shortest possible duration pulse which should be resilient against pulse breakup as there are no further unsaturated carriers available to produce amplication.

Example VIII

FIG. 17 shows another implementation of the idea of the invention, according to which the cumulative MQW structure 1704 contains two MQW units 1706, 1708, each of which packs five 5 QWs around each of the two adjacent field anti-nodes such that the immediately neighboring nodes 1712A, 1712B of the standing wave 1716 (formed during lasing along the optical axis of the structure 1704) are located on the opposite sides of the MQW unit 1706, while the immediately neighboring nodes 1712B, 1712C are located at the opposite sides of the MQW unit 1706.

Figure 18:
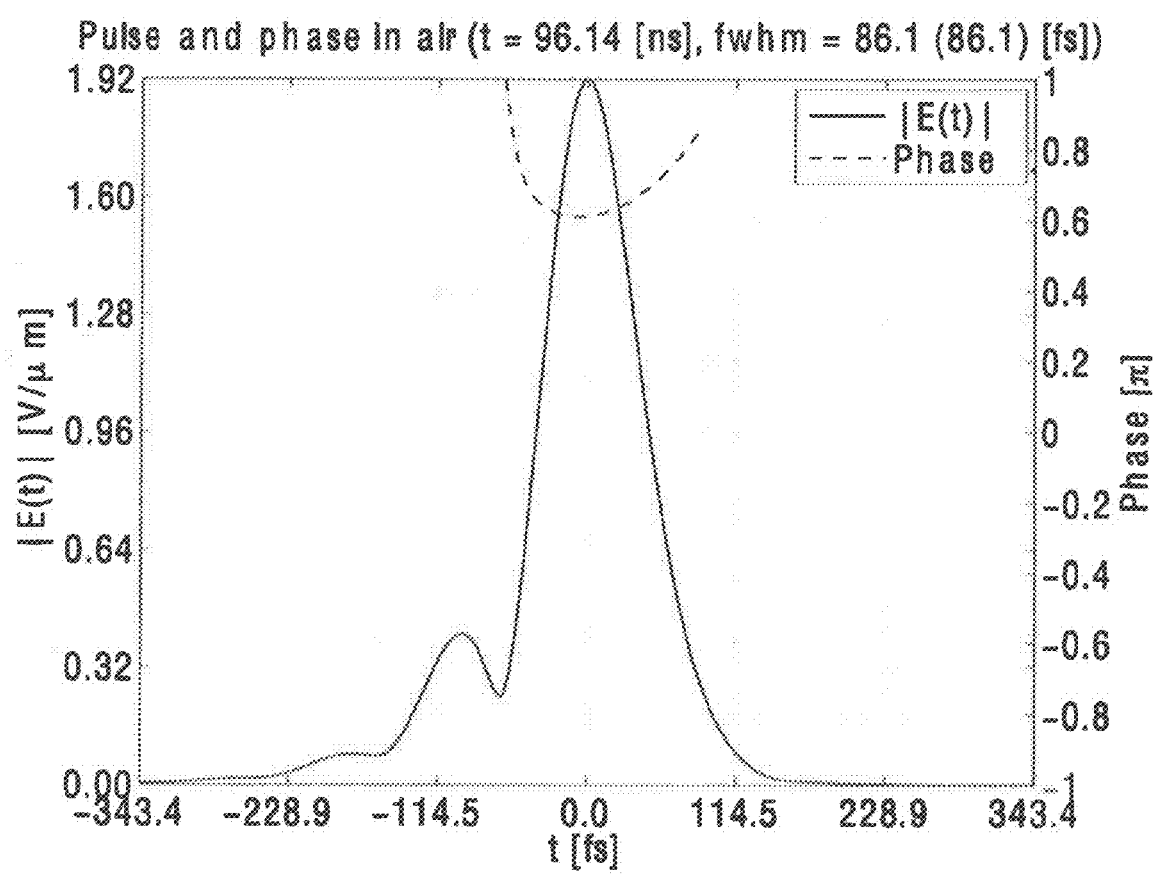
FIG. 18 shows the final mode-locked pulse (that is, stable pulse that regenerates itself in each round trip in the cavity) of duration of about 86 fs resulting from the structure in FIG. 17 and the phase across the pulse indicates some residual chirp.

The MQW arrangement 1704 utilizes the replication of a base MQW unit with 5 QWs to produce a 5:5 structure. FIG. 18 shows the calculated mode-locked pulse of duration 86.1 fs resulting from the operation of such 5:5 structure in a laser system, and the phase of the pulse, which exhibits a small amount of chirp. Generally, when the residual chirp remains in operation, dispersion compensating elements can be introduced within or external to this or any other implementation so as to reduce the chirp (flatten the phase) and further reduce the pulse time duration. (For example, for use with a standard laser a chirped mirror can be designed to compensate for chirp in the pulse; in mode-locked fiber lasers a section of fiber can be made of a dispersive material to compensate for other dispersion, or an optical compensator can be employed to compensate for linear chirp.)

Example IX

Figure 19:
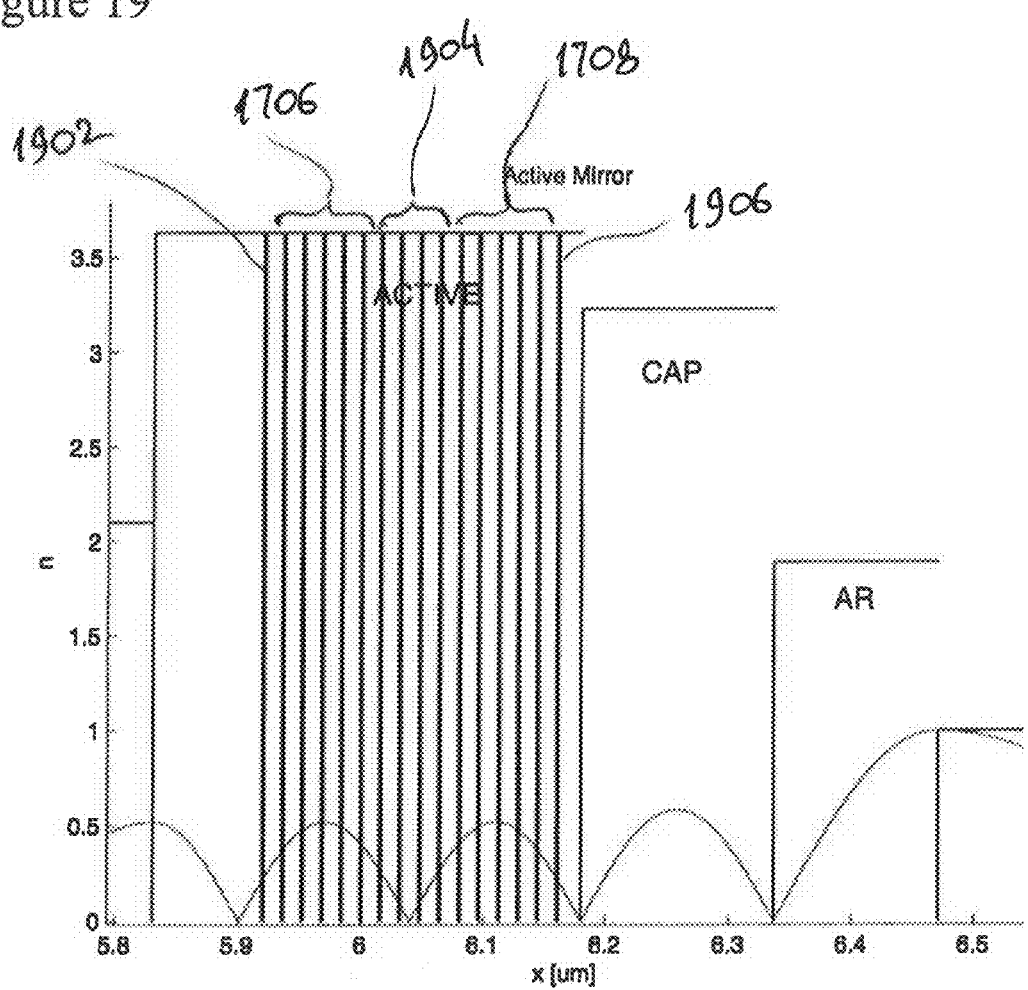
FIG. 19 shows a schematic of an embodiment of an extension of the 5:5 MQW structure of FIG. 17. Here, the remaining space in the structure is filled with additional QWs.
Figure 20:
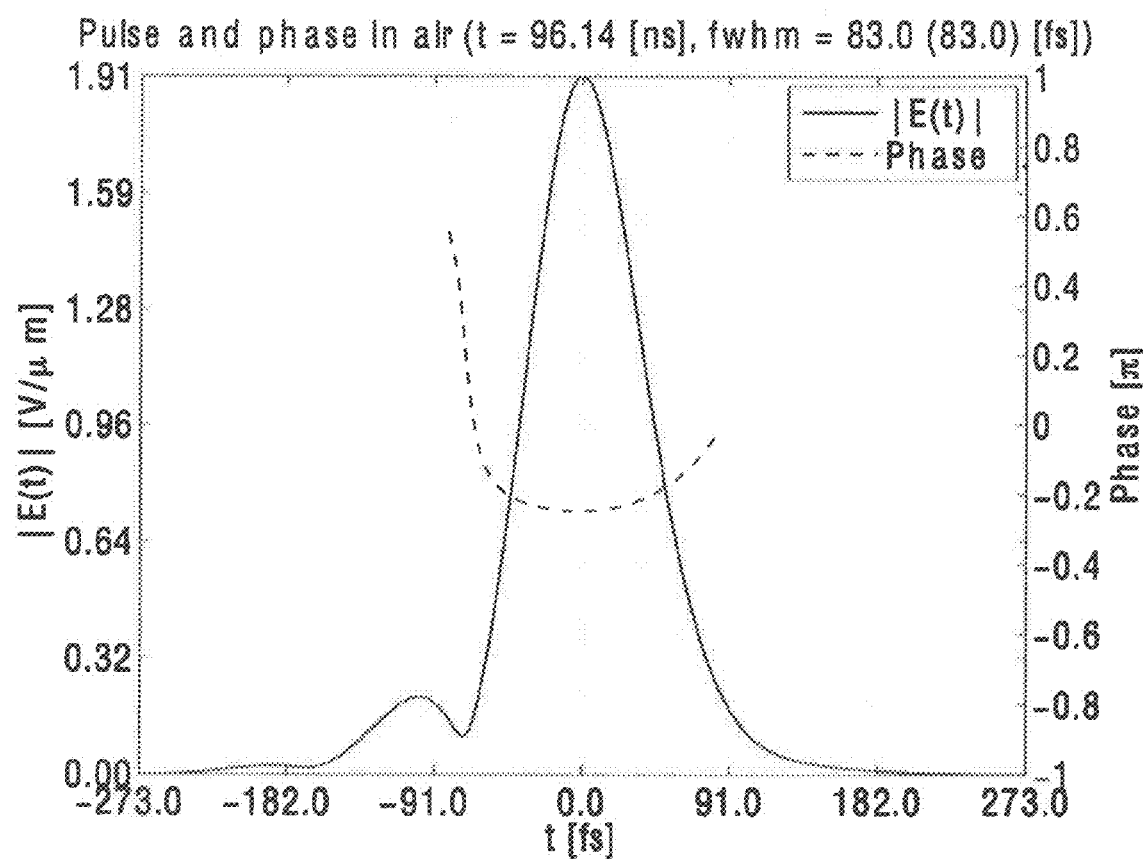
FIG. 20 shows the final mode-locked pulse of the structure in FIG. 19, where the pulse duration is 83 fs and the phase across the pulse has a residual chirp.

One of the advantageous features of the proposed cumulative MQW arrangement over the systems of related art is that packing of the constituent QWs is very flexible. For example, as shown in FIG. 19, a 5:5 arrangement of the MQW structure of FIG. 17 is complemented with additional QWs 1902, 1904, and 1906 outside and in-between the MQW units 1706, 1708. The resulting structure has total of six additional QWs. In this implementation, the 5:5 MQW structure of FIG. 17 is extended by filling the space (within each standing-wave antinode, that has not been already occupied by QWs) with additional QWs to effectively increase the number of total QWs within each occupied antinode to eight. FIG. 20 shows the resulting mode-locked pulse of duration 83 fs and the phase across the pulse. A comparison of the results of FIG. 20 with those of FIG. 18 reveals that the pulse shape and phase are very similar between these two similar configurations of the cumulative MQW structures.

Example X

In a related embodiment, by arranging the QWs to lase at longer wavelength, even more QWs can be accommodated within a single half-cycle of a standing wave field.

Figure 23:
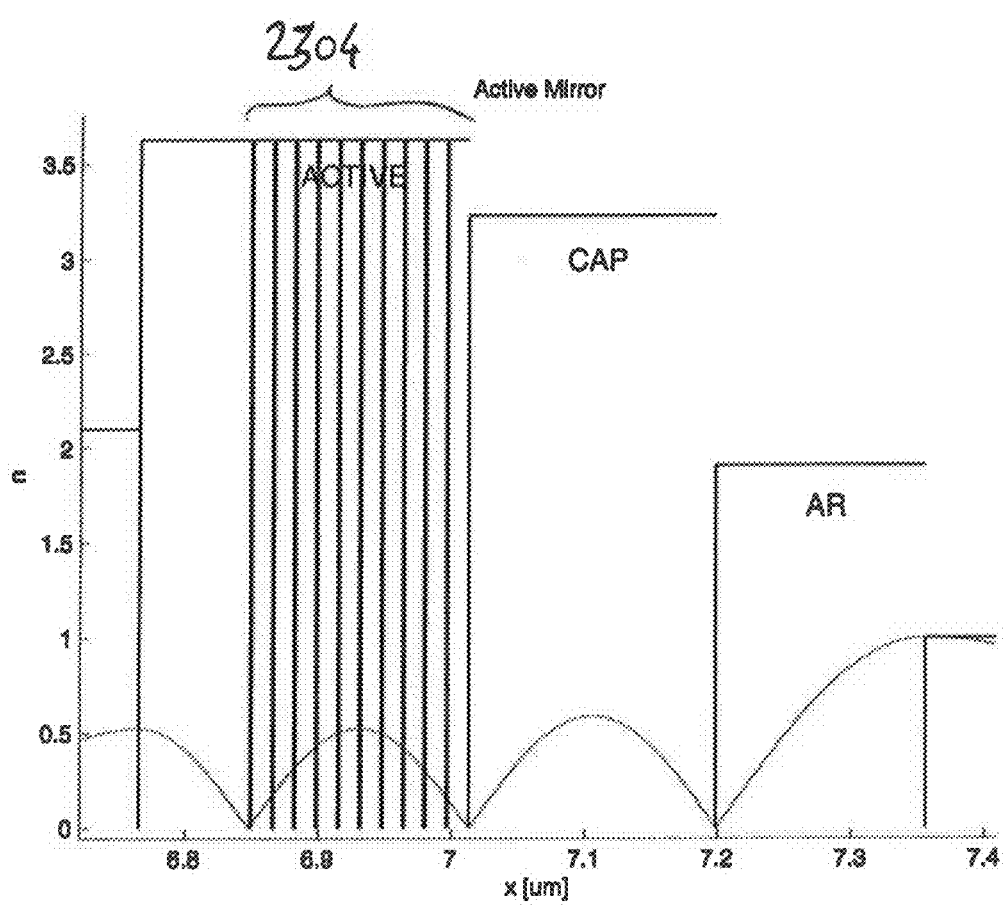
FIG. 23 shows a schematic of an implementation of a 10 QW MQW structure at a center wavelength of 1200 nm, where 10 QWs are densely packed within a single field half-cycle.
Figure 24:
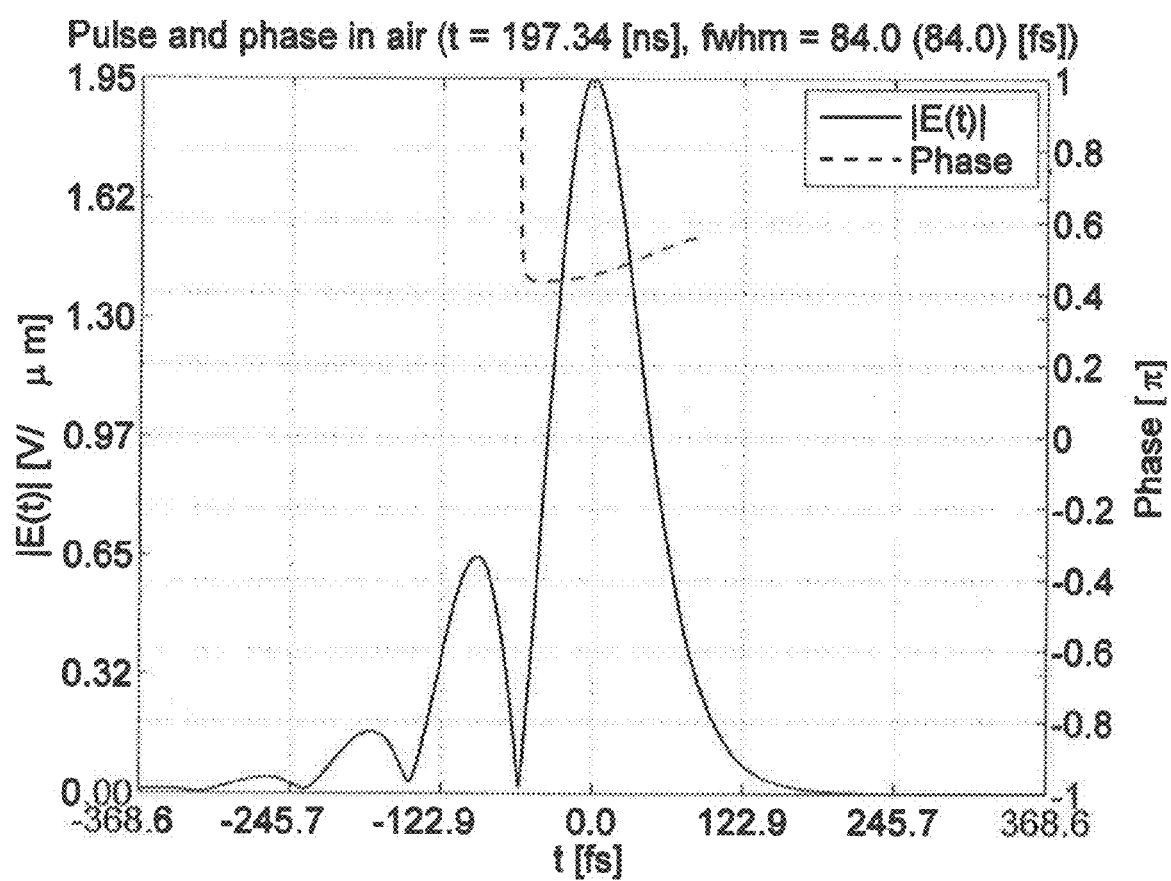
FIG. 24 shows a plot of field strength and phase of mode-locked pulses of 84 fs duration generated by the structure of FIG. 23.

In one implementation, shown in FIG. 23, a ten-QW cumulative MQW structure 2304, configured to operate at 1200 nm, is shown. FIG. 24 presents plots showing mode-locked pulses of 84 fs duration, supported by such structure during the lasing operation.

Example XI

Figure 25:
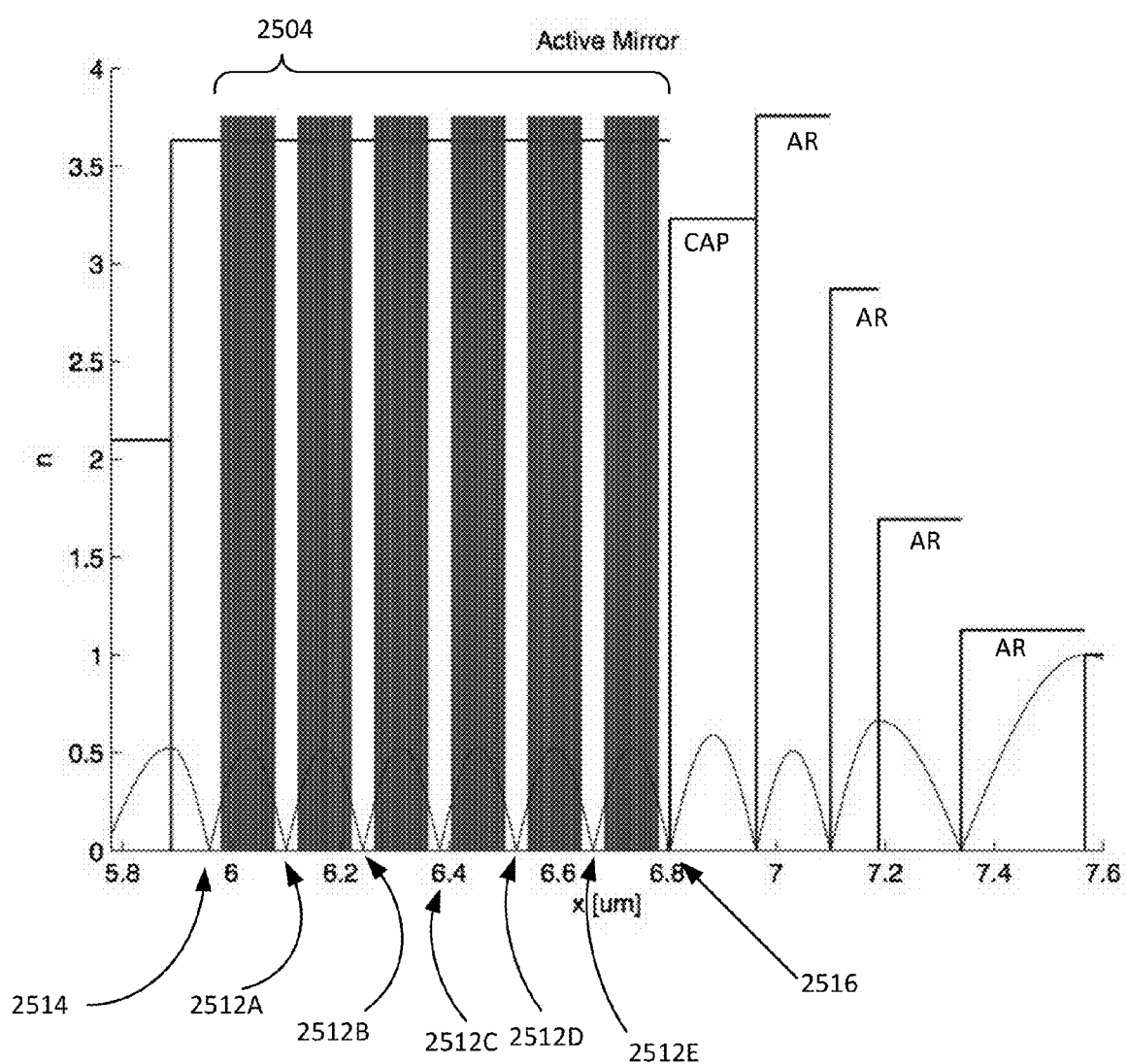
FIG. 25 shows a schematic of an implementation of a 60-QW-containing MQW structure with 10 QWs per standing-wave field half-cycle.

In one implementation, FIG. 25 shows a sixty-QW MQW structure 2504, which includes six MQW units each containing 10 QWs per field half-cycle. Notably, the six MQW units are located sequentially to coincide with sequentially-defined field half-cycles such that each of the nodes 2512A, 2512B, 2512C, 2512D, 2512E (of the field's standing wave distribution) that is intermediate to the MQW units is formed between the two immediately neighboring MQW units. The gain medium of the laser system of this embodiment is configured such that the nodes 2514, 2516 that are the outer nodes in the sequence of immediately neighboring nodes (2514, 2512A, 2512B, 2512C, 2512D, 2512E, 2516) are located on the opposite sides of the cumulative MQW structure 2504.

Figure 26:
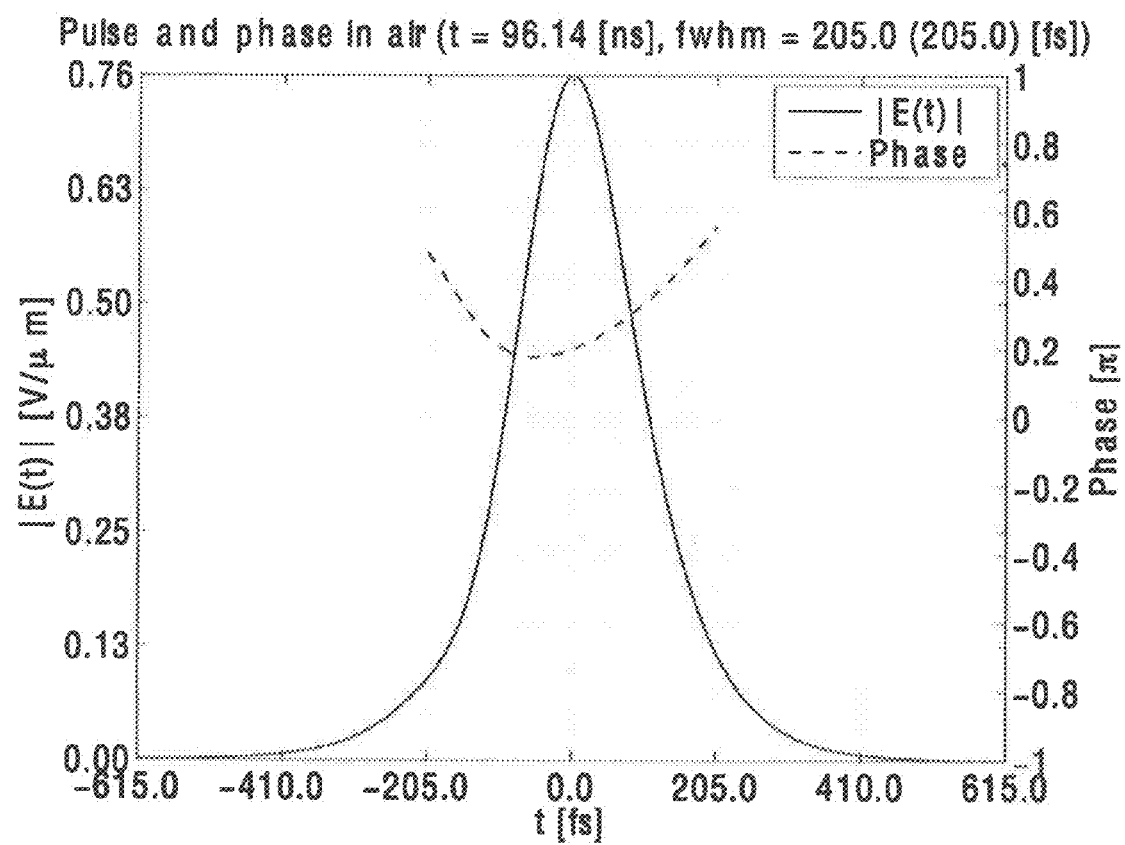
FIG. 26 shows a plot of field strength and phase of mode-locked pulse of 205 fs duration generated from the structure of FIG. 25 with a weak chirp.

Notably, there is a possibility that the use of this structure 2504 may result in generation of a wider pulse, due to the strong interference of waves to the right of the structure 2504 due to an accumulating phase difference. As followed from the numerical analysis presented in FIG. 26, a corresponding mode-locked pulse had a duration of 205 fs. It can be concluded that this multiple repeat MQW structure is not optimized to produce the shortest possible pulse—a full nonlinear optimization configured according to the idea of the invention is required to achieve this goal. However, this example illustrates the breadth of the general design principles.

Additional Examples

The residual carriers remaining on the low and high momentum (frequency) end of the inversion on the right in FIG. 13 (line 13.1) indicate that even shorter pulses can be generated if the MQW can be arranged to sweep out these excess carriers. Each QW can effectively have carriers across the full spectral window depleted by using optimum positioning and spacing of the QW stack within the structure. This optimum positioning and spacing of the QW stack within the structure corresponds with the QWs being packed sufficiently close so as to have each individual QW depleting carriers across the full available spectral window, which is achieved by using thin QWs (less than 8 nm) with narrow barriers (less than 10 nm spacing). The final grown structure could also be a semiconductor superlattice where carriers are shared amongst QWs although for the spacings shown below, the lowest subband in each QW is effectively unperturbed by its neighbor.

Figure 27:
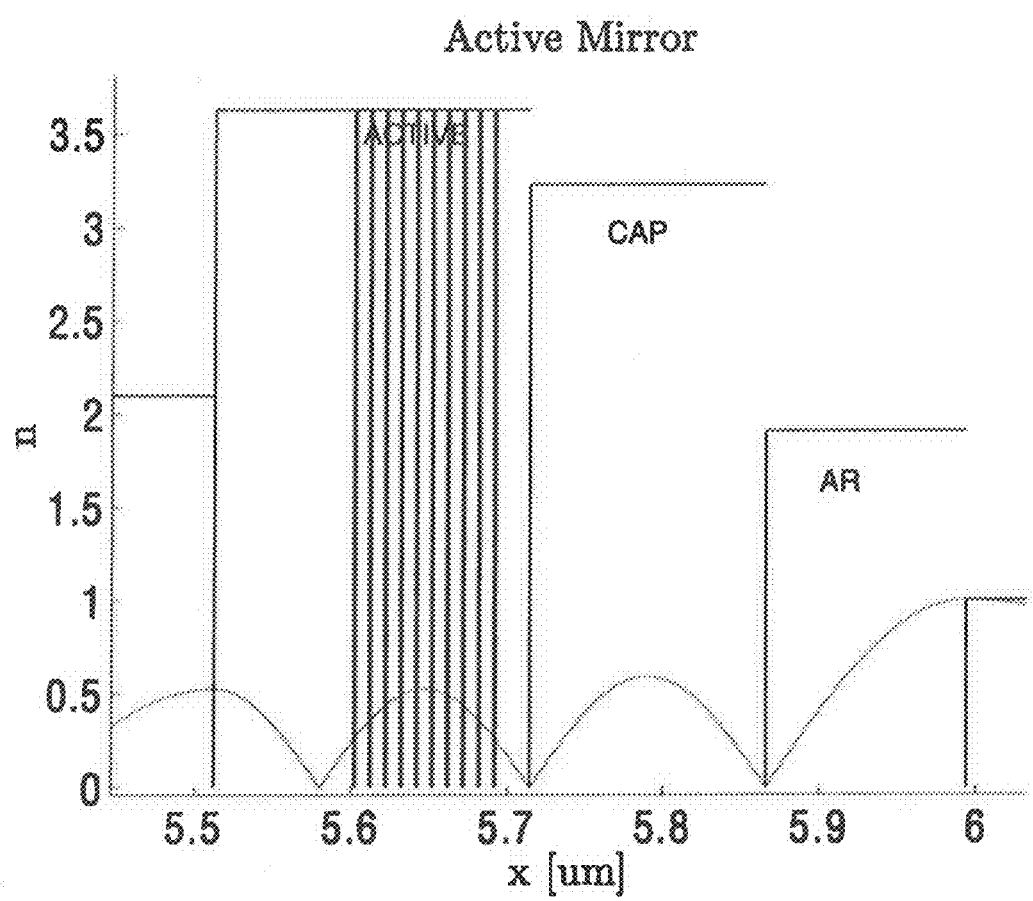
FIG. 27 shows a schematic of an implementation of an MQW structure containing 10 QWs with QW thicknesses and spacing reduced such as to accommodate more spectral bandwidth for more effective depletion of carriers.
Figure 28:
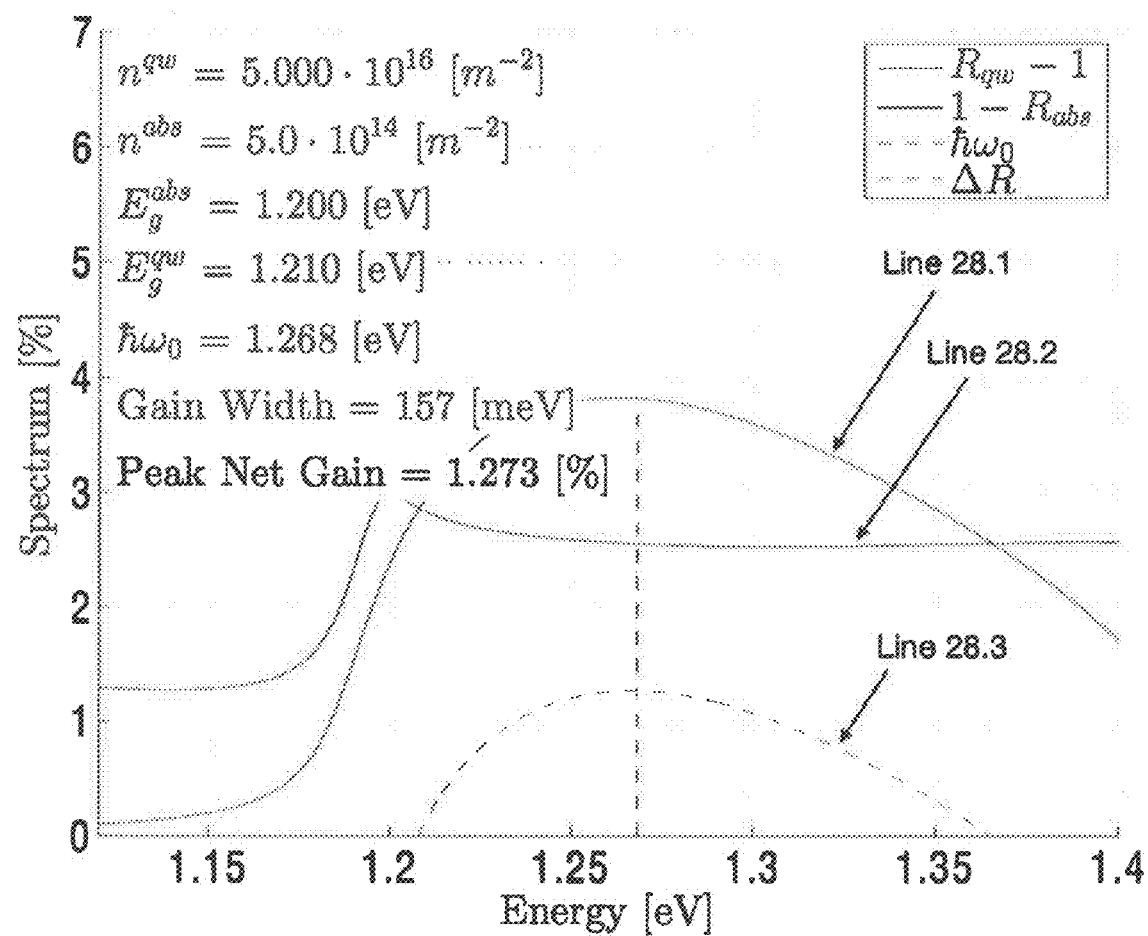
FIG. 28 shows plots of the linear gain spectrum (line 28.1) for high inversion and high SESAM absorption (line 28.2) as well as the net linear gain (line 28.3), relevant material parameters are given in the figure inset.
Figure 29:
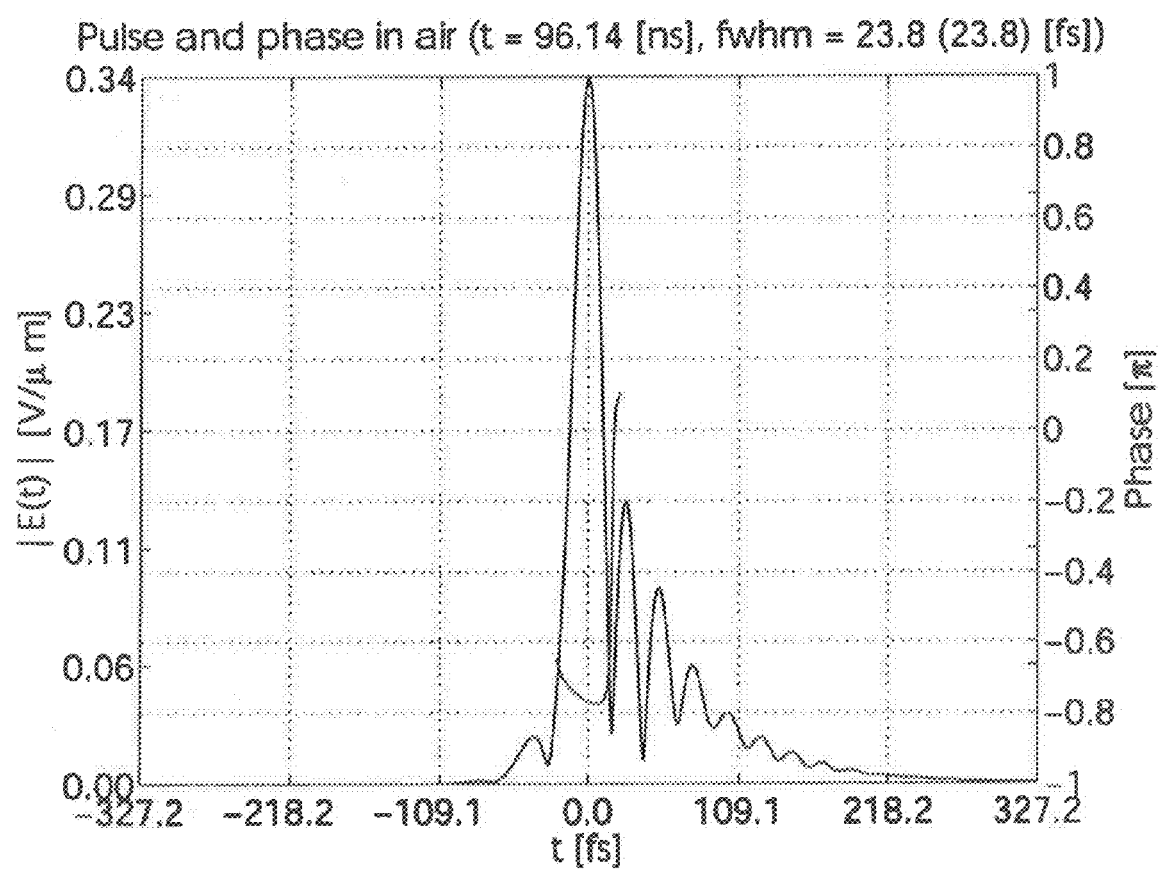
FIG. 29 shows plots representing respectively an amplitude an phase of a mode-locked 23.8 fs pulse with weak chirp across the pulse.
Figure 30:
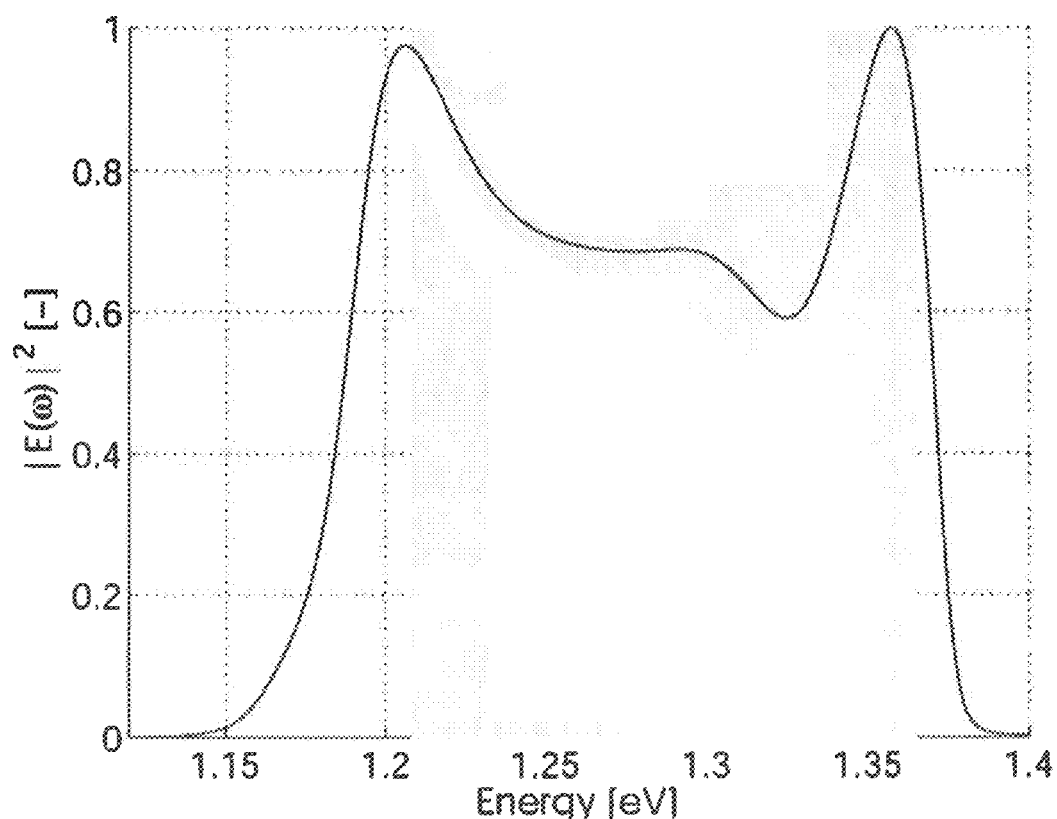
FIG. 30 shows the spectrum of the pulse of FIG. 29, which spectrum extends beyond the linear net gain bandwidth (line 28.3 of FIG. 28); the shaded region indicates the extension of the linear net gain spectrum.
Figure 31:
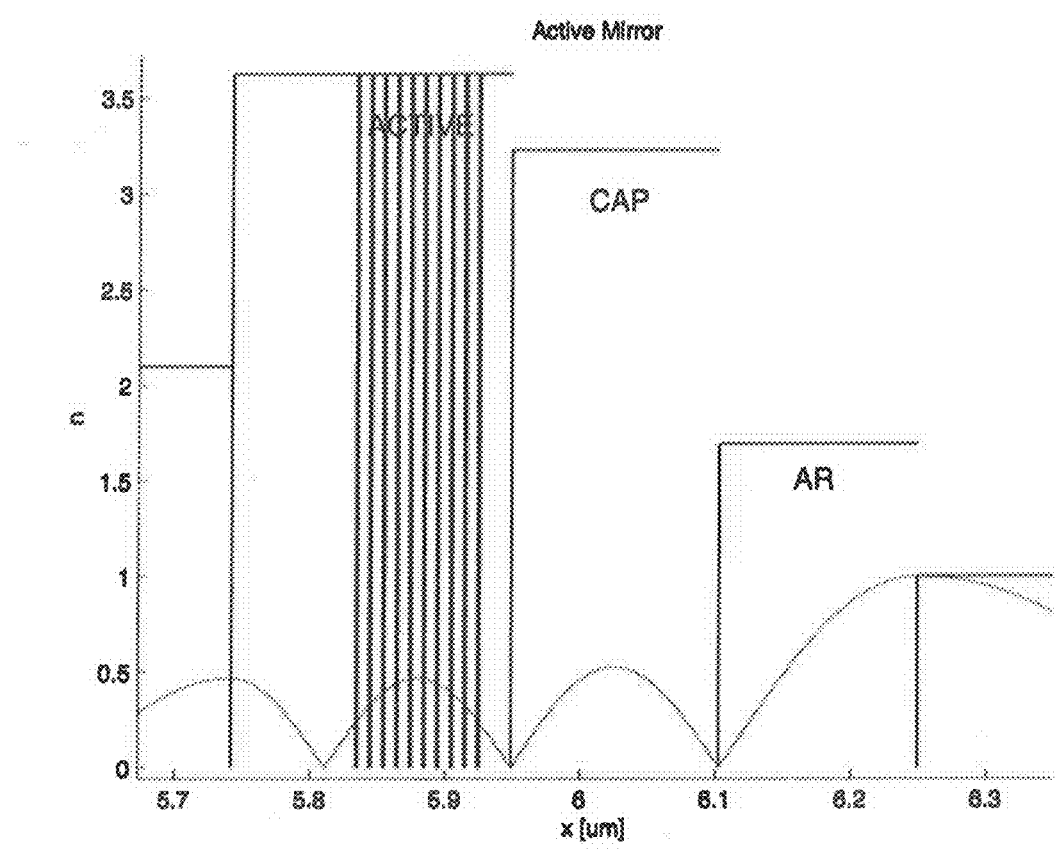
FIG. 31 shows a schematic of a related implementation of the 10-QW-containing MQW structure of FIG. 27, but with QW thicknesses and spacings reduced so as to accommodate more spectral bandwidth for more effective depletion of carriers.

FIGS. 27-34 show simulations investigating two situations where the final outcome is essentially the same although the initialization of the mode-locking is very different. FIG. 27 shows a schematic of a 10 QW MQW structure with QW thicknesses and spacing reduced so as to accommodate more spectral bandwidth for more effective depletion of carriers. FIG. 28 shows a linear gain spectrum for high inversion (line 28.1) with initial carrier density of $5.0\times10^{16}$ m$^{-2}$ and high SESAM absorption (line 28.2) as well as the net linear gain (line 28.3). FIG. 29 shows a mode-locked 23.8 fs pulse amplitude showing weak chirp (phase) across the pulse. FIG. 30 shows the final pulse spectrum in its final mode-locked form. It can be seen that the pulse spectrum extends beyond the linear net gain bandwidth shown by line 28.3 in FIG. 28 and indicated as the shaded region here.

Figure 32:
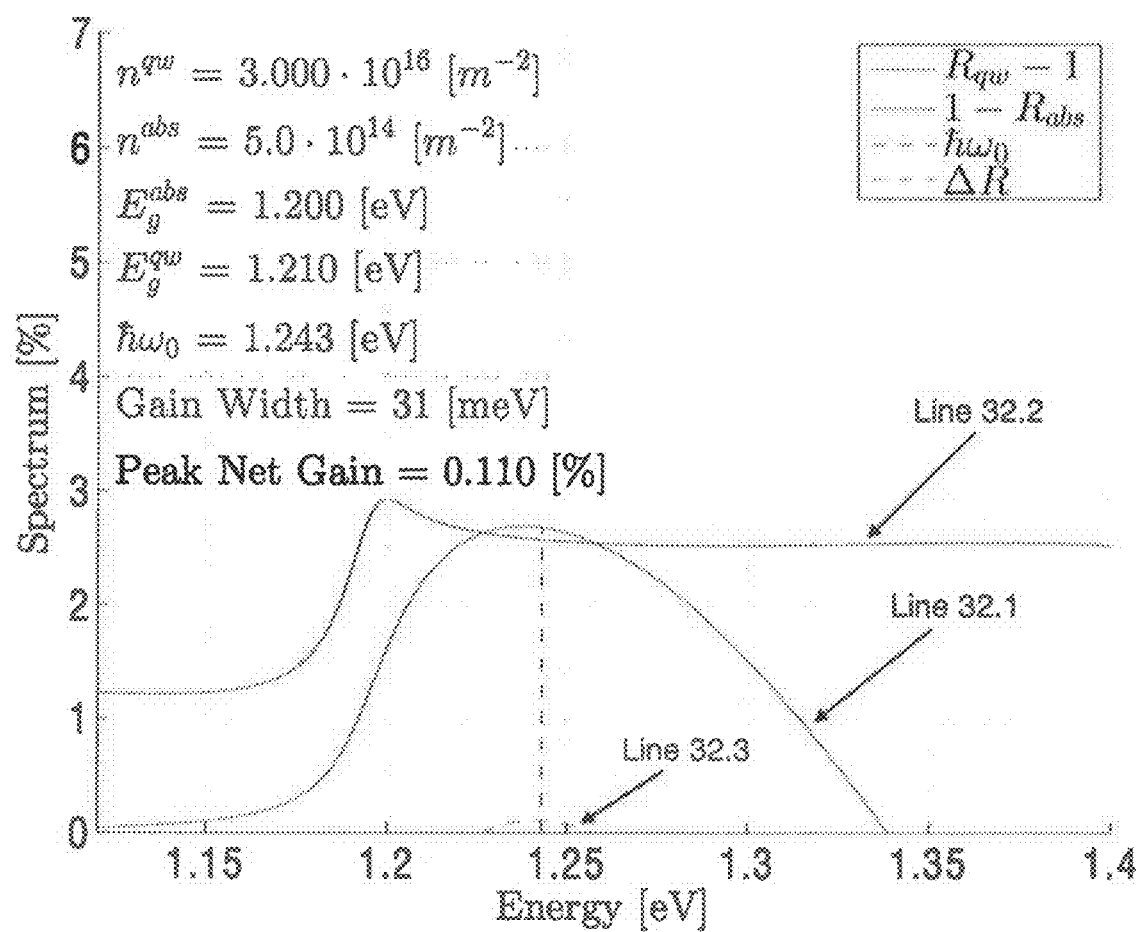
FIG. 32 shows plots of the linear gain spectrum (line 32.1) for lower inversion and high SESAM absorption (line 32.2), as well as the net linear gain curve (line 32.3) for the 10 QW-containing MQW structure (of either FIG. 27, or FIG. 31); here, the linear gain (line 32.1) is reduced relative to that shown in FIG. 28 while the SESAM absorption (line 32.2) is kept the same, which results in a smaller and much narrower net gain spectrum as compared to that of FIG. 28 (line 32.3 vs line 28.3)
Figure 33:
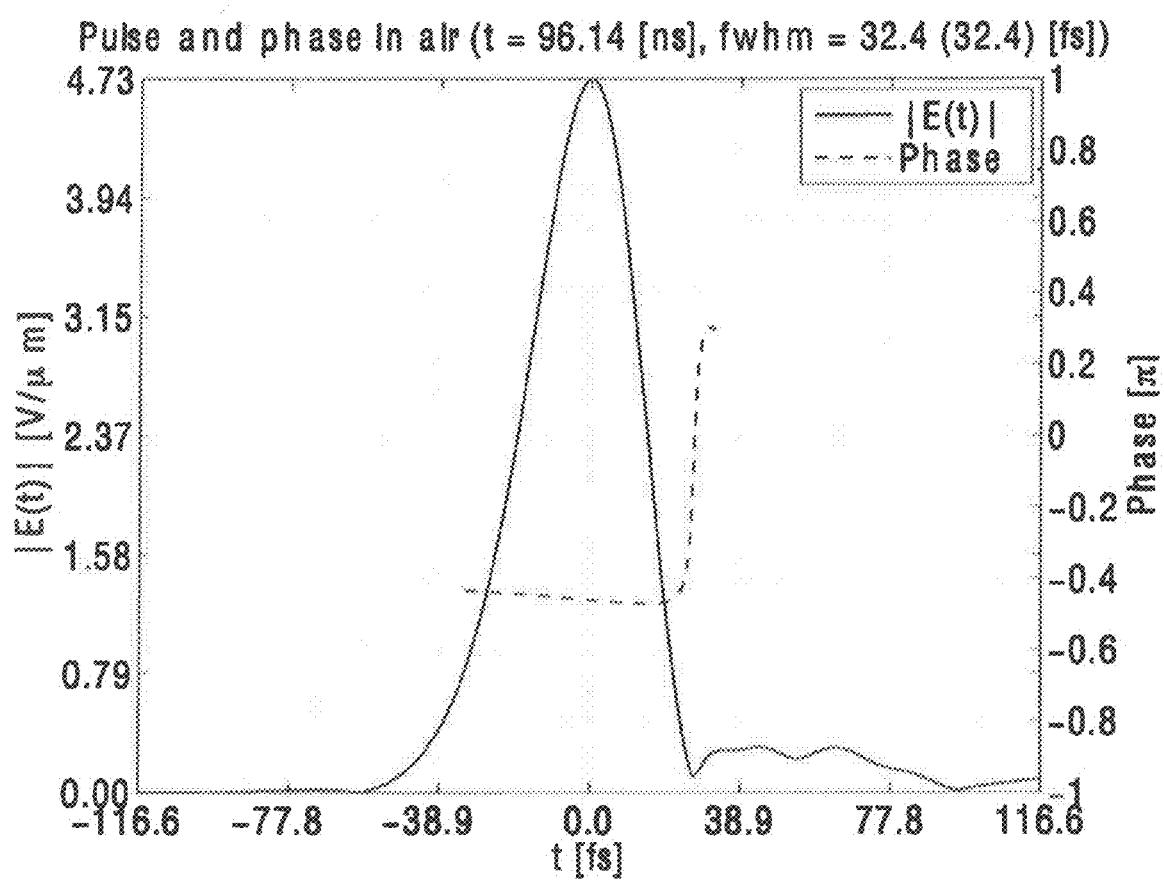
FIG. 33 includes plots of calculated amplitude and phase distribution of a mode-locked 32.4 fs pulse, produced by an embodiment of the invention, with a substantially constant phase across the duration of the pulse.
Figure 34:
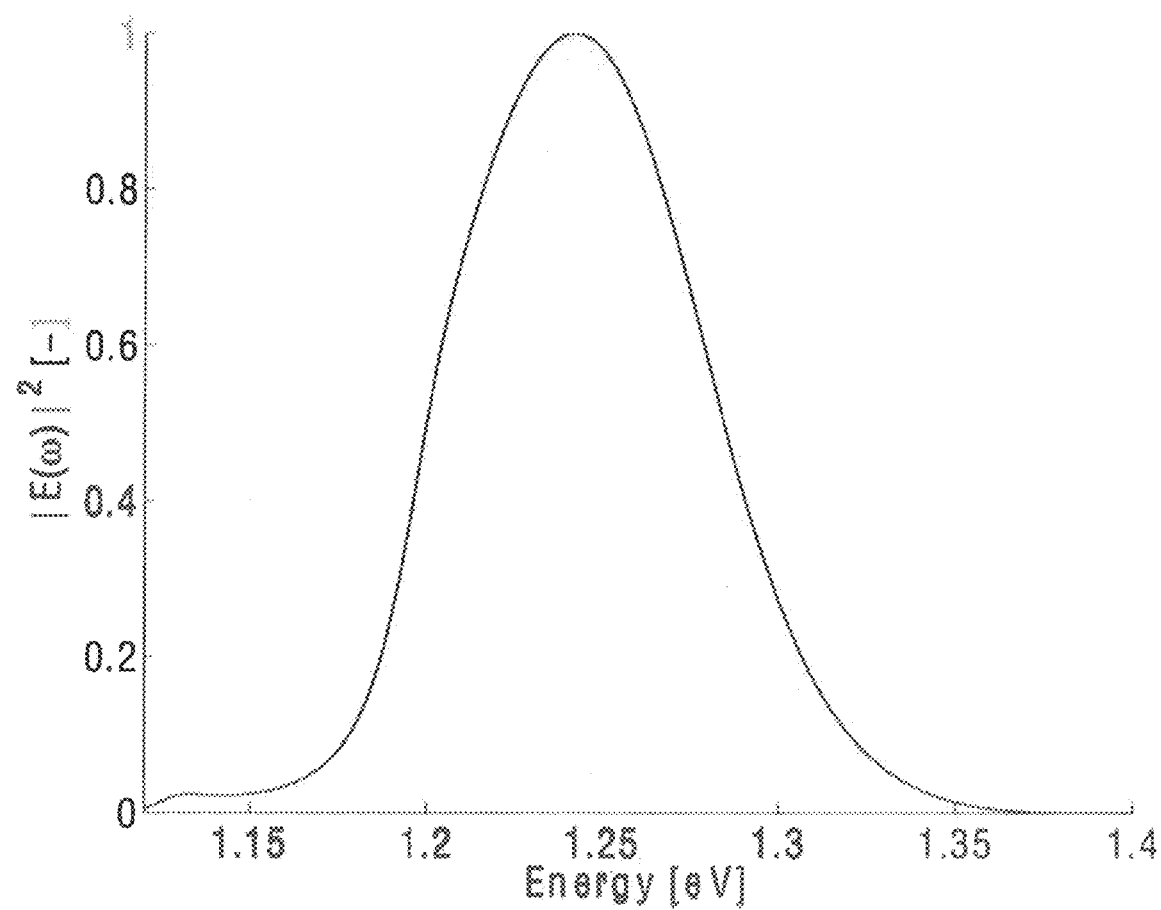
FIG. 34 shows the spectrum of the pulse of FIG. 33, which spectrum extends far beyond the linear net gain bandwidth (line 32.3 of FIG. 32); the shaded region indicates the narrow width of the linear net gain spectrum.

Similar to FIGS. 27-30, FIG. 31 shows a schematic of the identical 10 QW MQW structure as shown in FIG. 27 with QW thicknesses and spacing reduced so as to accommodate more spectral bandwidth for more effective depletion of carriers. FIG. 32 shows a linear gain spectrum for lower inversion (line 32.1) with initial carrier density of $3.0\times10^{16}$ m$^{-2}$ and high SESAM absorption (line 32.2) as well as the net linear gain (line 32.3). FIG. 33 shows a mode-locked 32.4 fs pulse amplitude showing an almost flat phase across the pulse. The resulting pulse is close to bandwidth limited. FIG. 34 shows the pulse spectrum of the final mode-locked pulse shown in FIG. 33. A key difference between the simulation shown in FIGS. 27-30 and the simulation shown in FIGS. 31-34 is that the inversion (pumping) is reduced so as to just exceed the gain (compare line 28.3 in FIG. 28 and line 32.3 in FIG. 32). FIG. 34 shows that the final broadened spectrum greatly exceeds the narrow initial net gain (shown in FIG. 34). The initial net gain bandwidth bears little relationship to the actual broadened spectrum of the 32.4 fs pulse shown in FIGS. 33 and 34.

In each of the two simulations shown in FIGS. 27-34 pulses are generated with mode-locked pulse durations of approximately 24-30 fs, each pulse having a slight correctable or almost nonexistent linear chirp. The net gain picture becomes meaningless and it is noted that the pulse spectrum approaches the full gain bandwidth limit irrespective of the SESAM absorption or cavity outcoupling loss. FIGS. 27-30 provide a dramatic illustration of this statement where conditions for both simulations are identical except for the initial inversion in the QWs of the MQW structure. In FIGS. 27-30 the inversion is $5*10$ m$^{-2}$, whereas in FIGS. 31-34 the inversion is set to $3*10^{-16}$ m$^{-2}$. In the first case, corresponding to strong pumping the gain considerably exceeds the SESAM loss leading to a large and spectrally broad net gain in the system. The final mode-locked pulse has a spectral bandwidth that still exceeds the net linear gain bandwidth as seen earlier although not by a lot. In FIGS. 31-34, the reduced gain leads to a much smaller difference between gain and SESAM absorption resulting in a smaller and much narrower linear net gain spectral bandwidth (line 32.3).

However, the final mode-locked pulse spectrum expands way beyond the limited net gain bandwidth (shaded region in FIG. 34) and almost covers the entire linear gain spectrum. This result emphasizes that this form of mode-locking is truly nonequilibrium by nature and cannot be guided by the usual net gain bandwidth argument. A key observation in FIGS. 31-34 is that the 32.4 fs pulse spectrum FIG. 33 replicates the shape of the full linear gain spectrum (line 32.1 in FIG. 32) indicating that almost all available carriers are being used independently of SESAM and outcoupling mirror losses (see example below in FIGS. 35-36). This is the case being illustrated in FIGS. 4A and 4B above. Also in this weakly nonlinear operating regime, the phase across the pulse in FIG. 33 is almost flat indicating essentially no chirp and a close to bandwidth limited pulse. In FIGS. 27-30, at much higher initial inversion (and linear gain relative to a fixed absorption), the pulse spectrum likewise extends across the full accessible gain bandwidth but is now strongly distorted.

Practical Implementation of Specific Lasing Structures, Solutions for Growth-Caused Dislocations, and Gain Increase While the change of a conventional RPG-based gain structure to a judiciously configured MQW-based gain structure, discussed above, allows the user to overcome the problem of strong chirping of pulses and to drive a nonlinear phase transition to engage most of the carriers defined within the full gain spectrum so as to repeatably achieve the sought-after ultra-short pulse operation of the resulting VECSEL, the "spreading apart" of individual constituent QWs of a given MQW unit effectively amounts to offset of at least some of such constituent QWs with respect to a peak of the gain curve form the given MQW unit and, therefore, to a reduction of gain available for operation of such MQW unit.

At the same time, it has been empirically discovered that, during the process of growth of the cumulative MQW structure of embodiments of the invention under certain conditions, excess strain and/or stress is being built into the structure being formed, causing the origination of defects, in the resulting laser structure, which acted as sites where the excited carriers (the electron-hole pairs in the gain medium) recombine non-radiatively. This, in practice, led to reduction or even absence of lasing. Alternatively or in addition, such non-radiative recombination also led to very strong heat generation with a potential detrimental outcome of local damage to the resulting semiconductor structure and/or prevention of lasing operation in a desired short-pulse regime.

These two shortcomings—the potential reduction of gain and the formation of dislocation upon growth—appear to accompany the above-discussed solution for shortening the duration of pulses during the mode-locked operation of the VECSEL structure, and may require separate attention. One aspect of the following investigation begs a question of determining a fashion of optimization of the gain structure such as to reduce—or even prevent—the formation of dislocations upon growing the gain structure, while another addresses the issue of whether it is possible to compensate the observed gain reduction in some shape or form, both without sacrificing the advantages provided by the MQW-based embodiments over those based on the RPG.

The example of the observed stress/strain problems is now illustrated to FIGS. 48, 49, 50, 51A and 51B.

Figure 48:
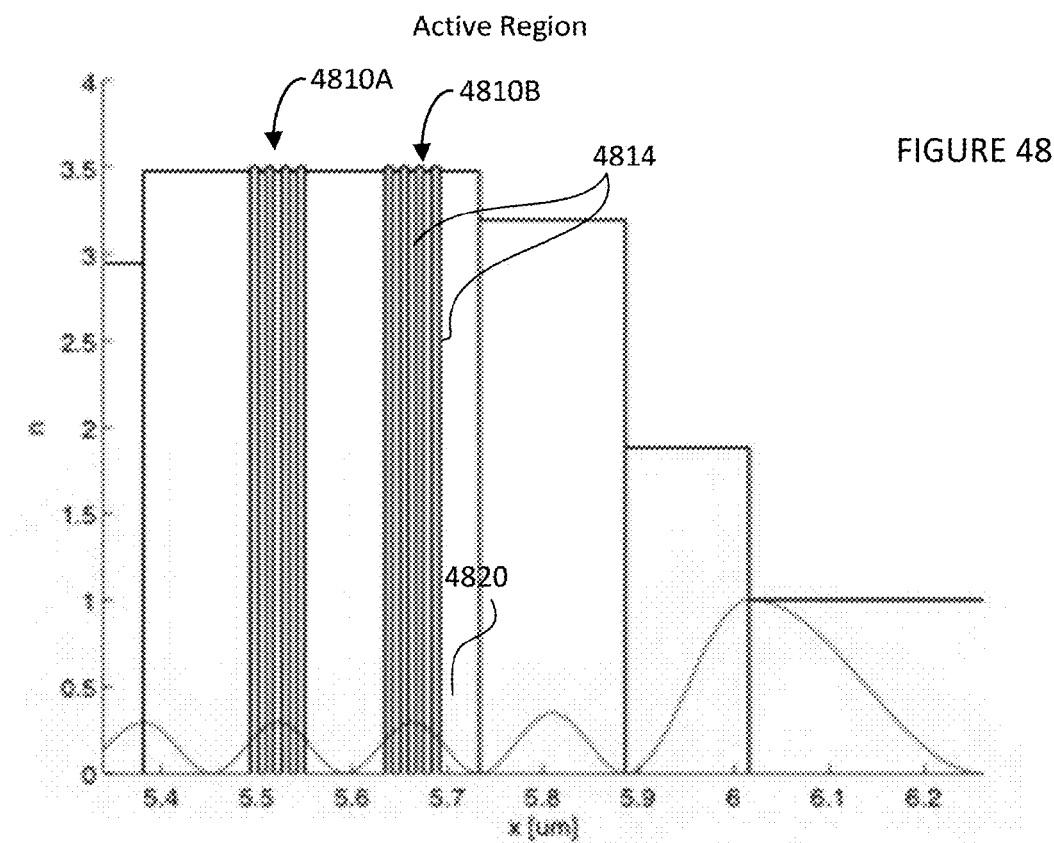
FIG. 48 illustrates a gain region of a VECSEL chip of an embodiment of the invention that utilizes 2 MQWs having 4 QWS each.
Figure 49:
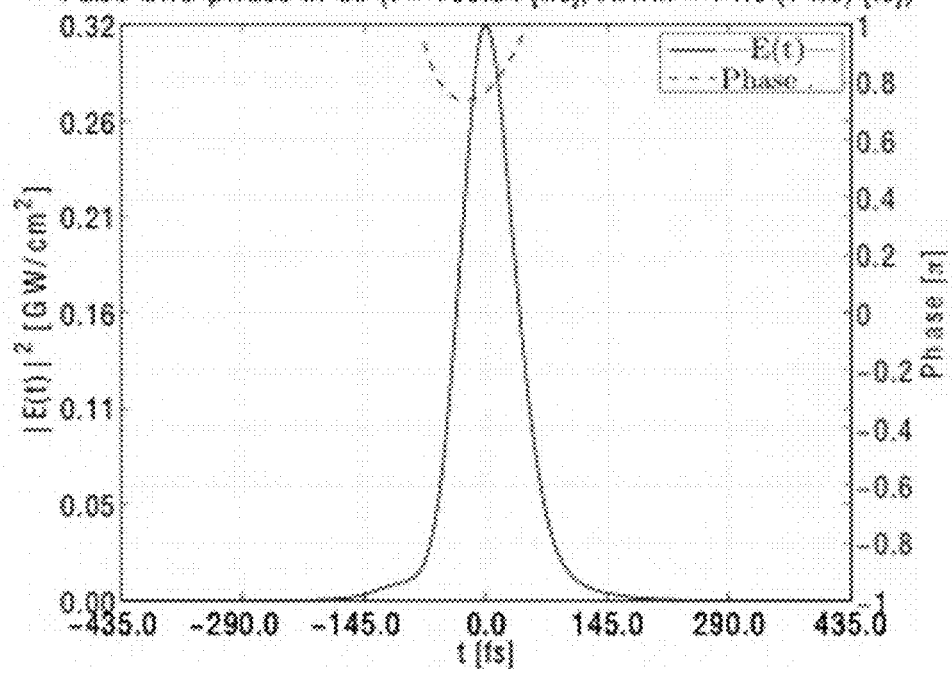
FIG. 49 shows a simulated output pulse of the structure of FIG. 48 in a linear cavity with SESAM and output coupler.
Figure 51A:
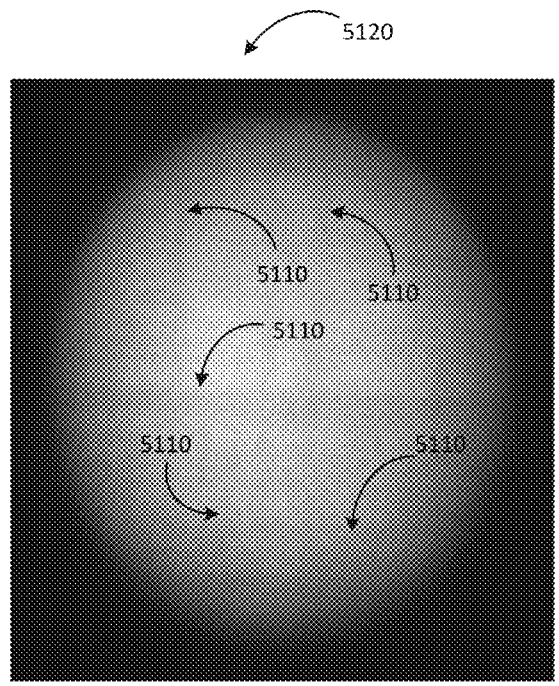
FIG. 51A is an image of photoluminescence produced by the chip grown according to the structure of FIG. 48, showing pronounced dark line dislocations. The illuminated spot is on the order of 400 μm, which is a typical pump spot size.
Figure 51B:
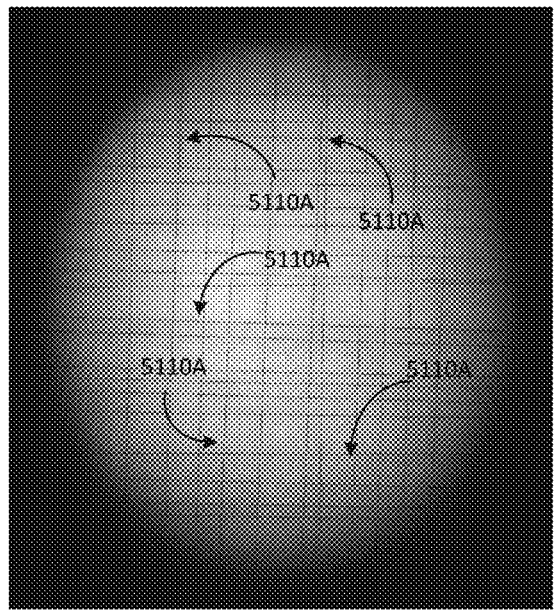
FIG. 51B is an image of FIG. 51A that is enhanced with lines drawn to trave the dislocations of FIG. 51A for better visibility.
Figure 50:
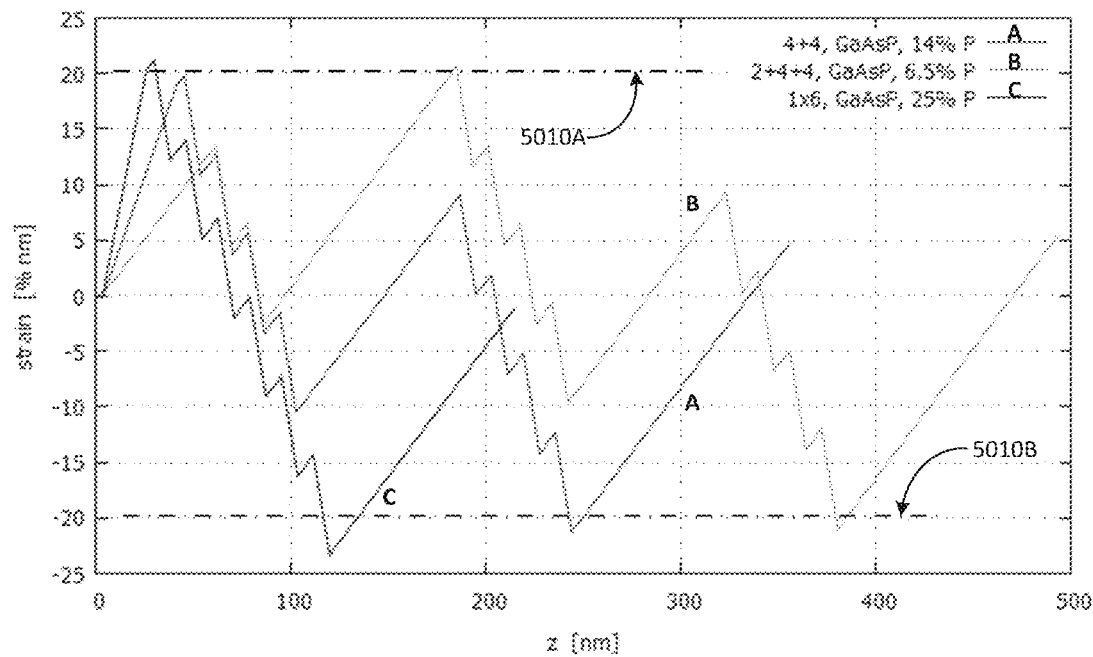
FIG. 50 shows plots illustrating accumulated strain for different gain region designs for the 4+4 QW structure (plot A), a structure with 2+4+4 QWs (plot B), and a 6 QW structure (plot C). The accumulated strain is given in % nm expressing the accumulated strain effect for a structure where the material with thickness (x nm) is strained by (y %) relative to its substrate; % strain=[(lattice constant material a)–(lattice constant material b)]/[average lattice constant].

The schematic of a cross-section of am MQW structure denoted as "MQW44", which had two MQW units 4810A, 4810B each containing four substantially-equidistantly spaced from one another QWs 4814 (and, in practice, each located between two immediately-neighboring nodes of the standing optical wave 4820 formed in the laser cavity utilizing the MQW44 structure), is shown in FIG. 48. FIG. 49 illustrates a simulated laser-pulse output from a 2×4 VECSEL, built with the use of the MQW44 structure in a linear cavity with SESAM and the output coupler, boasting a FWHM pulse width of about 74 fs. The attempt to grow the MQW44 structure (or similar structures) with the InGaAs/GaAsP material system the analysis of which suggested that, in practice, the devices possessed substantial structural material (accumulated) strain, as illustrated in plots of FIG. 50. The presence of accumulated strain/stress was deduced from the extension of at least some of the plots A, B, C outside of the band or area within the +/−20% lines 5010A, 5010B (which are empirically considered in the art to indicate the dislocation-free growth of a semiconductor structure) and suggested the presence of built-up dislocations. A dislocation is known to be a crystallographic defect, or irregularity, within a crystal structure, strongly influencing the properties of materials. (Some types of dislocations are often visualized as being caused by the termination of a plane of atoms in the middle of a crystal. In such a case, the surrounding planes are not straight, but instead they bend around the edge of the terminating plane so that the crystal structure is perfectly ordered on either side.) Image of photoluminescence (PL), produced with such grown structure and illustrated in FIG. 51A, confirmed the empirical findings of dislocations by showing very pronounced dark-line defects 5110, extending as shown vertically and horizontally across the distribution 5120 of light in the image. (In FIG. 51B, which is provided for illustration purposes only, the location of dislocations across the image of FIG. 51B is traced and the dislocations are emphasized and enhanced, for better visibility, with lights 5110A). As shown, the illuminated spot 5120 is on the order of 400 micron FWHM diameter (which is a typical size of a spot of pump-light beam used to pump the VECSEL structures to obtain lasing)

Further embodiments of the invention address this practical problem that may arise during the implementation of growth of the discussed judicially-configured MQW structure(s) and that manifests, under certain circumstances, in excessive formation of dislocations that substantially reduce (if not completely negate) the efficiency of practical lasing of a given laser utilizing so-configured MQW structures. As already mentioned, the implications of excessive dislocations caused by growth of a semiconductor structure containing MQW unit(s) of the invention, include excessive tensile stress or strain and/or compressive stress which, accumulated or built up throughout the gain medium containing MQW unit(s) of the invention, forms defect site(s) where the excited carriers recombine non-radiatively and, therefore, do not contribute to the light amplification process. According to the idea of the invention, such practical problem is solved by structuring or configuring at least one of the MQW units of the invention to contain constituent (at least three per MQW unit) QWs that are intentionally spaced non-equidistantly from one another, as measured along the axis of the gain medium. The employed "non-equidistant" QW-positioning within a given MQW unit can be employed regardless of an overall structure of the gain medium (for example, regardless of and with no connection to a particular number of the MQW units present in the gain medium of a particular VECSEL chip, and/or regardless of and with no connection to a particular structure of the optical window of the VECSEL chip, and/or regardless of and with no connection to how QWs of a given MQW unit may be offset with respect to the node/antinode of the standing wave pattern formed, during the operation along the gain medium chip), as discussed in more detail below.

The proposed practical solution to such strain problem plaguing the process of growth of the MQW structure ensures that the light output from a VECSEL structure utilizing the grown MQW structure is still realizable in a form of ultrashort pulse generation. One embodiment of the solution was rooted in a judicious modification of the the gain part of the VECSEL chip. The solution is characterized by a combination of the following general features: (i) a sufficiently high number of individual QWs of a given MQW unit disposed close to the antinodes of the electrical field distribution (formed along the VECSEL cavity) in order to provide enough gain, while, at the same time, (ii) having individual QWs of the given MQW unit somewhat removed from the antinode position to provide gain for the broad band of different spectral frequencies that are available to support the shortest physically realizable pulse, and (iii) within a given MQW unit, avoiding having more than two QWs sufficiently close to one another in order to prevent excessive strain build-up.

The proposed practical solution to the "reduction of gain", caused by the use of MQWs instead of the conventional RPG, is turning on the idea of maximizing the gain so as to boost the average and peak power of the generated ultrashort mode-locked pulses. The gain can be boosted back close to the level(s) provided by the original RPG-based structure by adding a single, stand alone QW near the DBR mirror. The use of such "gain-booster" QW was unexpectedly found to offset other competing losses (such as outcoupler losses and SESAM saturable losses) within the VECSEL cavity. It is appreciated that the solution to the strain problem and the gain-boosting solution can, in practice, to be used either independently from one another or simultaneously, as the following discussion indicates.

Example XII

Figure 52:
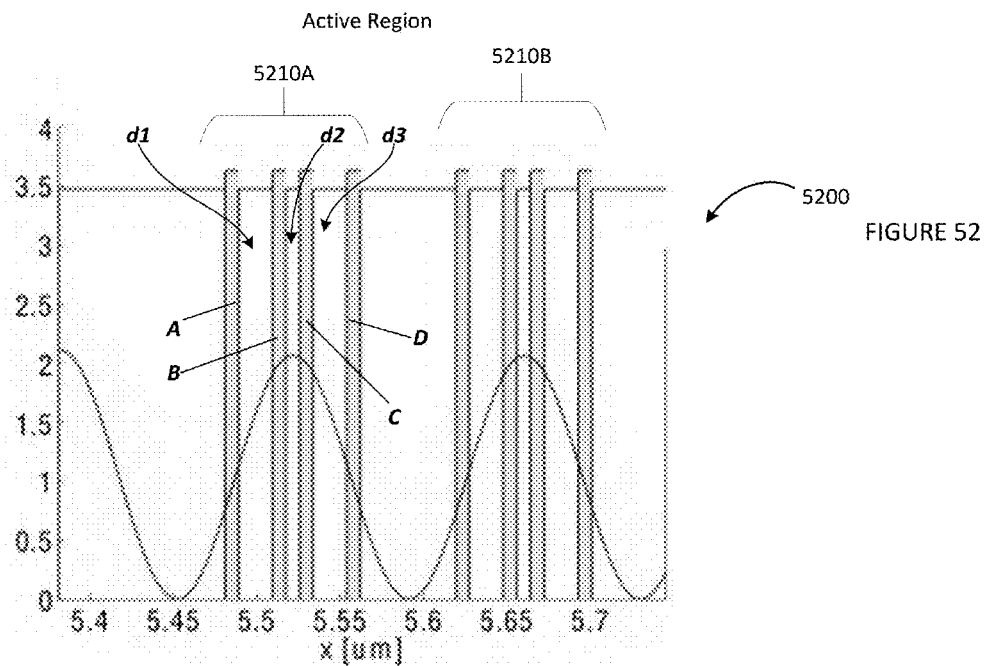
FIG. 52 is a schematic diagram of a VECSEL gain region configured according to a "121-121" embodiment of MQW units.

One implementation, referred to herein as "121-121" or "2×121" for simplicity, has 8 (eight) QWs organized in two MQW units 5210A, 5210B, as shown schematically in FIG. 52. In each of these 4-QW MQW units 5210A, 5210B, the two peripheral QWs (marked as A and D) at the wings of the corresponding MQW unit are spaced from the immediately neighboring QW of the unit by spacing(s)/barrier layers that are different from the (spacing/barrier layer) separating the two centrally-located QWs B and C: $d_1 \neq d_2$, $d_3 \neq d_2$. In other words, the constituent QWs of a given MQW unit are spaced non-equidistantly with respect to one another.

The term "non-equidistant spacing" or a similar term, unless defined otherwise, is generally intended to denote and refer to the situation when the barrier layers or barriers separating neighboring constituent QWs of a given MQW unit have unequal thicknesses (in this specific case, thicknesses $d_1$, $d_2$, $d_3$ related to one another as $d_1 \neq d_2$, $d_3 \neq d_2$).

It was empirically found that, in one specific case, in a MQW of the "121-121" type structure the barrier spacing $d_2$ between the middle QWs B, C could be on the order of one QW thickness (with a thickness of a typical QW between about 8 nm and about 12 nm). The barrier spacing(s) $d_1$, $d_3$, on the other hand, could be sufficiently large to avoid promoting dislocations due to strain, for example on the order of 2× to 10× an individual QW thickness. Generally, the spacing(s) need(s) to be optimized to accommodate a combination of competing processes: 1) to promote amplification of as broad a span of possible of wavelengths about the central wavelength so as to produce the shortest possible time duration pulse (moving the QWs away from the field anti-node reduces the gain) and 2) to retain enough gain across this broad band of wavelengths so as to overcome all losses in the cavity. The latter include saturable and unsaturable losses in the SESAM and various unsaturable losses including output coupling losses, or example. The example of the "121-121" gain structure provides a reduction to formation of dislocations upon gain-structure growth.

Figure 53:
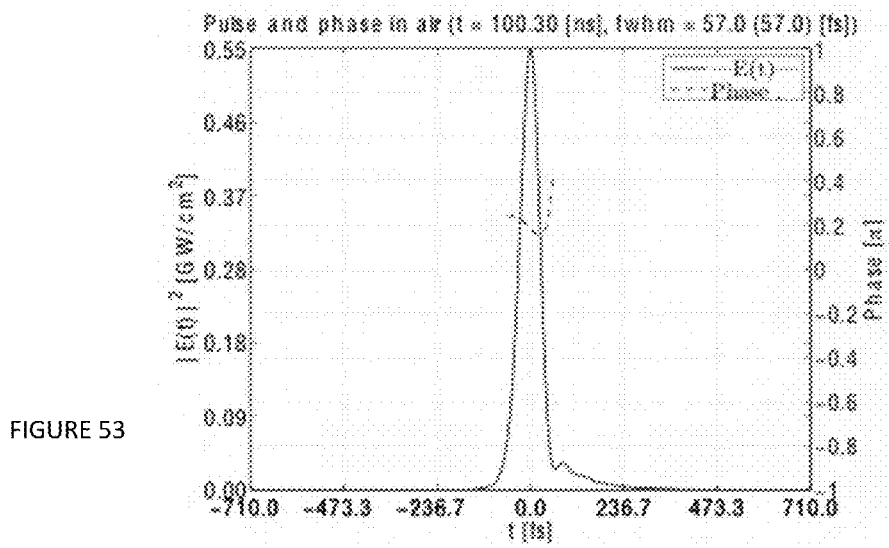
FIG. 53 shows a simulated output pulse produced by the chip utilizing the MQW structure of FIG. 52 in a linear cavity with SESAM and output coupler.

FIG. 53 shows a simulated output pulse produced by the chip utilizing the MQW structure of FIG. 52 in a linear cavity with SESAM and output coupler.

Example XIII

Figure 54:
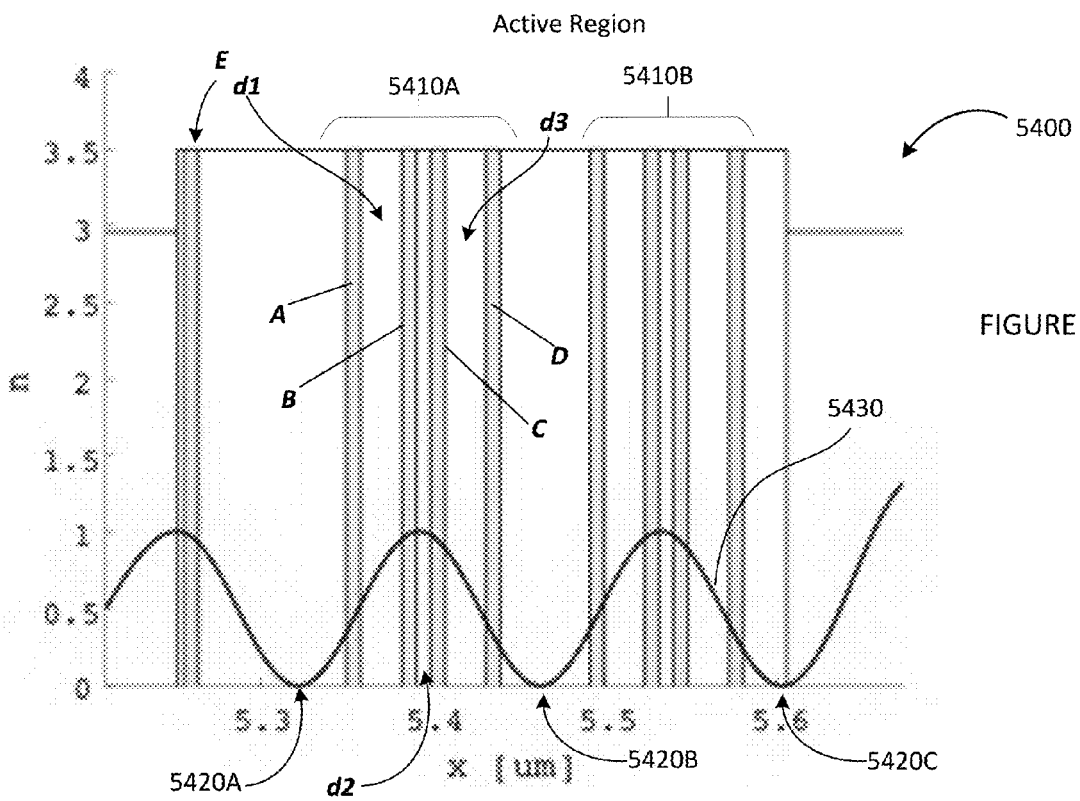
FIG. 54 is a diagram of a VECSEL gain region configured according to a "1-121-121" embodiment of MQW units.
Figure 55:
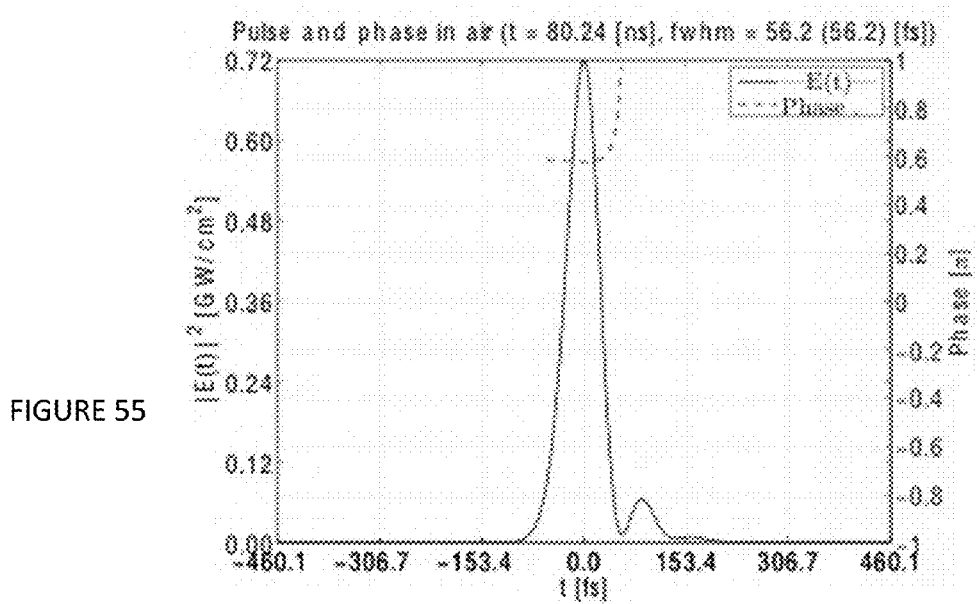
FIG. 55 shows a simulated output pulse of the chip utilizing the MQW structure of FIG. 54 in a linear cavity with SESAM and output coupler.
Figure 57:
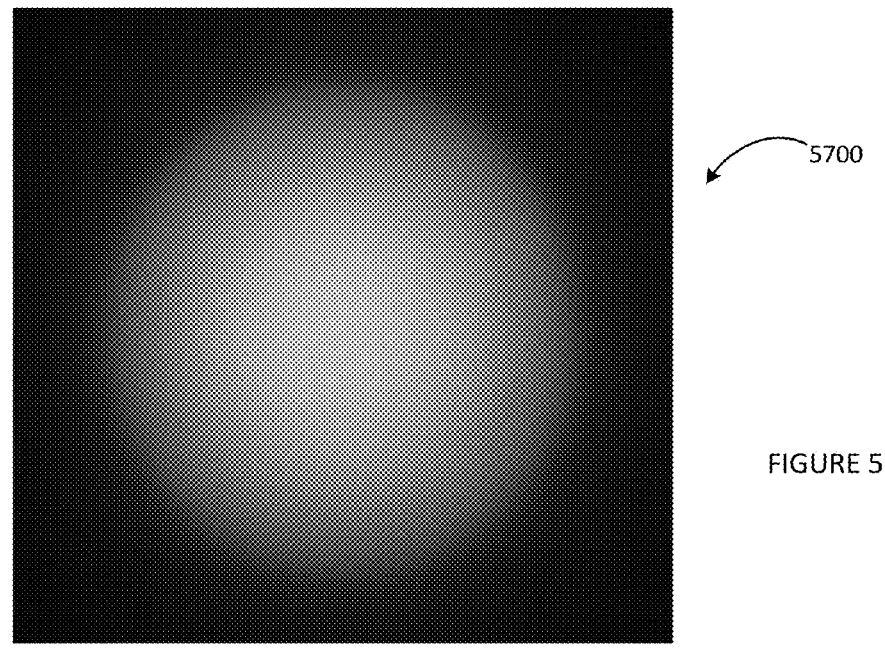
FIG. 57 is a photoluminescence image of the MQW "1-121-121" chip of FIG. 54 evidencing the absence of dark line dislocations, in contradistinction with that of FIG. 51. The illuminated spot is on the order of 400 μm, which is a typical pump spot size.
Figure 56:
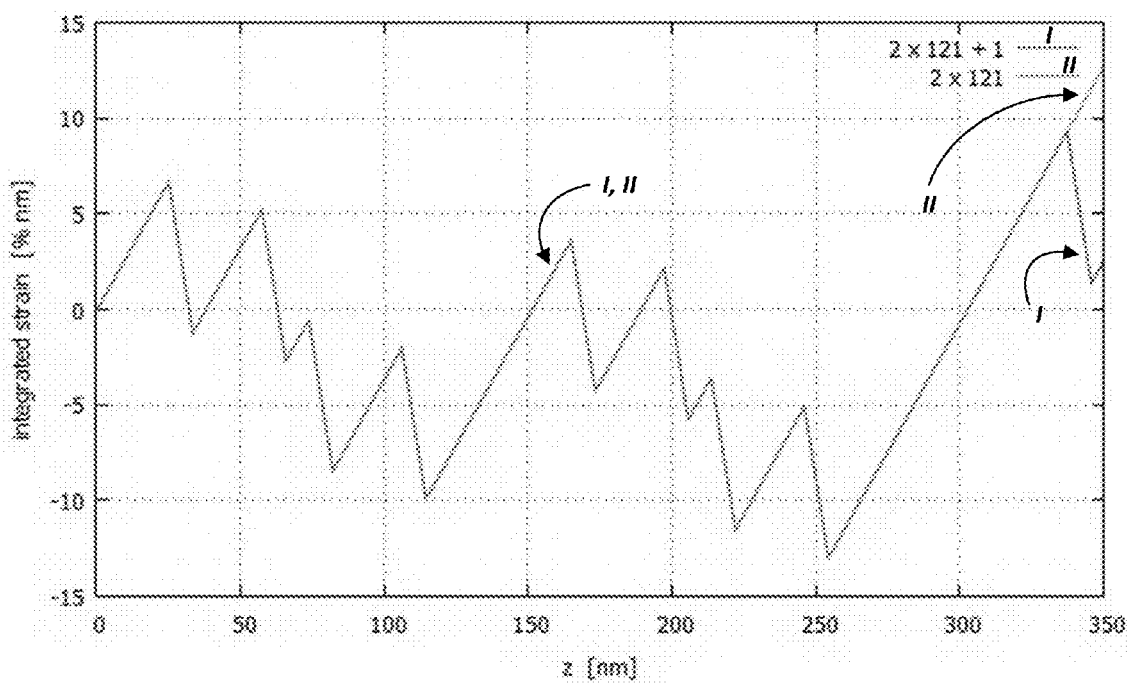
FIG. 56 shows the accumulated strain in gain structures of FIGS. 52 and 54.

A related implementation, referred to as "1-121-121" or "1+2×121" design and shown in FIG. 54. Here, the structure 5400 includes 9 individual QWs eight of which are organized into 2 MQW units 5410A, 5410B (each containing 4 individual QWs A, B, C, D, by analogy with the structure of FIG. 52) and an additional, auxiliary QW E of which is inserted close to the DBR (not shown) of the VECSEL structure) in order to improve the gain of the chip without sacrificing the short-pulse generation. The stand-alone QW E is a gain-boosting QW. This implementation (and other implementations structurally similar to this one) provide an answer to simultaneous reduction of growth-related dislocations and increase of gain available to the carriers. Notably, and according to the idea of the invention, the overall VECSEL structure is configured such that each of the MQW units 5410A, 5410B is located, in practice, between the immediately neighboring nodes (5420A, 5420B) and (5420B, 5420C) of the standing electrical field 5430 formed along the VECSEL structure. Notably, and according to the idea of the invention, in each of the MQWs units 5410A, 5410B of the "1-121-121" design the individual QWs A, B, C, and D are spaced non-equidistantly. FIG. 55 shows a simulated output pulse of the chip utilizing the MQW structure of FIG. 54 in a linear cavity with SESAM and output coupler FIG. 56 illustrates the plots of accumulated strain for the newly designed VECSEL chip with the "121-121" arrangement of the individual QWs (line II) and the "1-121-121" arrangement (line I). As determined, the integrated strain shown by lines I, II remains well within the region of +/−20%, which corresponds to growth without excessive formation of dislocations. An image 5700 (of FIG. 57), produced with the use of photoluminescence captured from MQW "1-121-121" containing chip, showed the absence of dark line dislocations. The illuminated spot was on the order of 400 μm, which was a typical pump spot size.

In order to yet further increase the net roundtrip gain, the structures similar to those of FIGS. 52, 54 were also implemented with the increased number of repeats of the "121" MQW-unit arrangements (such as, for example, a structure containing 3 corresponding "121" MQW units—a "3×121+1" structure; or a structure containing four (4) corresponding "121" MQW units—a "4×121+1" structure; and so on). In each of such designs, containing at least two MQWs with non-equidistantly spaced individual QWs the image of PL evidenced substantial lack of growth dislocations that was attributed to intentionally-non-equidistant coordination among the individual QWs of such MQW units. Some of such auxiliary implementations are further described below in Examples XIV through XVII, the overall structures of which are summaries in Tables 2 and 3.

TABLE 2

Layer overview (thicknesses in nm)

| Layers | Example XIV | Example XV | Example XVI | Example XVII |
|---|---|---|---|---|
| Barrier (on signal DBR side) | 4.00 | 4.00 | 4.00 | 4.00 |
| QW | 8.35 | 8.35 | 8.35 | 8.35 |
| Barrier | 83.00 | 83.00 | 83.00 | 97.30 |
| QW | 8.35 | 8.35 | 8.35 | 8.35 |
| Barrier | 24.00 | | 24.00 | 24.00 |
| QW | 8.35 | | 8.35 | 8.35 |
| Barrier | 8.00 | 40.35 | 8.00 | 8.00 |
| QW | 8.35 | 8.35 | 8.35 | 8.35 |
| Barrier | 24.00 | 24.00 | 82.85 | 68.55 |
| QW | 8.35 | 8.35 | | |
| Barrier | 50.50 | 50.50 | | |
| QW | 8.35 | 8.35 | 8.35 | 8.35 |
| Barrier | 24.00 | 24.00 | 24.00 | 24.00 |
| QW | 8.35 | 8.35 | 8.35 | 8.35 |
| Barrier | 8.00 | 8.00 | 8.00 | 8.00 |
| QW | 8.35 | 8.35 | 8.35 | 8.35 |
| Barrier | 24.00 | 24.00 | 24.00 | 24.00 |
| QW | 8.35 | 8.35 | 8.35 | 8.35 |
| Barrier (on the air side) | 25.10 | 25.10 | 25.10 | 25.10 |
| Total length= | 349.75 | 349.75 | 349.75 | 349.75 |

TABLE 3

Barrier Layer thickness(es) and Other Geometry in units of a QW thickness

| Layers | Example XIV | Example XV | Example XVI | Example XVII |
|---|---|---|---|---|
| Barrier (on signal DBR side) | 0.48 | 0.48 | 0.48 | 0.48 |
| QW | 1.00 | 1.00 | 1.00 | 1.00 |
| Barrier | 9.94 | 9.94 | 9.94 | 11.65 |
| QW | 1.00 | 1.00 | 1.00 | 1.00 |
| Barrier | 2.87 | | 2.87 | 2.87 |
| QW | 1.00 | | 1.00 | 1.00 |
| Barrier | 0.96 | 4.83 | 0.96 | 0.96 |
| QW | 1.00 | 1.00 | 1.00 | 1.00 |
| Barrier | 2.87 | 2.87 | 9.92 | 8.21 |
| QW | 1.00 | 1.00 | | |
| Barrier | 6.05 | 6.05 | | |
| QW | 1.00 | 1.00 | 1.00 | 1.00 |
| Barrier | 2.87 | 2.87 | 2.87 | 2.87 |
| QW | 1.00 | 1.00 | 1.00 | 1.00 |
| Barrier | 0.96 | 0.96 | 0.96 | 0.96 |
| QW | 1.00 | 1.00 | 1.00 | 1.00 |
| Barrier | 2.87 | 2.87 | 2.87 | 2.87 |
| QW | 1.00 | 1.00 | 1.00 | 1.00 |
| Barrier (on the air side) | 3.01 | 3.01 | 3.01 | 3.01 |
| Total length= | 41.89 | 41.89 | 41.89 | 41.89 |

Example XIV

Figure 58:
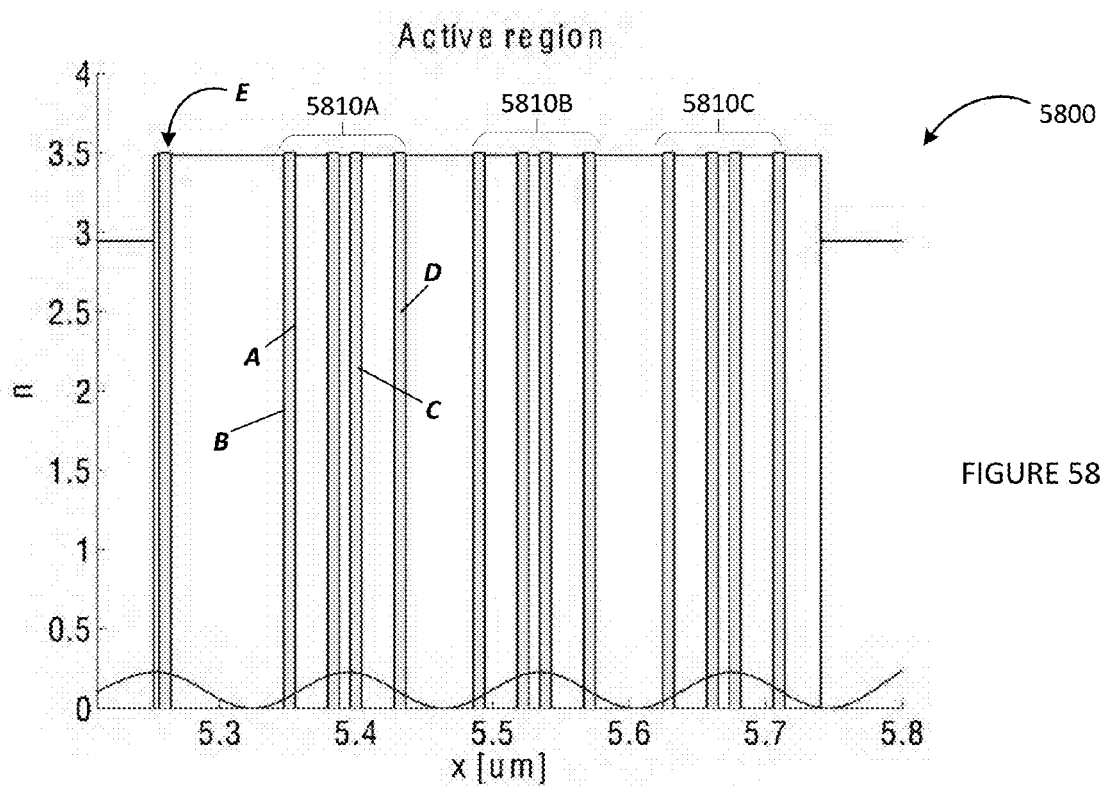
FIG. 58 is a diagram of a VECSEL gain region configured according to a "1-121-121-121" embodiment of MQW units.
Figure 59:
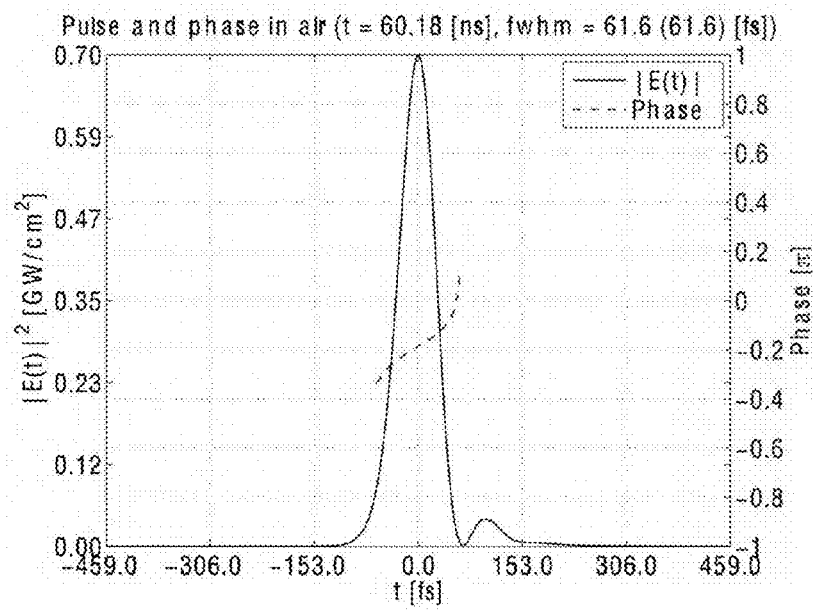
FIG. 59 shows a simulated output pulse of the chip utilizing the MQW structure of FIG. 58 in a linear cavity with SESAM and output coupler.

In this MQW structure 5800, referred to as "1+3×121" or "1-121-121-121" and schematically shown in FIG. 58, the two-MQW-unit gain structure of FIG. 54 (with each of the MQWs containing non-equidistantly-spaced 4 individual QWs) was expanded with a third equivalently-configured MQW unit. As a result, the structure 5800 includes three identical, equal to one another MQW units 5810A, 5810B, 5810C (each positioned around a corresponding antinode of the standing electrical field formed during the operation of the VECSEL employing the structure 5800, and each having the non-equidistantly-grown QWs A, B, C, and D formed as discussed in reference to FIG. 54) and a an additional stand-alone, single, "gain-boosting" QW E at the side of the signal DBR. A shape (with a FWHM width of 61.6 fs) and phase of the corresponding pulse, calculated to be generated during the operation of the VECSEL structure is illustrated in FIG. 59. This implementation (and other implementations structurally similar to this one) provide an answer to simultaneous reduction of growth-related dislocations and increase of gain available to the carriers.

Example XV

Figure 60:
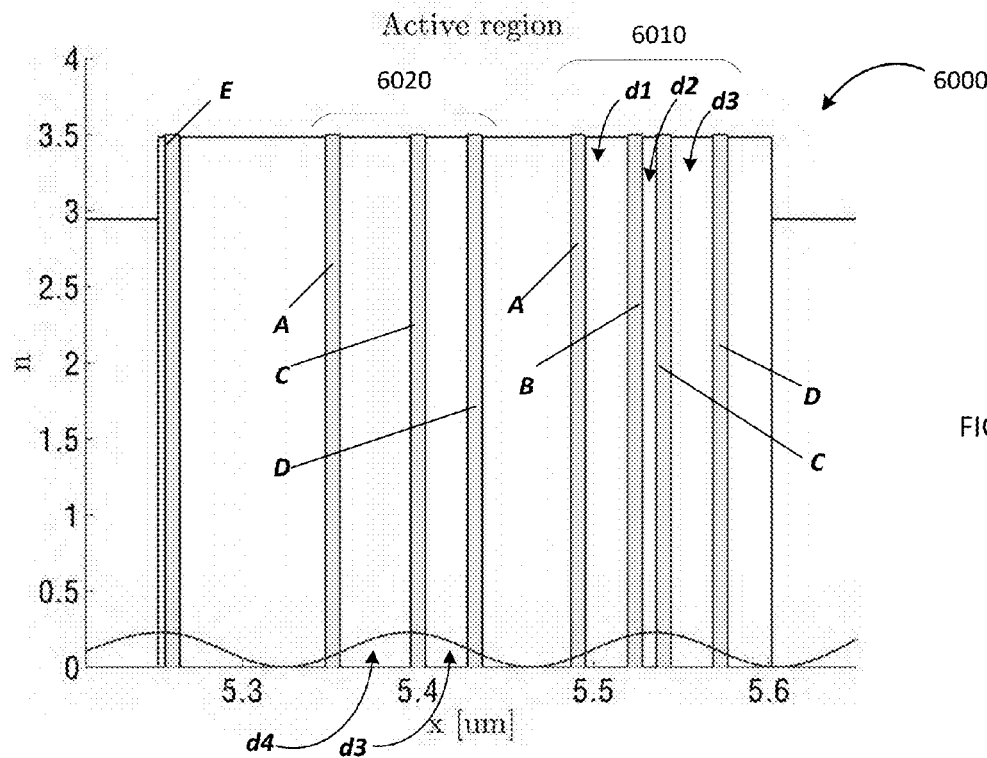
FIGS. 60 and 61 illustrate, respectively, the gain portion of the VECSEL structure and the calculated mode-locked pulse parameters of an embodiment the symmetry of the gain structure of which is "broken" or modified as compared to that of the embodiment of FIG. 54.
Figure 61:
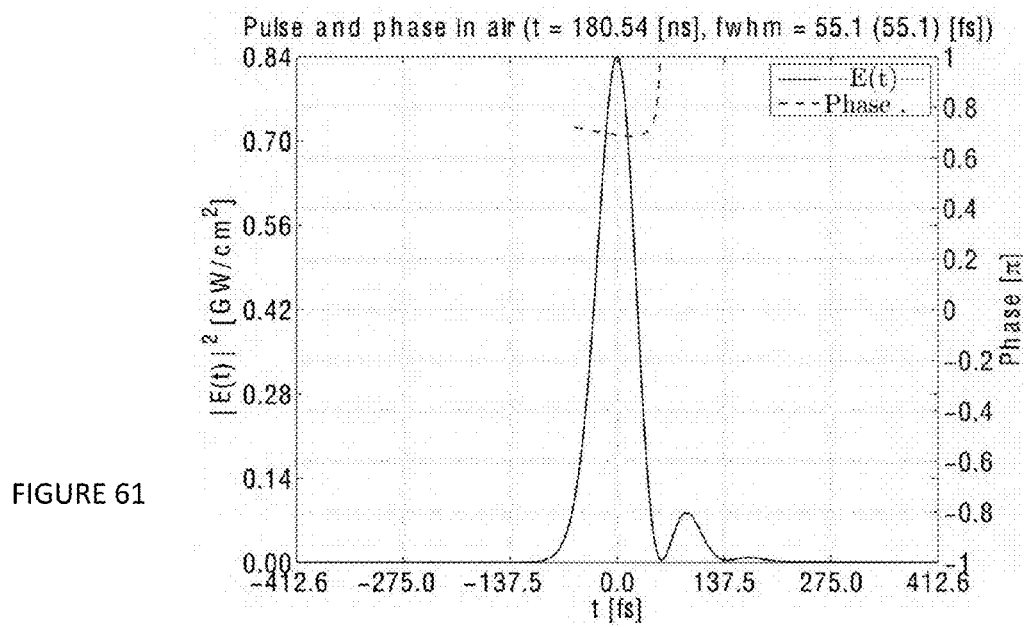

Notably, non-equidistantly-spaced-QW MQW units of the invention do not have to have symmetric structure or be structured identically to avoid the formation of dislocations causing loss of efficiency of lasing of VECSEL structured employing such MQW units. FIGS. 60 and 61 illustrate, respectively, the gain portion of the VECSEL structure and the calculated mode-locked pulse parameters (with a FWHM of 55.1 fs) of an embodiment the symmetry of which is "broken" as compared to that of the embodiment of a MQW unit of the embodiment 5400. Here, the gain structure 6000 includes a MQW unit 6010 (configured in a fashion equivalent to that of the MQW unit 5810A, for example), and a MQW unit 6020 having only three non-equidistantly disposed QWs A, C, and D (separated by barriers with unequal thicknesses $d_4$ and $d_3$). This implementation, containing the stand-alone QW E (and other implementations structurally similar to this one) provide an answer to simultaneous reduction of growth-related dislocations and increase of gain available to the carriers.

Example XVI

Figure 62:
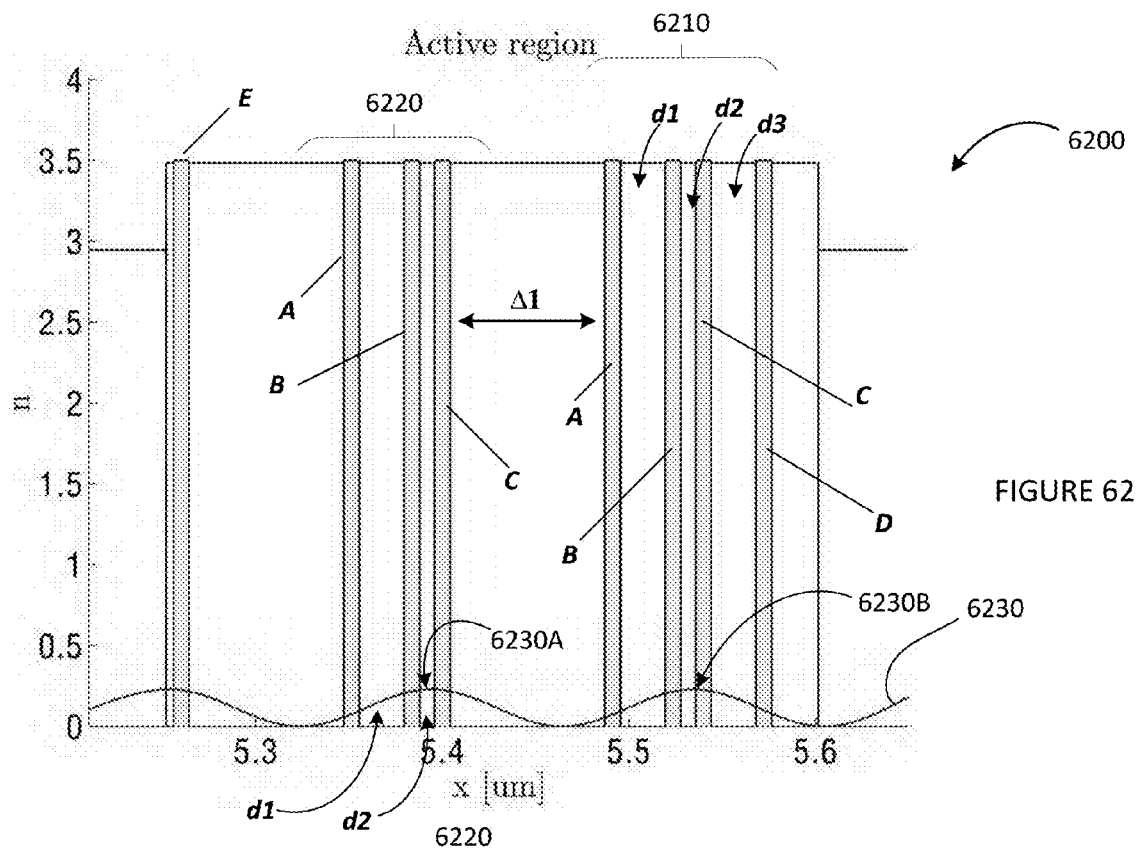
FIGS. 62 and 63 illustrate, respectively, the related embodiment of the gain portion of the VECSEL structure and the calculated mode-locked pulse parameters of an embodiment the symmetry of the gain structure of which is modified as compared to that of the embodiment of FIG. 54.
Figure 63:
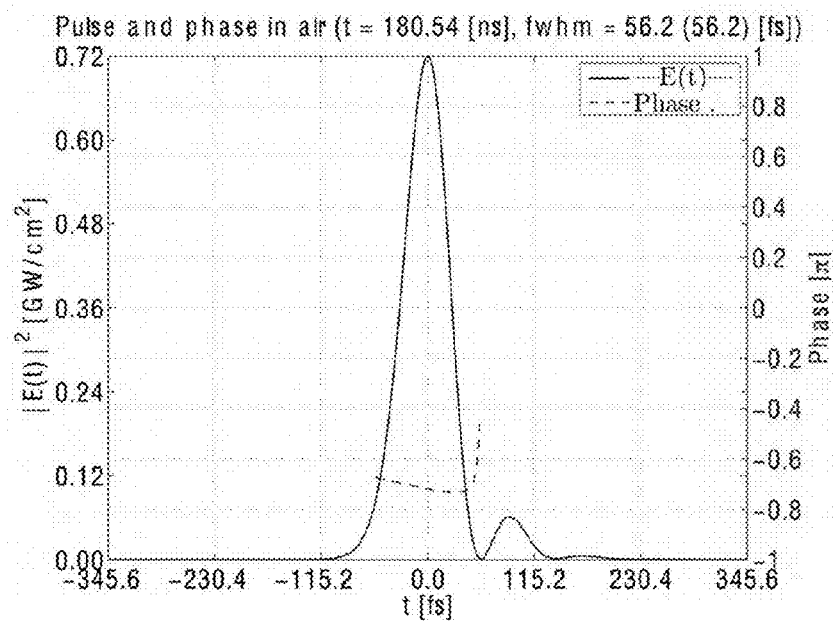

In this example, in comparison with the example of FIG. 54, while first MQW unit 6210 of the two MQWs of FIG. 62 is configured identically to the MQWs 6010 and 5410B (with individual QWs A, B, C, and D that are non-equidistantly-spaced as discussed above), the second MQW 6220 includes only the individual QWs A, B, and C separated by barriers with unequal thicknesses of d, and dz. The corresponding pulse parameters are shown in FIG. 63. This implementation (and other implementations structurally similar to this one) provide an answer to simultaneous reduction of growth-related dislocations and increase of gain available to the carriers.

Example XVII

Figure 64:
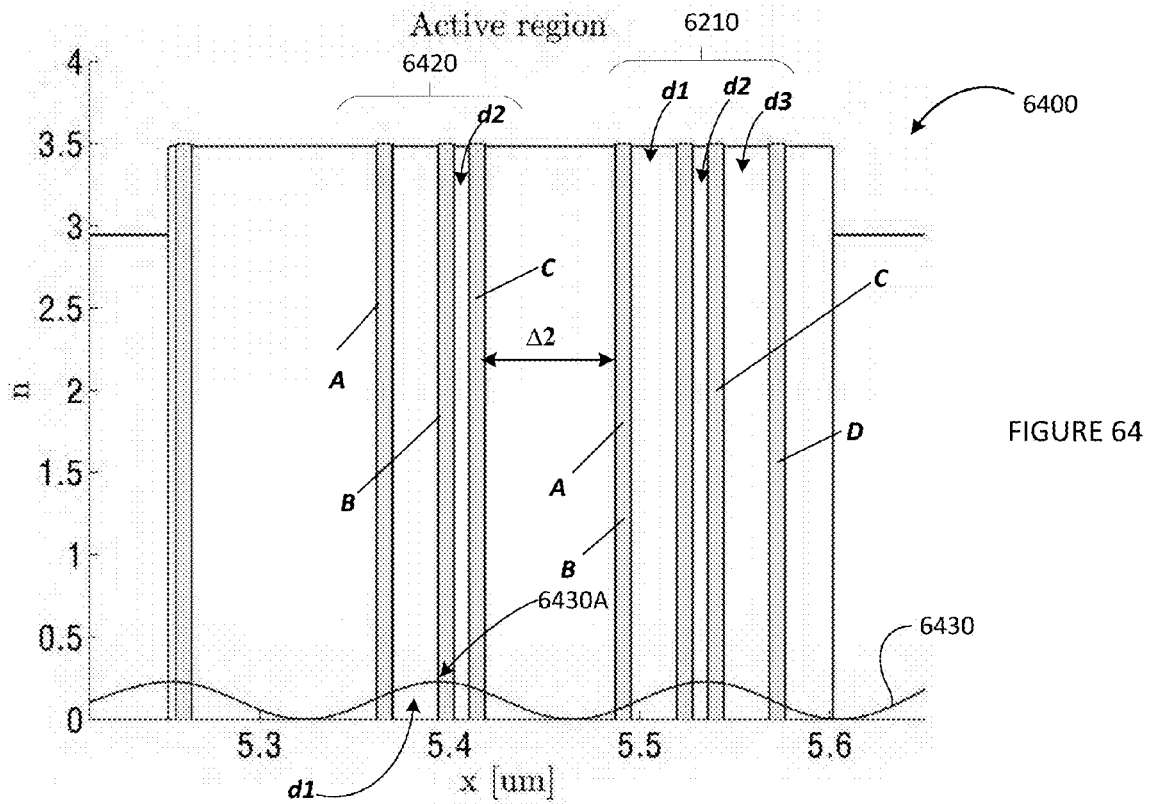
FIGS. 64 and 65 illustrate, respectively, yet another related embodiment of the gain portion of the VECSEL structure and the calculated mode-locked pulse parameters of an embodiment the symmetry of the gain structure of which is modified as compared to that of the embodiment of FIG. 54.
Figure 65:
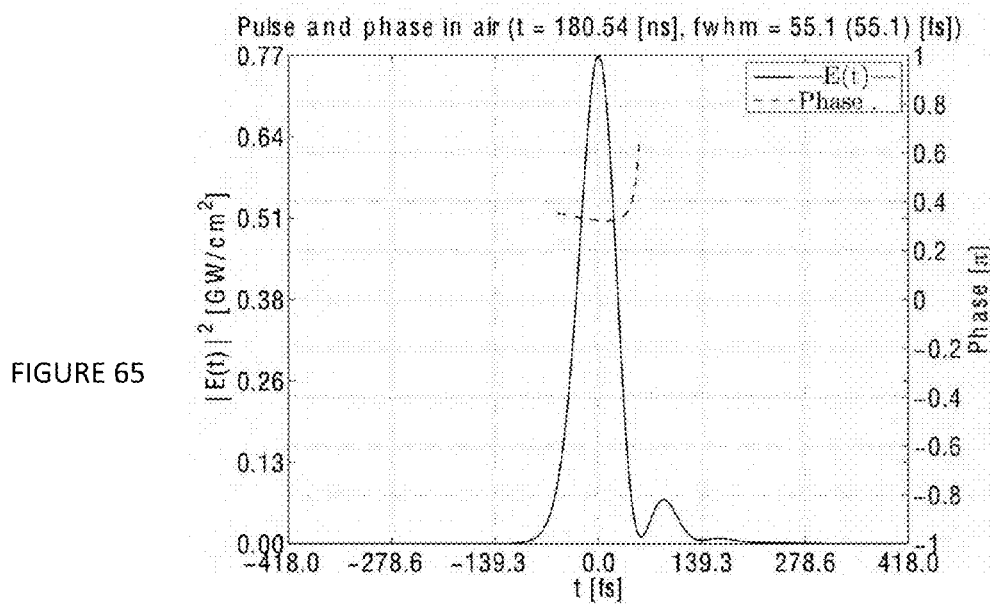

Provides yet another related illustration to the structure-variational stability of the proposed non-equidistantly-spaced-QW solution to the problem of growth-cause dislocations of the VECSEL structure of the invention. Here, while the gain structure 6400 of FIG. 64 is shown to contain MQW units 6210 and 6420 (where the MQW 6420 is structurally identical to the MQW unit 6220), the MQW 6420 as a whole is configured to be separated from the MQW 6210 by a barrier with a thickness $\Delta 2$ that is different from and smaller than a thickness $\Delta 1$ of the barrier separating the corresponding MQW units in the structure 6200. Specifically, the MQW unit 6420 as a whole is disposed such that, in operation, its center of gravity is closer to the corresponding antinode 6430A of the electrical field distribution 6430 in comparison to that of the MQW unit 6220 with respect to the antinode 6230A of the electrical field distribution 6230 of FIG. 62. While such disposition leads to even more asymmetry of the overall gain structure, the resulting mode-locked regime of operation of the corresponding VECSEL was calculated to remain a 'ultra-short pulse" operation with the FWHM of a pulse to be 55.1 fs (see FIG. 65).

Despite multiple variations introduced both in the spatial symmetry and QW-content of at least one of the MQW units of the gain structure of the invention, each of the structures 5200, 5400, 5800, 6000, 6200, and 6400 (of FIGS. 52, 54, 58, 60, 62, and 64, respectively) proved to produce a mode-locked ultra-short pulse operation with a pulse width or duration that is barely changed from case to case. This is the evidence that the proposed "non-equidistant-QW" solution to the practical, empirically observed problem of the growth dislocations limiting the lasing operation of the VECSELs, is stable, operationally robust, and repeatable. It is readily appreciated by a skilled artisan that as far as design is concerned, when a certain individual QW is "removed" from a given MQW unit the total gain is somewhat reduced, so to compensate for this the number of carriers in the remaining QWs has to be adjusted accordingly in order to ensure that the gain from the structure is approximately the same in all cases.

It should be understood that neither the scope of the invention nor the efficiency of the solution to the problem of dislocations stated above are affected by a particular distribution of the individual non-equidistantly spaced QWs in a given MQW unit and/or by the sequence in which different MQW units (whether having the same of different individual QW content) are formed along the axis of the gains structure. For example, and in reference to FIG. 60 and embodiment 6000, the principle of operation and the scope of the invention is not affected if the locations of MQWs 6010 and 6020 are interchanged. Neither is the scope of the invention changed if the QW-content of any of the MQW units 6010 and 6020 changed (for example, if the MQW unit 6010 is configured to have five or more individual non-equidistantly-spaced QWs instead of four as in the example of FIG. 60, or if, for instance, the MQW unit 6020 is modified to include QWs A, B, and D instead of its current content of QWs A, C, and D). To provide another non-limiting illustration, and now in reference to FIG. 58, the scope of the invention does not change if the number of the MQW units (each containing at least three non-equidistantly-spaced from one another individual QWs) is increased above three (as currently shown in FIG. 58) and/or any of such MQW units is modified to have its own, unique, not-repeated in another MQW unit content of non-equidistantly spaced QWs. For example, the embodiment 5800 can be modified to have 4 MQW units 5810A, 5810B, 5810C and 5810D (not shown), while the MQW unit 5810A includes the QWs A, B, C, and D as currently shown, the MQW unit 5810B includes QWs A, B, and C, the MQW unit 5810C includes QWs B, C, and D, while the MQW unit 5810D includes 9 (nine) non-equidistantly-space QWs. The same general consideration applies to the embodiments such as that of FIG. 52, which are devoid of the stand-alone QW (such as the QW E of FIGS. 58, 60) located in proximity to the signal DBR reflector.

It is appreciated, therefore, that specific implementations of the gain structure—the ones that include a MQW configured according to an idea of the invention with respect to the immediately-neighboring nodes of the standing wave of the electrical field (present in the laser cavity during its operation) and containing at least three constituent QWs (which may be non-equidistantly spaced)—are characterized by at least two (in the case of three QWs in the MQW unit) or more (in the case the MQW unit includes more than three QWs) barrier layers and at least two or more of corresponding ratios of barrier-thickness-to-constituent-QW-thickness. A first barrier thickness is different from the second barrier thickness when the constituent QWs are spaced substantially non-equidistantly. Generally, the ratio of a thickness of the first barrier layer of the MQW unit to that of the second barrier layer of the MQW unit falls within a range from about 0.01 to about 1; or within a range from about 0.1 to about 1 in a specific implementation, or within a range from about 0.5 to about 1 in another specific implementation. Alternatively or in addition, a first ratio of a barrier-thickness-to-constituent-QW-thickness may be different from a second ratio of a barrier-thickness-to-constituent-QW-thickness when the constituent QWs are spaced substantially non-equidistantly. The difference between these two ratios is generally between about 0.01 and 1 of the first of such ratios, or between 0.1 and 1 of the first of such ratios in a specific case, or between 0.5 and 1 of the first such ratios in a related specific case.

Figure 66:
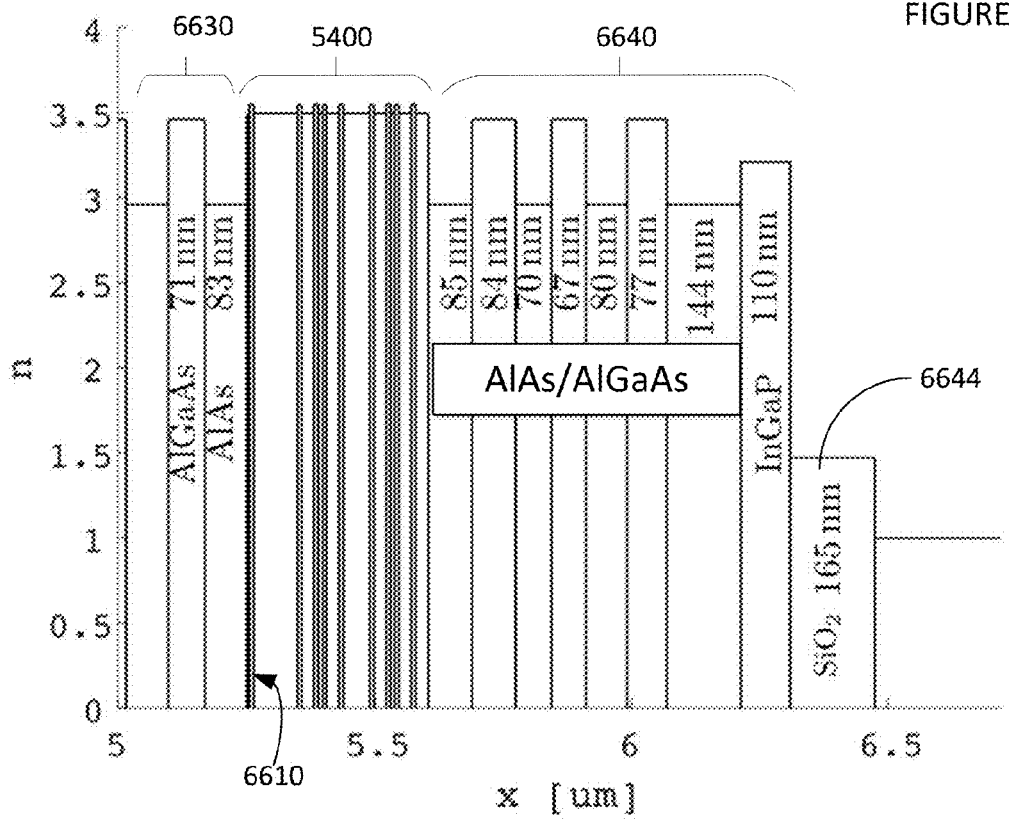
FIG. 66 is a diagram of a VECSEL gain region configured according to a "1-121-121" QW and additionally enhanced with specific auxiliary layers on right hand side of the gain region to provide AR coating configured to flatten and minimize the group delay dispersion that is exhibited by the chip in operation.
Figure 67:
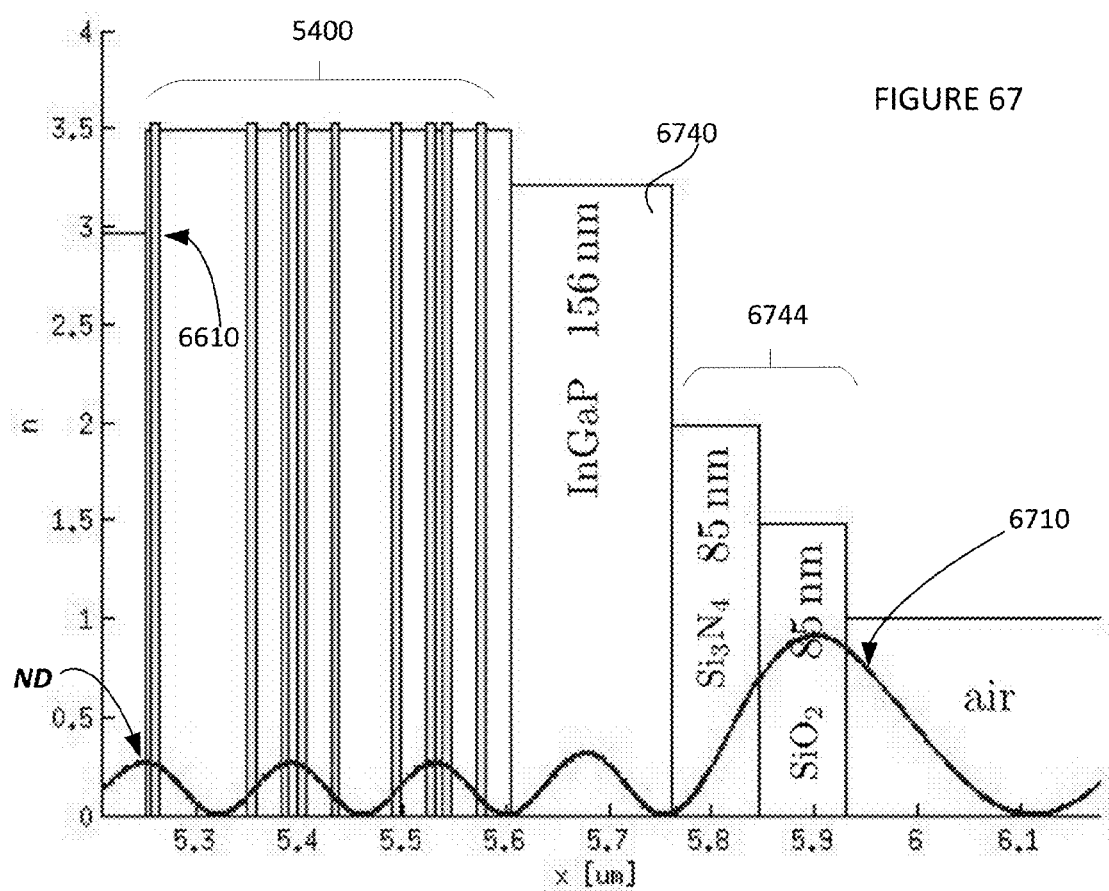
FIG. 67 illustrates a portion of the VECSEL structure of FIG. 66, with alternative capping and AR-layers.

In case of any implementation, and in addition to the strain management, and according to the idea of the invention, the new VECSEL chip designs may contain a series of passive layers in the region between the gain medium and the external interface with air. FIGS. 66, 67 illustrate the "1-121-121" active gain element 5400 of FIG. 54 (which includes a gain-booster QW 6610 next to the node "ND" of the electric field 6710 in the vicinity of the signal DBR 6630 combined with the two MQW units) embedded between a signal DBR 6630 on the left of FIGS. 66, 67 and a series of semiconductor layers 6640 on the right with an added layer 6644 of $SiO_2$; the latter constitute an anti-reflection (AR) coating. The distributed Bragg reflector 6630 is a DBR structure for operation at a signal wavelength, and only a few layers of it are shown in FIG. 66. Indicated in FIG. 66 are also typical layer thicknesses for a laser structure designed to emit at a central wavelength of 980 nm. Typically the DBR 6630, needed to reflect light at such a central wavelength and support reflection of a broad band of nearby wavelengths sufficient to support a very short pulse, will include about 25 AlGaAs/AlAs repeats. Furthermore, an additional, pump DBR structure (not shown in FIG. 66) judiciously configured to back-reflect the external pump light (typically at a wavelength around 800 nm) can be added to the back of the signal DBR 6630 to contain about the same (or slightly smaller) number of alternating layers. Typical but non-limiting layer thicknesses are shown to be about 83 nm for Al layer and about 71 nm for AlGaAs layer.

Another related option for the design of an AR-coating for the embodiment of the invention is a multi-layer dielectric coating optimized to reduce the group delay dispersion (GDD) of the overall laser structure. FIG. 67, for example, shows one implementation 6744 of a $sSi_3N_4/SiO_2$ dielectric coating replacement for the AR coating 6644) of FIG. 66, designed for a central wavelength of operation of 980 nm. Here, the InGaP cap semiconductor layer 6740 that terminates the semiconductor portion 5400 of the gain structure.

Figure 68A:
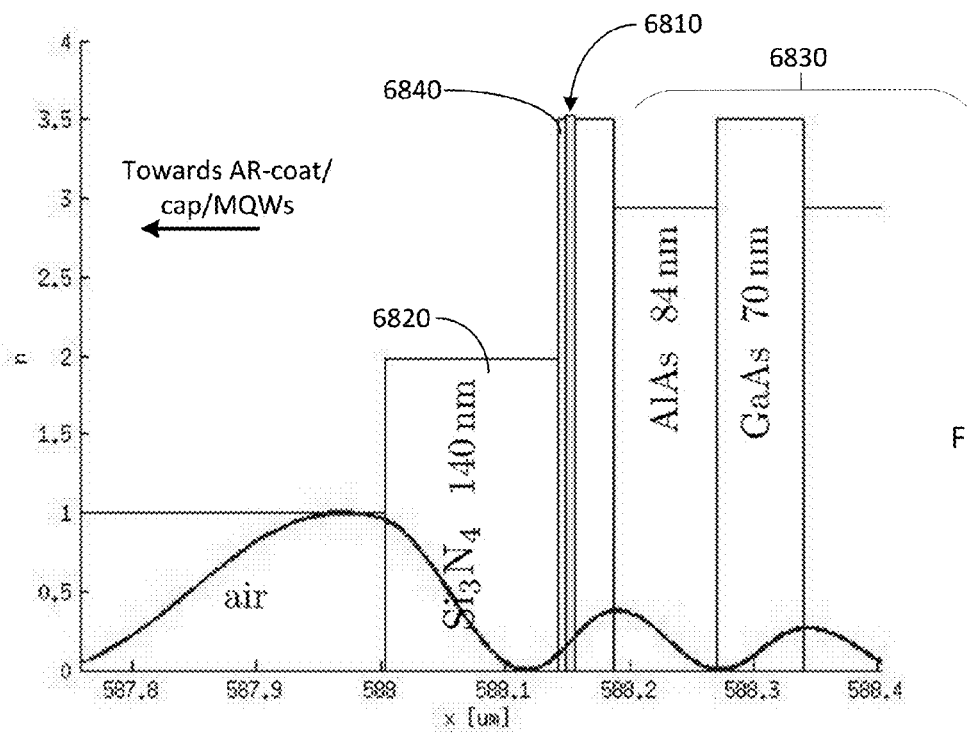
FIGS. 68A, 68B illustrate portions of one SESAM embodiment for use with a VECSEL structure containing MQW units with non-equidistantly-placed-QWs, configured according to an idea of the invention.

As has been already alluded to above, the SESAM can be implemented in addition to the cap and AR-coatings, in the overall laser structure containing the intentionally-non-equidistantly-spaced-QW MQWs of the invention, to minimize the absolute value and to flatten the wavelength dependence of the GDD characterizing the VECSEL/MQW cavity. In one embodiment, a SESAM design 6800 requires a single semiconductor quantum well 6810 grown on a spacer layer 6820 and an appropriate reflector 6830 (such as a DBR), as shown in a specific and non-limiting example of FIGS. 68A, 80B.

Figure 68B:
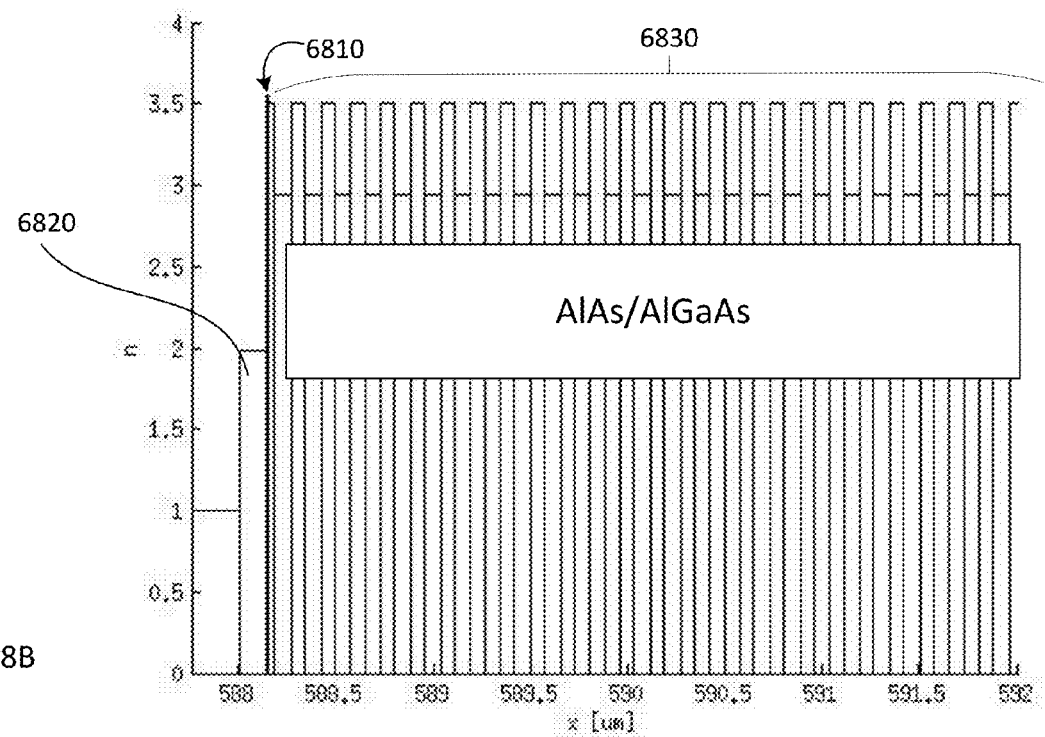
Figure 69:
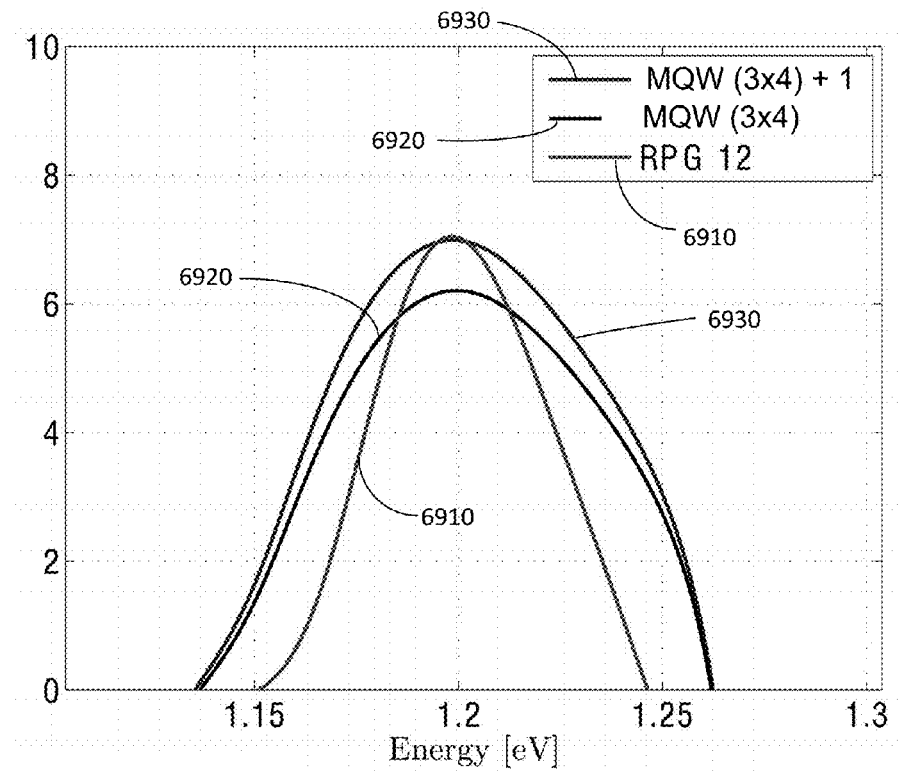
FIGS. 69 and 70 show plots illustrating the comparison of amplification achieved in three different active gain regions, each containing a different QW arrangement as discussed in reference to FIGS. 71, 72, 73, 74, and 75.
Figure 70:
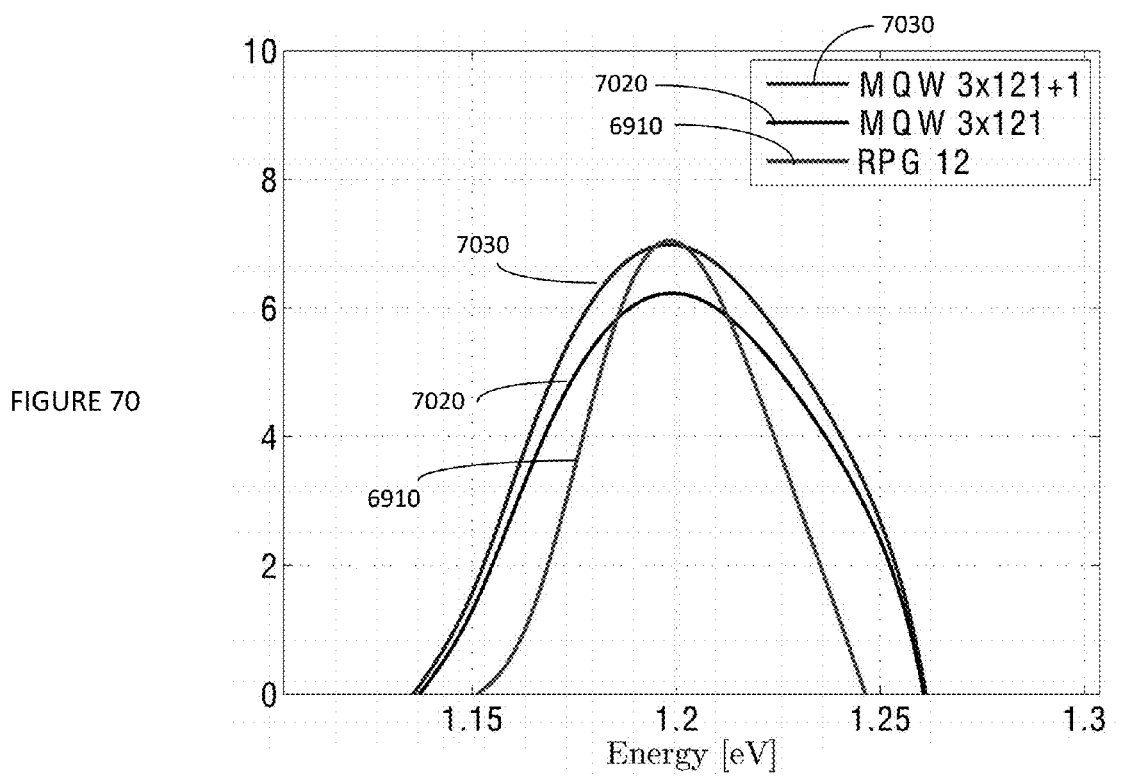
Figure 71:
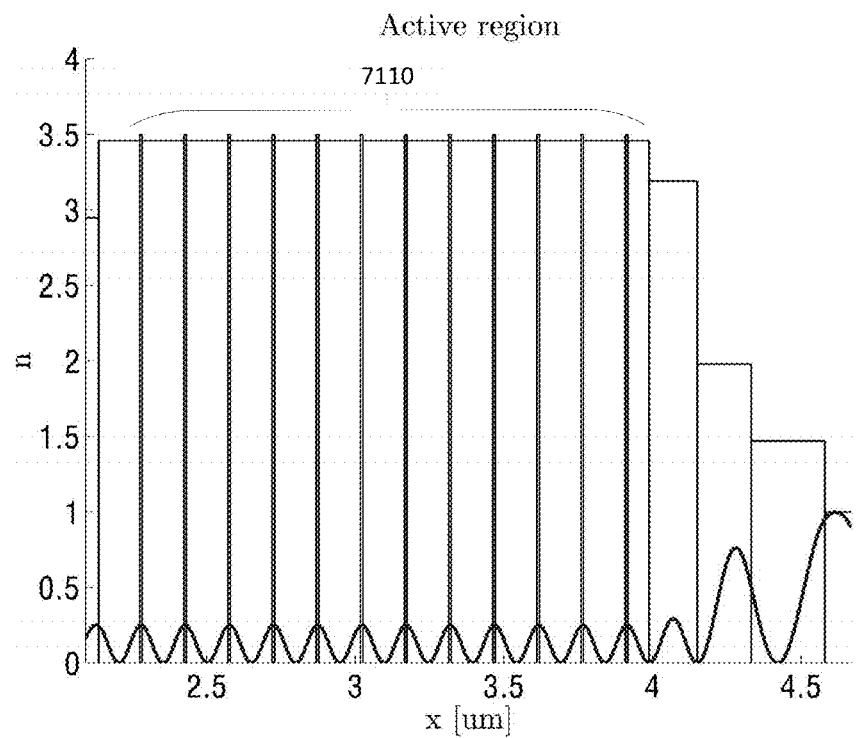
FIG. 71 illustrates a conventional 12-period QW RPG structure.

As shown, the SESAM 6800 abuts a top $Si_3N_4$ AR-coating 6820. The first layer 6840 of the semiconductor structure (adjacent to the single QW 6810) may be about 2 nm to 7 nm thick to allow for fast carrier recombination, which is necessary to generate short pulses. The single QW 6810 will typically have a design to that of a QW in the active gain portion of the structure (that is, a QW in a MQW unit located to the left of the SESAM as viewed in FIGS. 68A, 68B) but, in comparison, with the central absorption wavelength tuned to a shorter wavelength (with a typical detuning value of several nm, for example up to 1 to 5 nm; or in a related example up to 10 nm).

The proposed herein GDD-targeted optimization of passive elements of the overall structure to match active gain element and nonlinear SESAM GDD and structured configured as a result of such process have not been discussed in related art up to-date, to the best knowledge of the inventors. Convergence to a final full cavity design that produces the shortest time-bandwidth limited mode-locked pulse requires that all fully optimized cavity components (active and passive) including gain, absorption and GDD, should be part of the full microscopic simulation of the device, some additional details of which can be found in referred to I. Kilen, J. Hader, J. V Moloney, and S. W. Koch, Ultrafast Nonequilibrium Carrier Dynamics in Semiconductor Laser Mode-Locking, Optica (2014), incorporated herein in by reference in its entirety.

Illustrations presented in FIGS. 69, 70, 71, 72, 73, 74, and 75 expand on the implementation of the idea of a gain-boosting QW addition to the MQW-based gain structure of the invention (whether the constituent QWs in the MQW-based structure are spaced equidistantly, within a given MQW, or non-equidistantly). Here, the comparison is made among different gain curves calculated, for the operating wavelength of 1030 nm, with the curve 6920 of FIG. 69, calculated for the RPG-based gain region 7110 of FIG. 71 (in which the RPG structure 7110 is surrounded by a chosen signal DBR reflector indicated at the left of the FIG. 69, and the combination of chosen cap, AR, and SESAM on the right of the FIG. 69; by analogy with that of FIG. 1).

Figure 72:
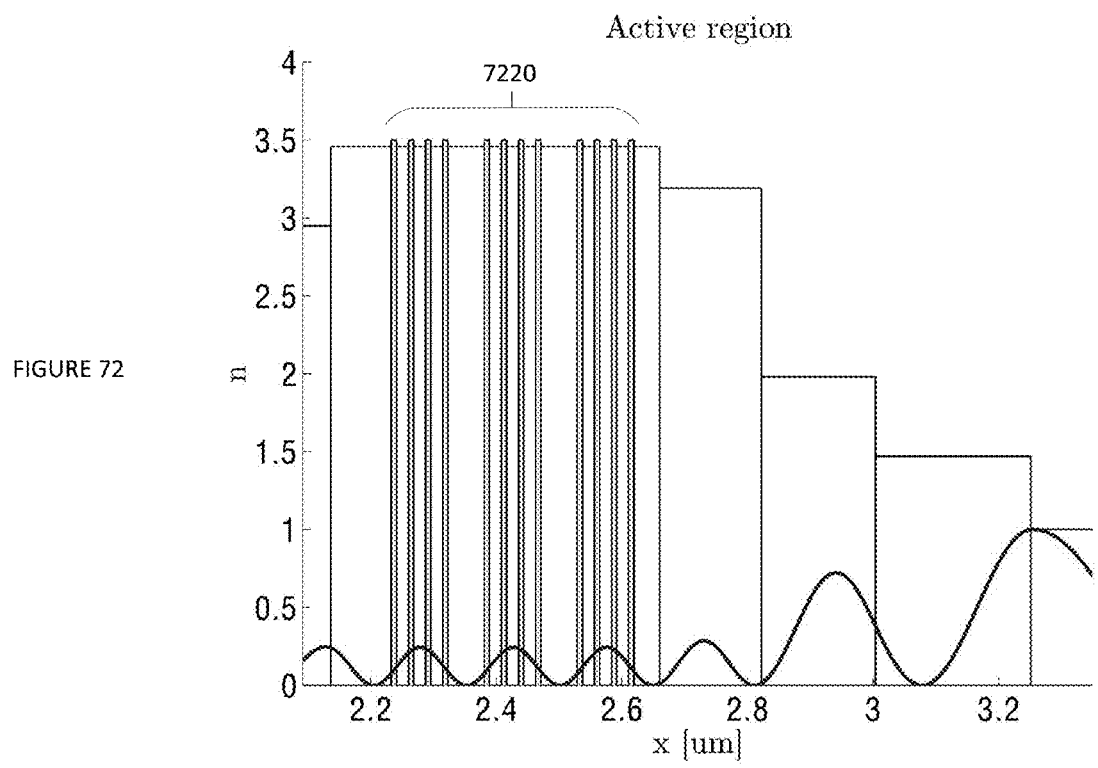
FIG. 72 illustrates an MQW-unit-based structure of the invention with constituent QWs being spaced equidistantly.
Figure 73:
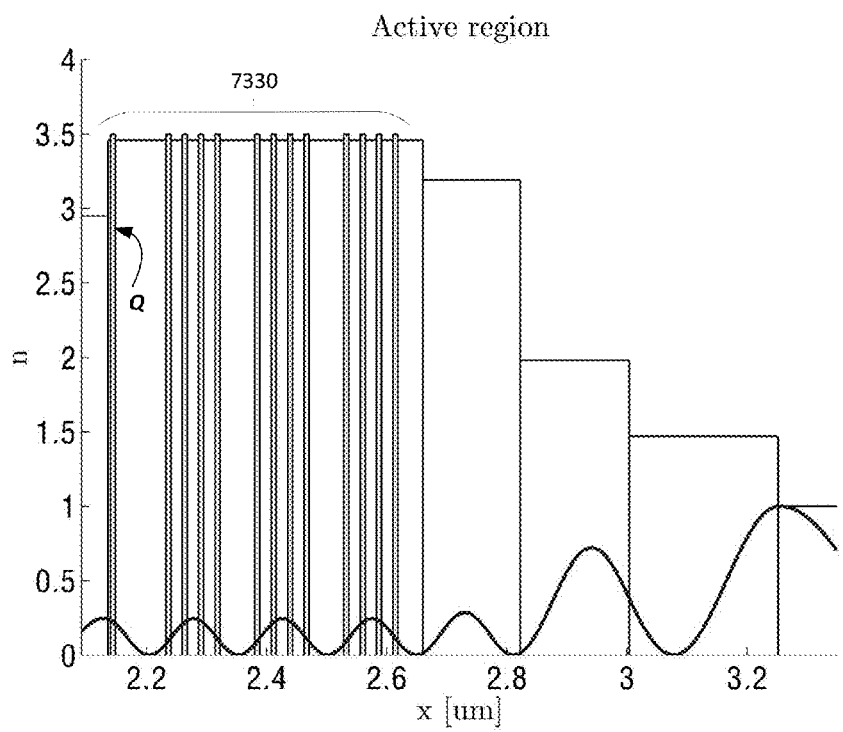
FIG. 73 illustrates an MQW-unit-based structure of the invention with constituent QWs in each MQW unit being spaced equidistantly and additionally containing a gain-boosting QW near the signal DBR mirror.

Curve 6920 represents the gain of the MQW structure 7220 of FIG. 72, which contains 3 MQW units (each designed to be located between the immediately-neighboring nodes of the electrical field, in operation of the corresponding VECSEL, and each containing four equidistantly spaced constituent QWs). Curve 6930 corresponds to the gain curve of the MQW structure 7330 of FIG. 73, which contains 3 MQW units of FIG. 72 and an additional, stand-alone QW "Q" in the vicinity of the antinode of the standing electrical field). It can be easily verified, from the comparison of the curves 6910, 6920, 6930 of FIG. 69, that the addition of the "gain-boosting" QW "Q" leads to increase of the gain to offset other competing losses such as output coupler (outcoupler) losses and SESAM saturable losses within the overall laser cavity.

Figure 74:
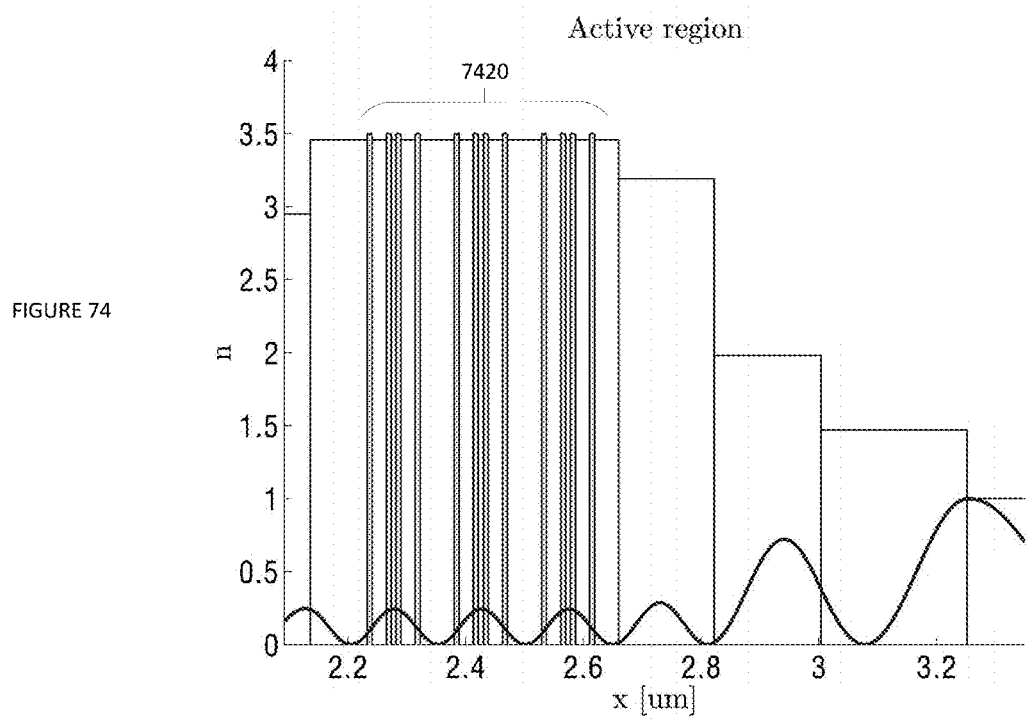
FIG. 74 illustrates an MQW-unit-based structure of the invention with constituent QWs is each MQW unit being spaced non-equidistantly.
Figure 75:
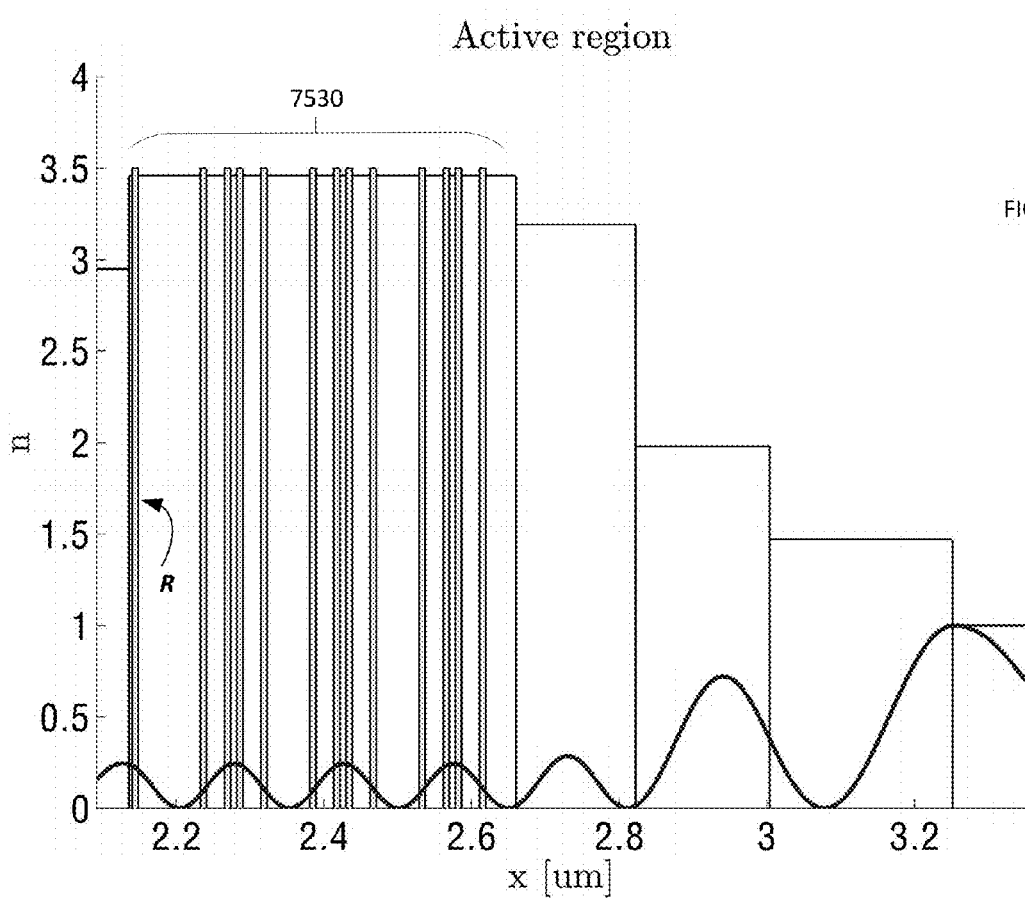
FIG. 75 illustrates an MQW-unit-based structure of the invention with constituent QWs in each MQW unit being spaced non-equidistantly and additionally containing a gain-boosting QW near the signal DBR mirror.

Curve 7020 represents the gain of the MQW structure 7420 of FIG. 74, which contains 3 MQW units (each designed to be located between the immediately-neighboring nodes of the standing electrical field, in operation of the corresponding VECSEL, and each containing four non-equidistantly spaced constituent QWs). Curve 7030 represents the gain of the MQW structure 7530 of FIG. 75, which is structured by analogy with that of FIG. 58 and which contains 3 MQW units of the structure of FIG. 74 complemented with a stand-alone near the signal DBR reflector "gain-boosting" QW, labelled as "R". It can be easily verified, from the comparison of the curves 6910, 7020, 7030 of FIG. 70, that the addition of the "gain-boosting" QW "R" leads to increase of the gain to offset other competing losses such as outcoupler losses and SESAM saturable losses within the overall laser cavity.

Structural and material details pertaining to the gains regions corresponding to 7110, 7220, 7330, 7420, and 7530 are summarized in Table 4.

The layer designs were as follows: 0. Phase: GOLD 100 nm, 65 nm InGaP; 1. Signal DBR (12 repeats of): 76 nm AlGaAs and 88 nm AlAs; 2. Chosen GAIN STRUCTURE; 3. AR coating: 162 nm InGaP, 182 nm Si3N4 and 248 nm SiO2.

Notably, for the calculation the carrier densities for the "equidistant QW" structures 7220 and 7330 are slightly higher than those for the non-equidistant counterparts 7420 and 7530:

QW density: In units $[10^{16} \, m^{-2}]$: 2.24 (for RPG 6910); 2.83 (for 7220 and 7330); and 2.75 (for 7420 and 7530). This was done to reflect the practical situation and to be able to compare the two structures relative to the gain provided by the RPG12 structure 6910.

outcoupler losses. In fact, it has been discovered that these changes may be varied in magnitude while the overall system retains the same effective available gain bandwidth without materially changing the output pulse characteristics. This observation confirms the result that the mode-locking once established continues primarily from efficiently extracting all or most available carriers.

Figure 35:
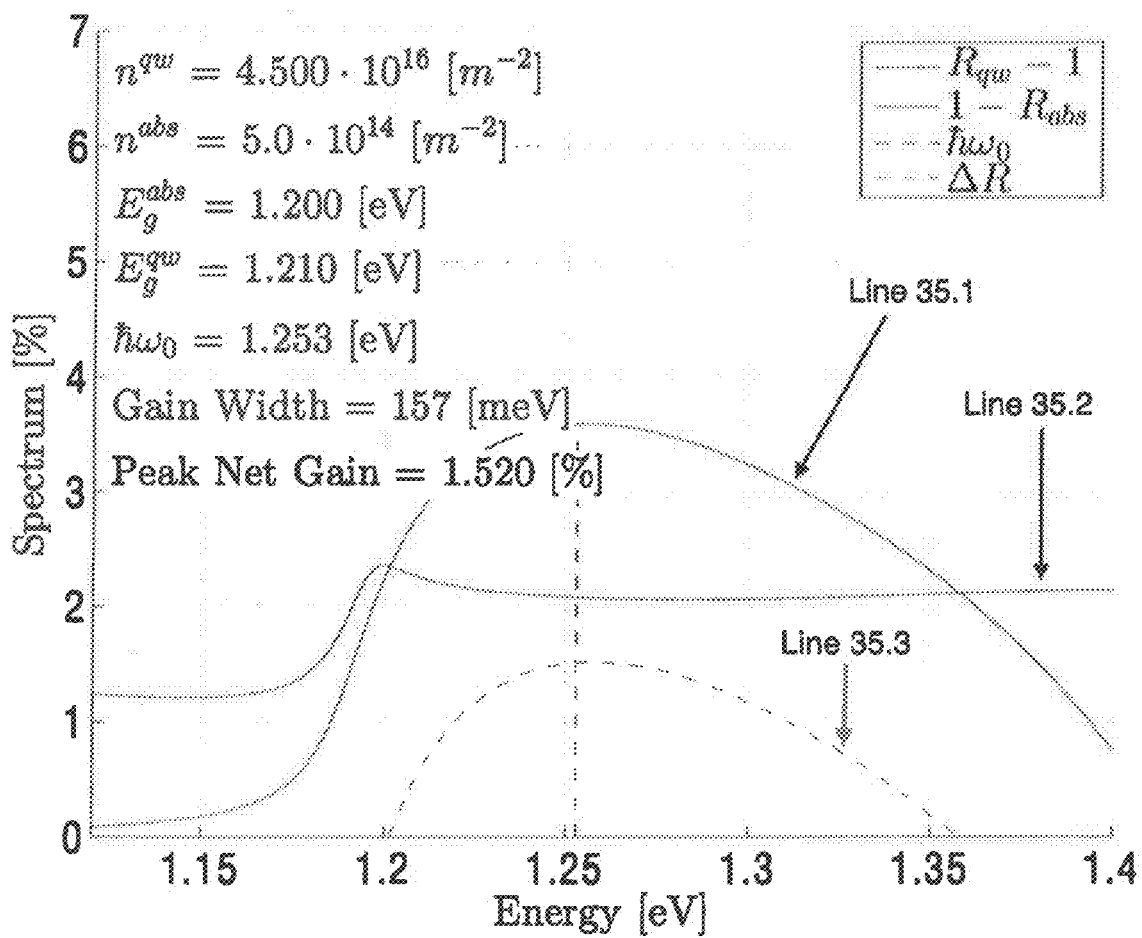
FIG. 35 shows distributions of the linear gain (line 35.1), SESAM absorption (line 35.2) and net linear gain (line 35.3) in a case where the carrier density is reduced from $5 \times 10^{16}$ m$^{-2}$ to $4.5 \times 10^{16}$ m$^{-2}$; for the structure of FIG. 27.
Figure 36:
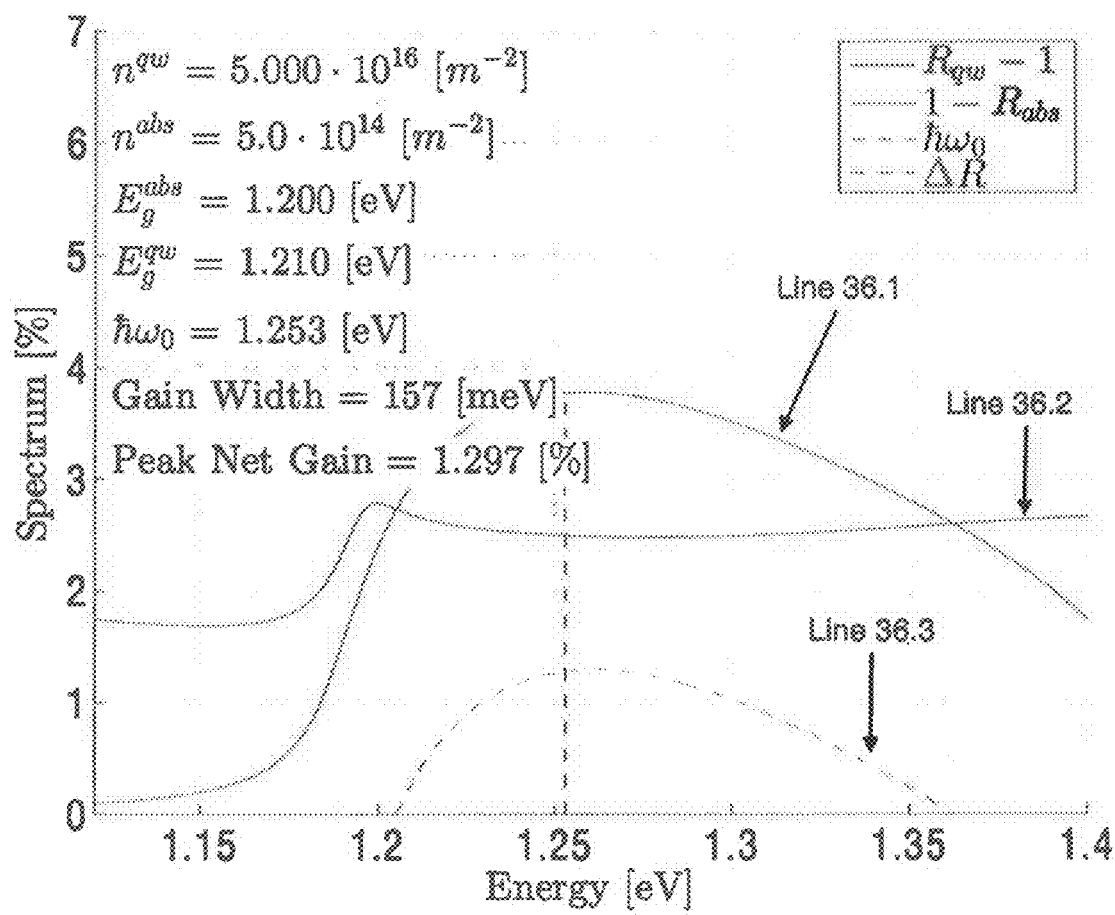
FIG. 36 shows the distributions of linear gain (line 36.1), SESAM absorption (line 36.2) and net linear gain (line 36.3) for the situation where the outcoupling loss is increased for 1.5% to 2%, for the structure of FIG. 27.

FIG. 35 shows a linear gain (line 35.1), SESAM absorption (line 35.2) and net linear gain spectra (line 35.3) for the situation where the carrier density is reduced from $5 \times 10^{16} \, m^{-2}$ to $4.5 \times 10^{16} \, m^{-2}$. FIG. 36 shows a linear gain (line 36.1), SESAM absorption (line 36.2) and net linear gain spectra (line 36.3) for the situation where the outcoupling loss is increased from 2% to 2.8%, comparable with FIG. 28.

In FIGS. 27-30, which leads to a 23.8 fs pulse waveform, a relatively large SESAM absorption is employed as was in the other examples. The net linear gain bandwidth in FIG. 28 is 157 meV. The SESAM absorption in FIG. 35 is now reduced and carrier density adjusted in the MQW to $4.5 \times 10^{16} \, m^{-2}$ so as to maintain approximately the same net linear gain bandwidth of 157 meV as in FIG. 28. The outcoupling loss is adjusted from 2% to 2.8% and similarly the inversion adjusted in the MQW to retain the same 157 meV linear net gain bandwidth in FIG. 36.

Figure 37:
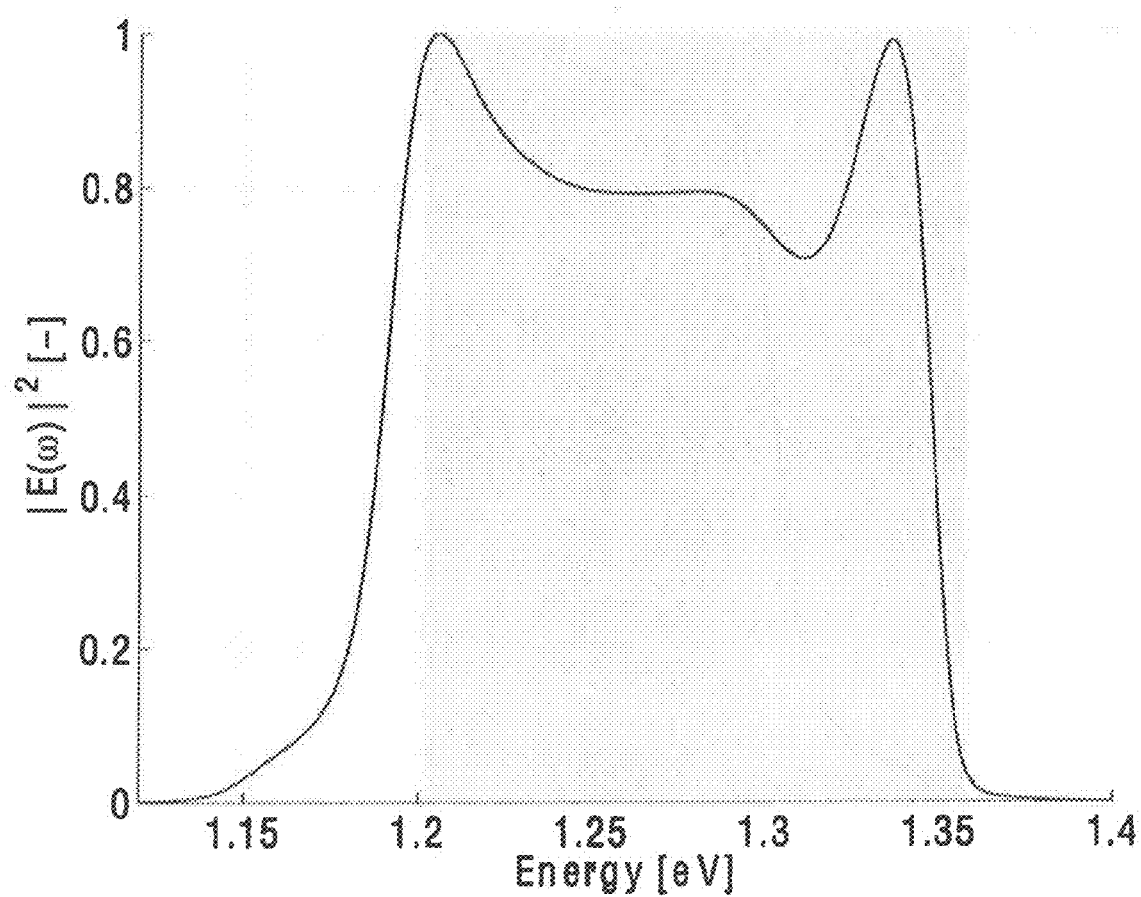
FIG. 37 is a plot representing the spectrum of the final mode-locked pulse corresponding the semiconductor gain medium if the present invention with characteristics shown in FIG. 35; the shaded region denotes the net linear gain bandwidth.
Figure 38:
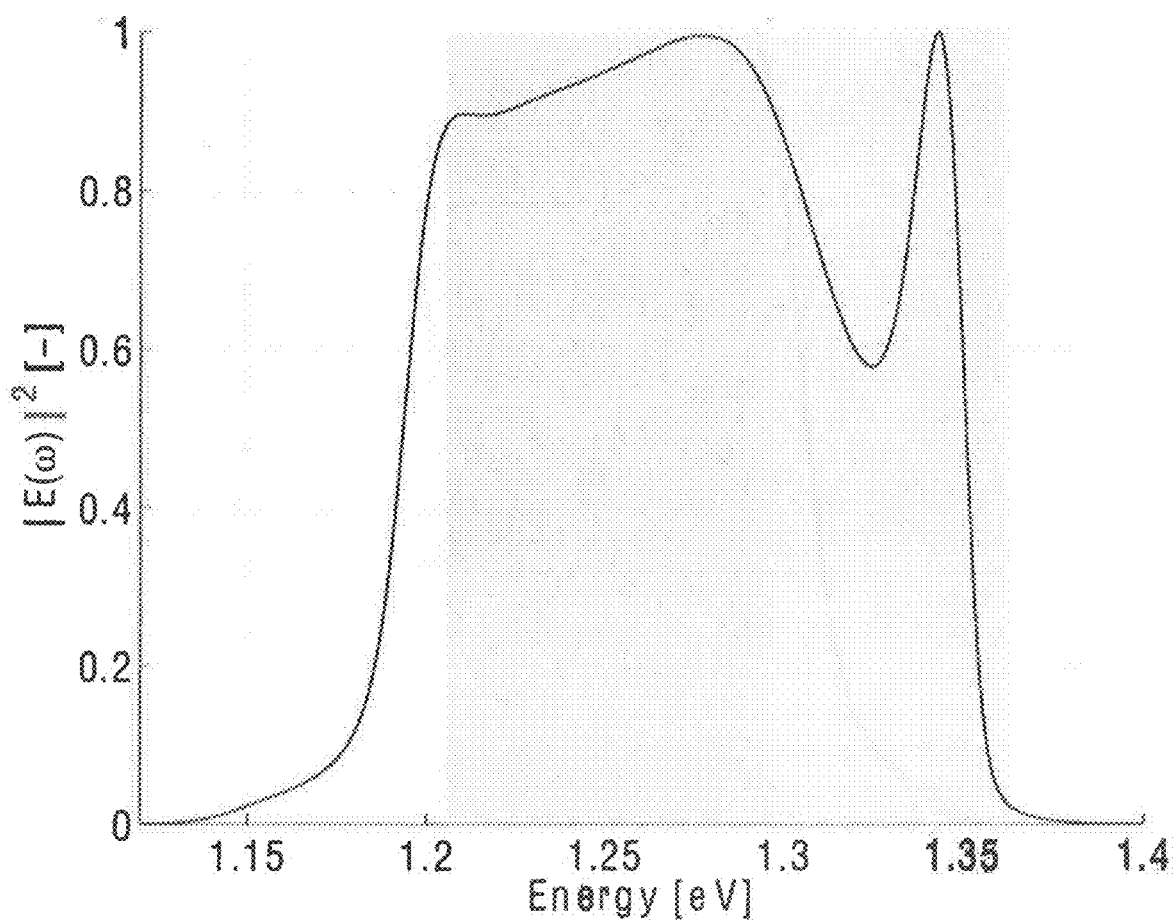
FIG. 38 shows the spectrum of the final mode-locked pulse corresponding the semiconductor gain medium if the present invention with characteristics shown in FIG. 36; the shaded region denotes the net linear gain bandwidth.

FIG. 37 shows a spectrum of the final mode-locked pulse corresponding to FIG. 35. FIG. 38 shows a spectrum of the final mode-locked pulse corresponding to FIG. 36. In both FIG. 37 and FIG. 38, the shaded area in both pulses is the net linear gain bandwidth.

TABLE 4

GAIN STRUCTURES (Width of layers in nanometers)

| | RPG12 | MQW 3x4 | MQW 1 + 3X4 | MQW 3x121 | MQW 1 + 3x121 |
|---|---|---|---|---|---|
| GaAsP | | | 4.08 | | 4.08 |
| QW (Booster) | | | 8.35 | | 8.35 |
| GaAsP | 137.91 | 96.49 | 83.91 | 96.63 | 83.91 |
| QW | 8.35 | 8.35 | 8.35 | 8.35 | 8.35 |
| GaAsP | 140.24 | 18.96 | 18.96 | 24.31 | 24.31 |
| QW | 8.35 | 8.35 | 8.35 | 8.35 | 8.35 |
| GaAsP | 140.22 | 18.86 | 18.86 | 8.16 | 8.16 |
| QW | 8.35 | 8.35 | 8.35 | 8.35 | 8.35 |
| GaAsP | 140.22 | 18.96 | 18.96 | 24.31 | 24.31 |
| QW | 8.35 | 8.35 | 8.35 | 8.35 | 8.35 |
| GaAsP | 140.22 | 57.82 | 57.84 | 57.84 | 57.84 |
| QW | 8.35 | 8.35 | 8.35 | 8.35 | 8.35 |
| GaAsP | 140.22 | 18.96 | 18.96 | 24.31 | 24.31 |
| QW | 8.35 | 8.35 | 8.35 | 8.35 | 8.35 |
| GaAsP | 140.22 | 18.86 | 18.86 | 8.16 | 8.16 |
| QW | 8.35 | 8.35 | 8.35 | 8.35 | 8.35 |
| GaAsP | 140.22 | 18.96 | 18.96 | 24.31 | 24.31 |
| QW | 8.35 | 8.35 | 8.35 | 8.35 | 8.35 |
| GaAsP | 140.22 | 57.92 | 57.89 | 57.89 | 57.89 |
| QW | 8.35 | 8.35 | 8.35 | 8.35 | 8.35 |
| GaAsP | 140.22 | 18.96 | 18.96 | 24.31 | 24.31 |
| QW | 8.35 | 8.35 | 8.35 | 8.35 | 8.35 |
| GaAsP | 140.22 | 18.86 | 18.86 | 8.16 | 8.16 |
| QW | 8.35 | 8.35 | 8.35 | 8.35 | 8.35 |
| GaAsP | 140.22 | 18.96 | 18.96 | 24.31 | 24.31 |
| QW | 8.35 | 8.35 | 8.35 | 8.35 | 8.35 |
| GaAsP | 71.76 | 40.95 | 41.11 | 40.81 | 41.11 |

Robust Lasing Operation

Notably, a stunningly advantageous feature of the cumulative MQW architecture of the present invention is the remarkable robustness of the non-equilibrium pulsed laser system (that utilizes an embodiment of the cumulative MQW structure) to changes in the SESAM absorption and FIGS. 37 and 38 show the mode-locked pulse spectra for both cases depicted in FIGS. 35 and 36. The shapes are again strongly distorted due to the strong amplification in the structure but they again both mimic the full linear gain bandwidth rather than the net linear gain bandwidth.

Figure 39:
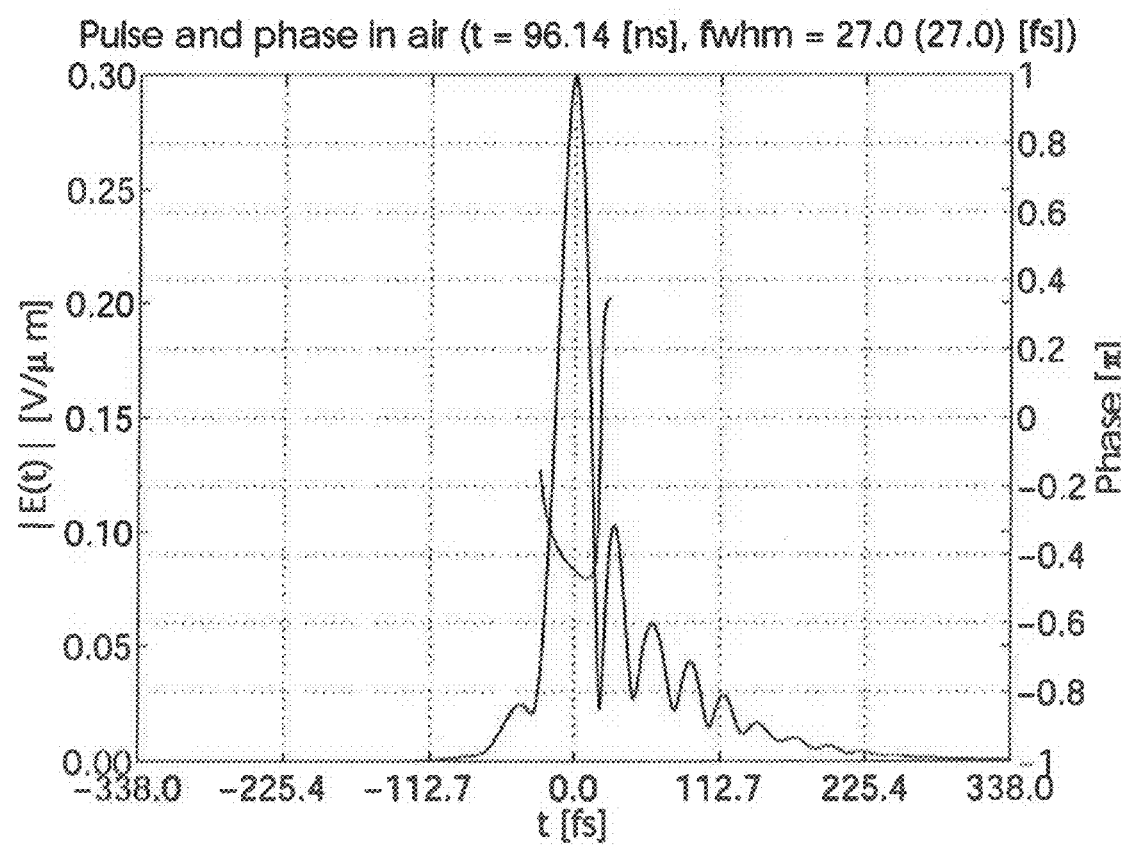
FIG. 39 provides plots representing amplitude and phase of the mode-locked pulse of duration 27.0 fs, which pulse corresponds to an embodiment of the invention represented by FIGS. 35 and 37.
Figure 40:
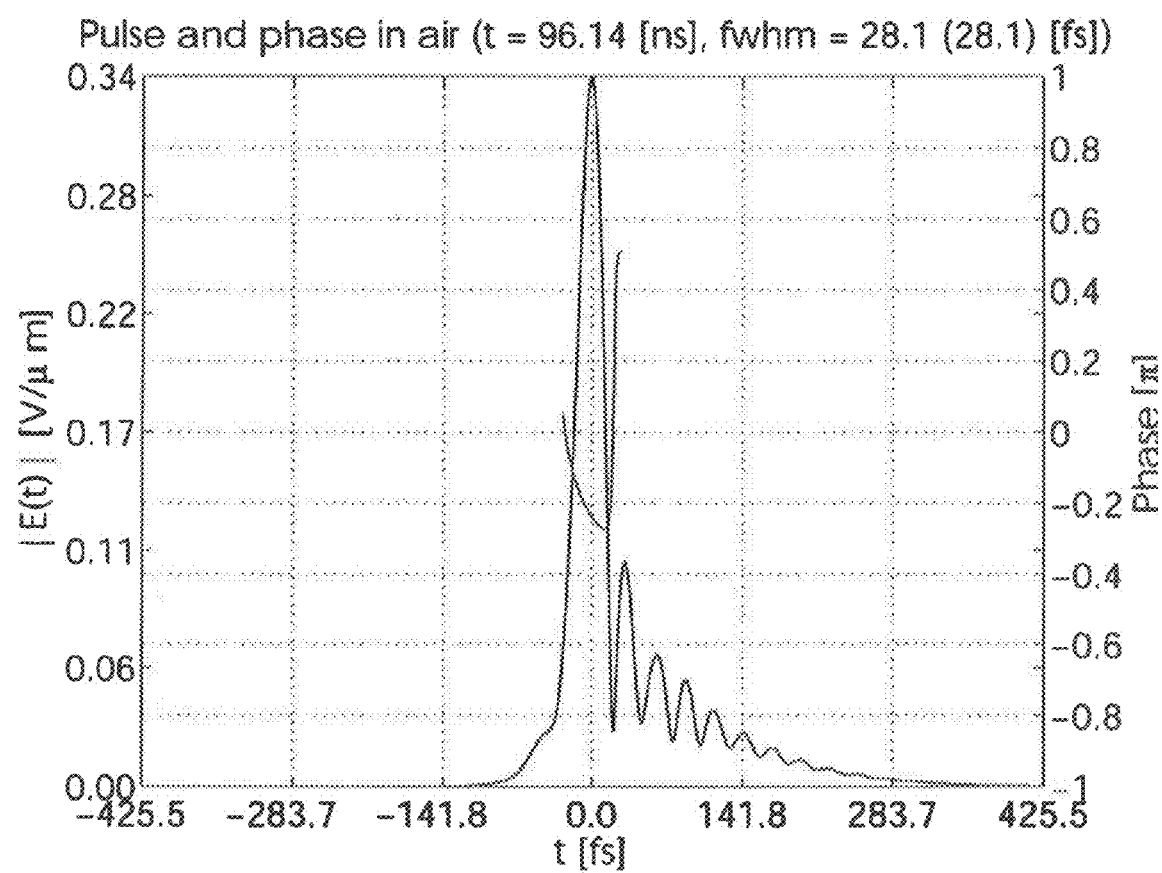
FIG. 40 provides plots representing the mode-locked pulse of duration 28.1 fs, which pulse corresponds to an embodiment of the invention represented by FIGS. 36 and 38.

FIG. 39 shows a mode-locked pulse of duration 27 fs corresponding to FIGS. 35 and 37. FIG. 40 shows a mode-locked pulse of duration 28.1 fs corresponding to FIGS. 36 and 38. Some of the spectral distortions present in FIGS. 37 and 38 are due to the residual satellites appearing on the trailing edge of each pulse in FIGS. 39 and 40. These can be suppressed significantly by replacing the dispersive single layer coating employed in simulations here by multi-layer AR-coatings that further flatten the dispersion. Some of the spectral distortion is due to the fact that the MQW arrangement is not optimized to effectively remove the entire carrier inversion and some unused carriers can cause the appearance of such satellite sub-pulses.

The results in FIGS. 35-40 show that changing the SESAM absorption or outcoupling loss does not fundamentally change the outcome of the pulse mode-locking. This is not surprising, as the final nonequilibrium and nonlinear dynamical system is dominated by the almost entirely evacuated carrier subsystems. Additionally MQW pulse energies and repetition rates can be scaled up by extending the cavity length from the very short 3.2 cm cavity used here to longer or even shorter cavities. See for example reference to such scaling of the MIXSEL structure by Mario Mangold, Christian A. Zaugg, Sandro M. Link, Matthias Golling, Bauke W. Tilma, and Ursula Keller, *Pulse repetition rate scaling from 5 to 100 GHz*, Opt. Exp., 22, 6099 (2014) *with a high-power semiconductor disk laser,* Opt. Exp., 22, 6099 (2014), incorporated herein by reference in its entirety.

It is appreciated, therefore, that an implementation of the present invention results in a method for generating light pulses in a surface-emitting semiconductor laser system configured to operate in a mode-locked regime. Such method includes pumping a semiconductor gain medium (of a semiconductor laser chip disposed within an optical resonator of said laser system) with an output from a pump source to create excited carriers within a bandwidth of a full gain spectrum of said semiconductor medium (where said full gain spectrum has a bandwidth containing a first wavelength). The method further includes forming a standing wave within the laser chip at a frequency of the first wavelength. The standing wave defines first and second immediately neighboring nodes located along the optical axis within the gain medium. Additionally, the method includes multiply transmitting light, formed within an optical resonator, through a first MQW unit in the gain medium, while such first MQW unit includes at least three first QWs separated from one another by a sub-wavelength distance, all of such three or more first QWs are disposed between the first and second nodes of the standing wave. A method may further include steps of traversing such light through a mode-locking element of the laser system to achieve light-pulses the duration of each of which does not exceed 100 fs; and outcoupling a train of light-pulses through a reflector of the optical resonator. The optical resonator of the present laser system may contain a reflector defined by a distributed Bragg reflecting structure in a semiconductor chip and a simple reflector (which term is defined to refer to a dielectric thin-film-stack mirror or metallic mirror such as a first-surface mirror). Optionally, the method also contains a step of multiply transmitting light through a second MQW unit in the gain medium, such second MQW unit containing at least one second QW, and where the second MQW unit is separated from the first MQW unit by at least one node of the standing wave. Furthermore, the method may include a process of extracting excited-state carriers at frequencies that aggregately define a majority of a bandwidth of a full gain curve of the gain medium.

Embodiments of a Pumping System

Figure 41:
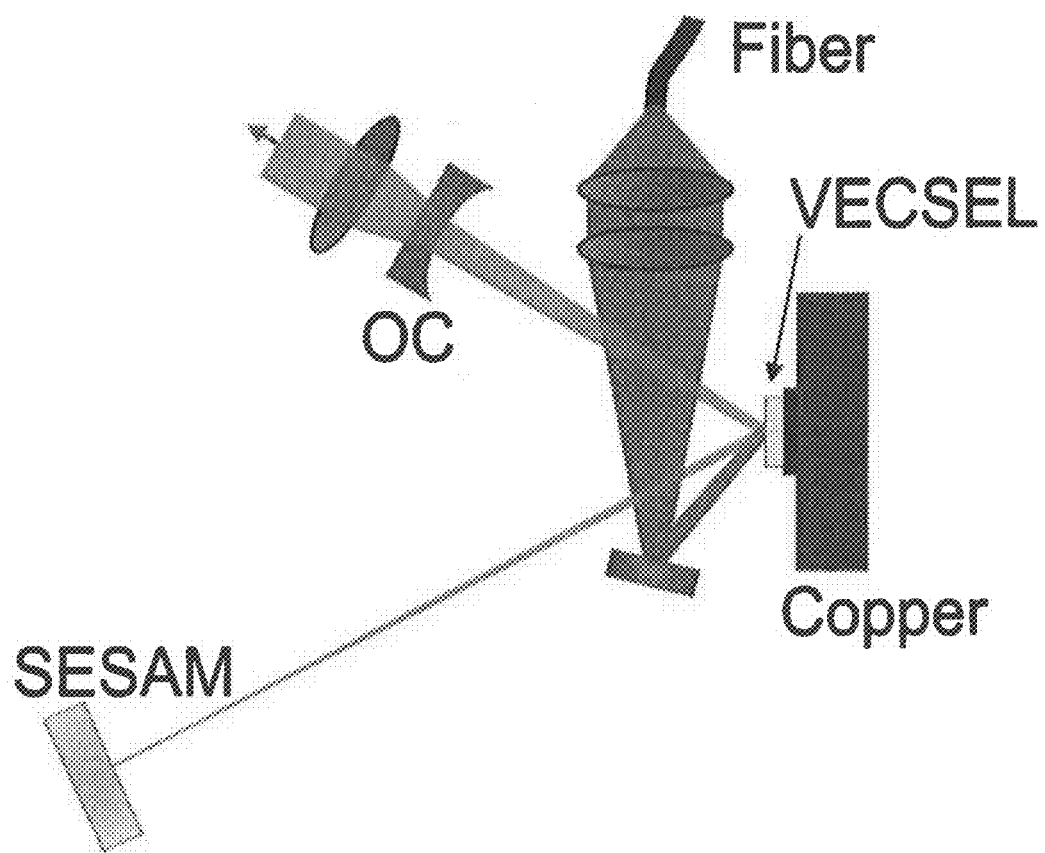
FIG. 41 is a schematic diagram of a layout of an external optically-pumped V-cavity for generating mode-locked pulse trains.

Many different pumping schemes can be used to realize the results discussed herein related to the MQW laser architecture. Semiconductor disk lasers can be pumped in a variety of ways. A typical optical pumping scheme for mode-locking is shown in FIG. 41 where a fiber coupled fiber bar or, alternatively, a single mode lower power pump beam is imaged onto the surface of the semiconductor chip. In this example, a conventional semiconductor disk laser (VECSEL RPG structure) is mode-locked using a commercial semiconductor saturable absorber mirror (SESAM). The same set-up can be used with the present inventive MQW laser.

FIG. 41 shows a schematic layout of a typical external optically-pumped V-cavity for generating mode-locked pulse trains.

Figure 42:
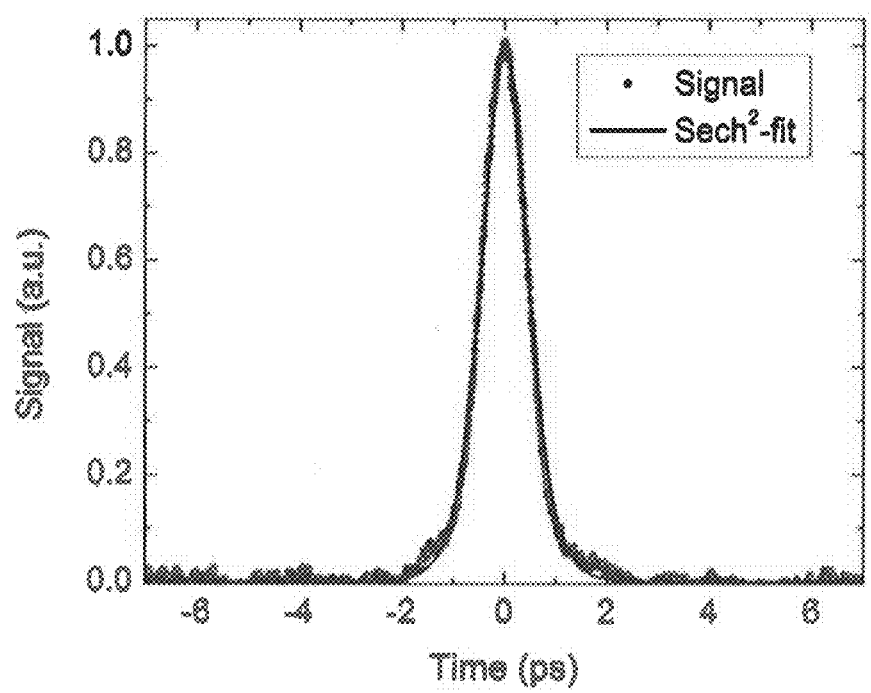
FIG. 42 shows a plot of experimentally measured autocorrelation of the sub-picosecond mode-locked high average power pulse obtained with the use of a V-cavity configured according to the schematic of FIG. 41.

FIG. 42 shows an autocorrelation measurement of the sub-picosecond mode-locked high average power pulse.

Figure 43:
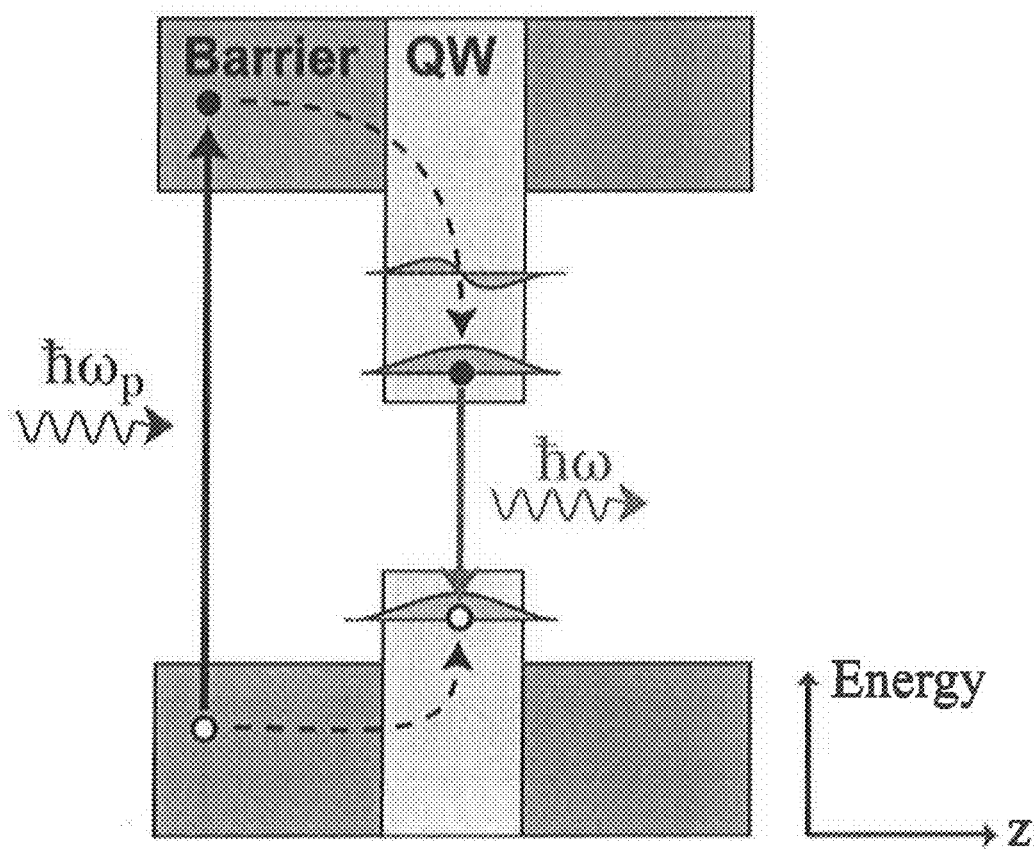
FIG. 43 shows an optical scheme (for use with an embodiment of the invention) for pumping of the barrier with a large quantum defect $\Delta E = (\hbar\omega_p - \hbar\omega)$, the external optical-pump photon energy is $\hbar\omega_p$ and $\hbar\omega$ denotes the generated laser photon energy.
Figure 44:
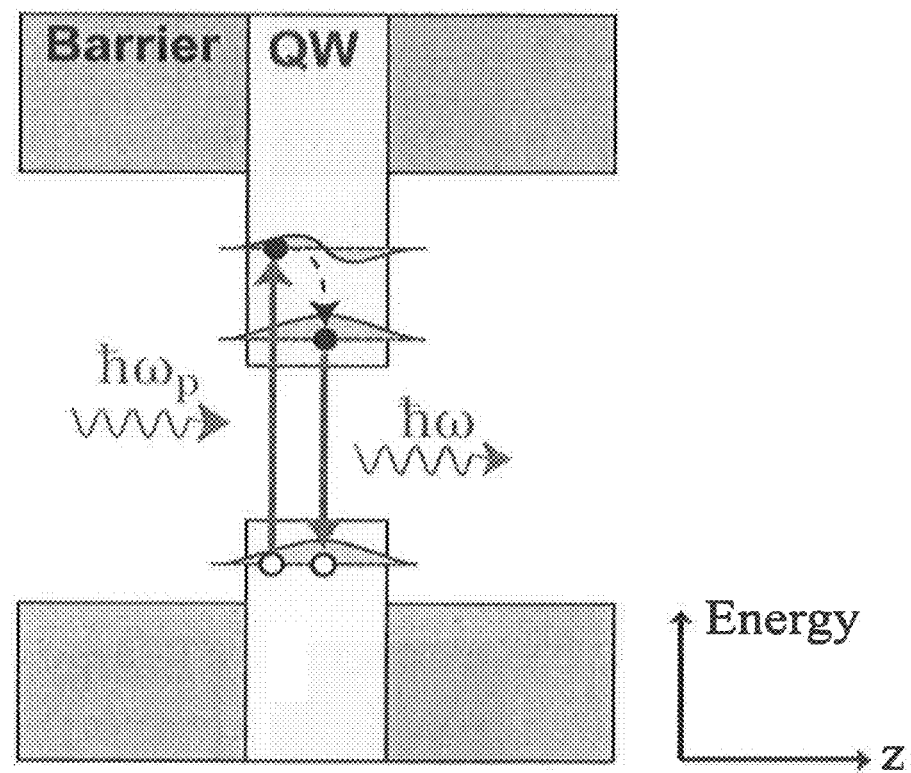
FIG. 44 shows an optical scheme (for use with an embodiment of the invention) for pumping of the quantum well with a much smaller quantum defect $\Delta E = (\hbar\omega_p - \hbar\omega)$, the external optical pump photon energy is $\hbar\omega_p$ and $\hbar\omega$ denotes the generated laser photon energy.

FIG. 43 shows an exemplary QW energy level diagram of optical pumping of a barrier region having a large quantum defect $\Delta E=(\hbar\omega_p-\hbar\omega)$. FIG. 44 shows an exemplary QW energy level diagram of optical pumping the upper state in the quantum well having a much smaller quantum defect $\Delta E=(\hbar\omega-\hbar\omega)$.

FIG. 41 shows a V-cavity optical pumping geometry which is just one of many possible pumping geometries. One of ordinary skill in the art will recognize that other pumping geometries can be employed, including: linear cavity, z-cavity, etc. FIG. 42 shows an experimentally measured correlation trace of a mode-locked pulse generated from the V-cavity geometry shown in FIG. 41 and taken from reference M. Scheller, T.-L. Wang, B. Kunert, W. Stolz, S. W. Koch, and J. V. Moloney, "Passively mode-locked VECSEL emitting 682 fs pulses with 5.1 W of average output power," Electronics Letters, 48, 588-589 (2012) incorporated herein in by reference in its entirety.

The optical pump can by at a wavelength that either pump the barriers or pump QWs directly. In the typical barrier-pumped RPG structure, approximately 80% of the incident pump power is absorbed in a single pass through the chip. In-well pumping leads to much smaller absorption per pass through the structure but also generates much less waste heat due to the smaller quantum defect. Typically QW pumping of an RPG requires multiple passes (at least 2) through the structure. FIGS. 43 and 44 show contrasting pump wavelengths for two optical pumping scenarios. An in-well pumping scheme has been employed by Wei Zhang, Thorsten Ackemann, Stephen McGinily, Marc Schmid, Erling Riis, and Allister I. Ferguson (see "*Operation of an optical in-well-pumped vertical-external-cavity surface-emitting laser,* Appl. Opt., 45, 7729, 2006) to generate near-IR wavelength of 855 nm using a GaAs based material system and incorporated herein by reference in its entirety. A similar in-well and barrier pumping scheme has been employed by J. Wagner, N. Schulz, M. Rattunde, C. Ritzenthaler, C. Manz, C. Wild, and K. Kohler, *Barrier-and in-well pumped GaSb-based* 2.3 µm *VECSELs,* phys. stat. sol. (c) 4, 1597-1600 (2007) to generate mid-IR wavelength of 2.3 µm using a GaSb-based material system and incorporated herein by reference in its entirety.

A related pumping scheme can be configured with the use of an external pulsed laser source to synchronously pump the embodiment of the cumulative MQW structure. Such an external pumping scheme has been employed by Wei Zhang, Thorsten Ackemann, Marc Schmid, Nigel Langford, Allister I. Ferguson, *Femtosecond synchronously mode-locked vertical-external cavity surface-emitting laser,* Opt. Exp., 14, 1810 (2006), incorporated herein by reference in its entirety, where a complex multiple pass cavity arrangement.

The reader is referred to a comprehensive review of possible pump schemes (barrier, in-well and electrical), cavity geometries and reported results with comprehensive referencing is provided in *Semiconductor Disk Lasers: Physics and Technology* (Oleg G. Okhotnikov, Editor; 2010 WILEY-VCH Verlag GmbH & Co. KGaA, Weinheim; ISBN: 978-3-527-40933-4), which is incorporated herein by reference in its entirety.

Because MQWs are significantly thinner than the usual RPG, MQWs consequently can operate when even less pump power is absorbed in a single pass (for example the above 8 QW MQW would absorb between 15-20% of the pump in a single pass even when barrier pumped). Well pumping could lead to comparably smaller absorption. In the barrier pumped case, it would be possible to grow an extra DBR at the back of the signal DBR to reflect the pump light for a 2-pass configuration. With in-well pumping, the DBR stopband for the signal could be arranged to also reflect the shorter wavelength pump light. An even better solution would be to have a gold (Au) or other high reflection metallization layer deposited at the back end of the signal DBR. A thin few nm thick layer would act as an efficient reflector for both a barrier or QW pump.

Figure 45:
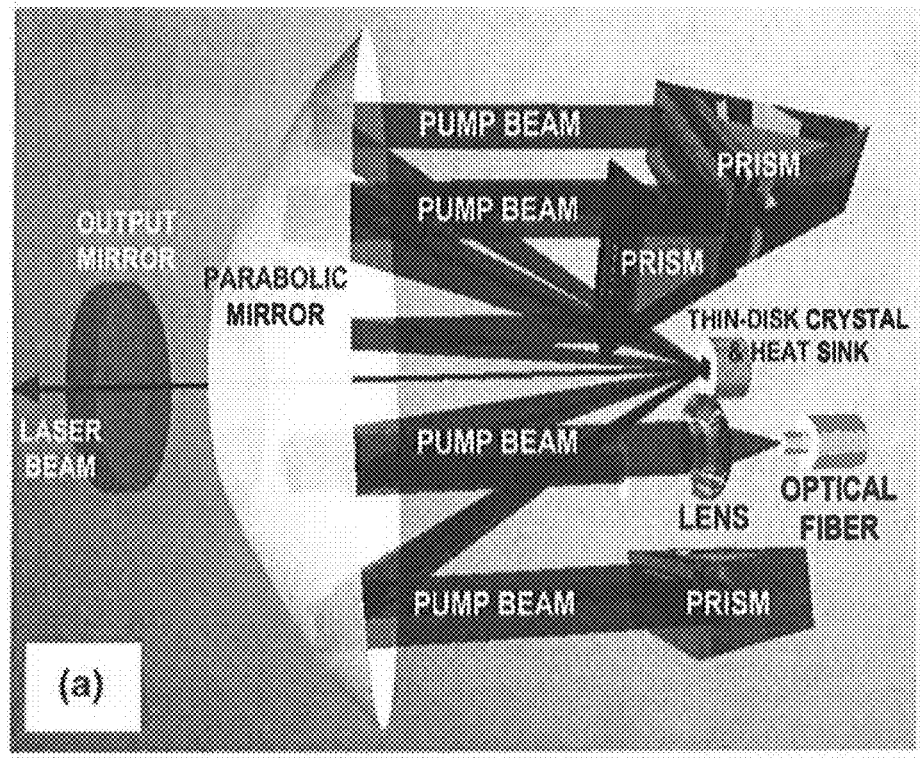
FIG. 45 is a schematic diagram of a multi-pass optical system configured for optical pumping of a thin disk crystal; an identical optical system could be used for both barrier and QW-pumped VECSELs (the energy diagrams of which are shown in FIGS. 43 and 44, respectively)
Figure 46:
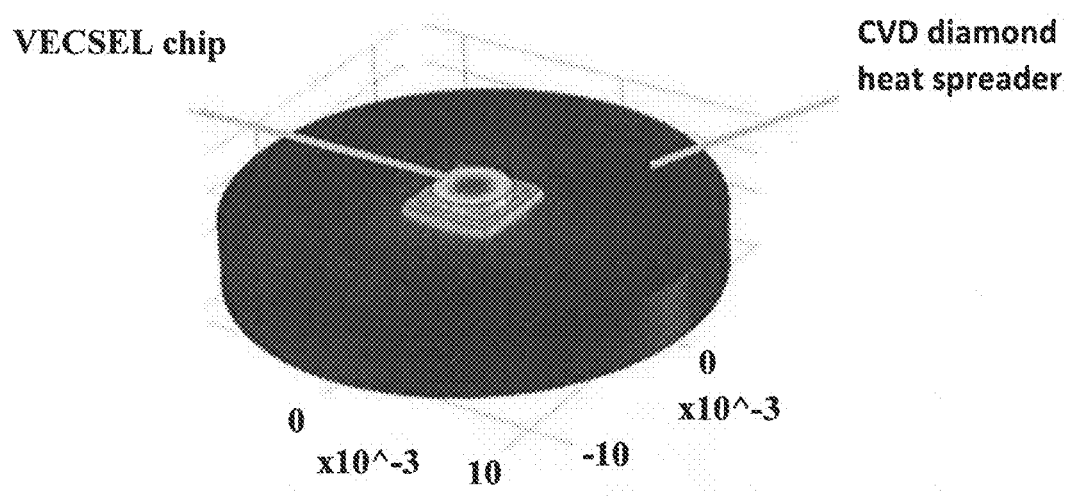
FIG. 46 shows a schematic diagram of an MQW laser chip mounted on a rectangular CVD diamond heat sink with the latter being bonded to a copper heat sink disk, to increase the efficiency of heat removal from the semiconductor chip.

A possible multi-pass pump geometry that is commonly used in optically pumped thin disk lasers could be set up to efficiently barrier- or well-pump the semiconductor MQW chip. FIG. 45 depicts a possible multi-pass geometry where a parabolic mirror and multiple prisms act to split the incoming pump beam into multiple pump beams simultaneously impinging on the laser chip. The thin disk crystal would be replaced by the novel MQW semiconductor disk chip. As shown in FIG. 46, the latter would be bonded to a CVD diamond heat spreader and water-cooled copper heat sink, employing a standard bonding technique. This is one of many possible realizations for multiple pass pump geometries.

Figure 47:
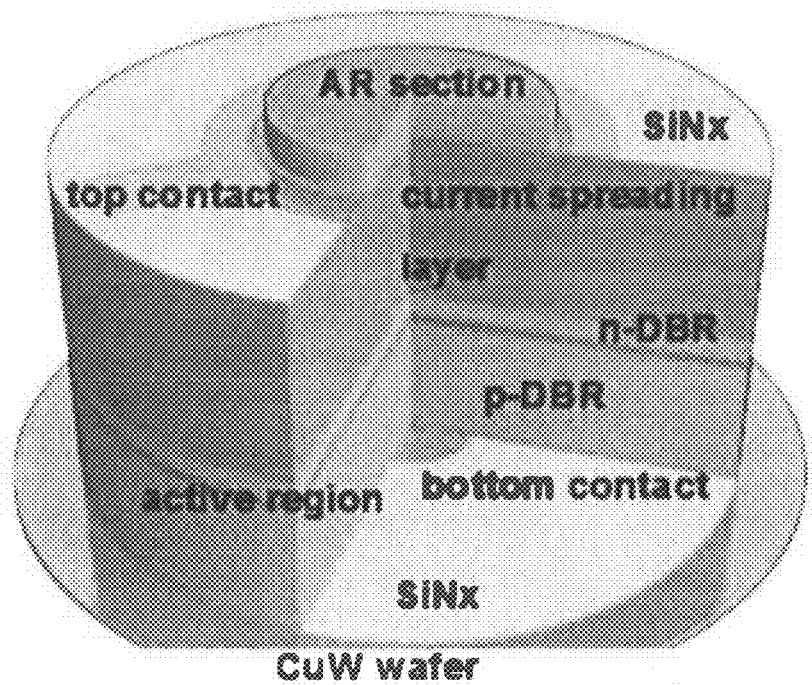
FIG. 47 shows an implementation of an electrically pumped MQW semiconductor disk laser configured according to an embodiment of the invention, where the "active region" depicts the location of the MQW chip, and the DBR layers are doped to facilitate the flow of carriers from the contact regions.

The ultimate compact pumping geometry involves an electrically pumped MQW chip. This offers the most compact pumping arrangement and would be well suited to the thin semiconductor MQW chip. The electrical pumping setup depicted in FIG. 47 will involve added complications such as extra Joule heating, losses due to DBR p- and n-doping and an additional upper n-doped DBR. The structure depicted in this figure is just one possible realization of an electrically pumped configuration. In this realization, the bottom DBR is p-doped and a top short DBR is n-doped. Additionally, there needs to be a current spreading layer from the top contact that facilitates a relatively uniform current flow in the center of the chip. Details of a possible implementation of such an electrically pumped VECSEL are given by Y. Barbarian, M. Hoffmann, W. P. Pallmann, I. Dahhan, P. Kreuter, M. Miller, J. Baier, H. Moench, M. Golling, T. Sudmeyer, B. Witzigmann, and U. Keller, *Electrically Pumped Vertical External Cavity Surface Emitting Lasers Suitable for Passive Modelocking,* IEEE J. Sel. Top. In Quant. Electron., 17, 1779 (2011), incorporated herein by reference in its entirety.

The high repetition rates achievable with semiconductor sources will make the MQW structures particularly useful for LIDAR, optical arbitrary wave-form generation, advanced ultra-high bandwidth communication systems, semiconductor inspection and coherent detection applications. Additionally such a source could be used in medical and biological applications with one example being OCT (Optical Coherence Tomography) and another multiphoton microscopy (bio-imaging) for new "red" classes of dyes/markers. For a comprehensive review of potential applications in medicine and biology see the text *Ultrashort Pulses in Biology and Medicine,* Editors: Markus Braun, Peter Gilch and Wolfgang Zinth, ISBN-13 978-3-540-73565-6 (Springer Berlin Heidelberg New York), incorporated herein by reference in its entirety, where applications are specific to the current generation of solid state lasers. Mode-locked laser based on the proposed MQW structure can replicate these systems at their operating wavelengths in a possibly more compact geometry and extend into application areas needing currently inaccessible wavelength sources.

VECSEL sources in particular have been shown to exhibit very good quantum-limited noise performance, especially compared to doped fiber laser counter-parts. Such low noise performance in a compact mode-locked source could prove to be the ideal frequency comb source. Applications include improved and field-usable clocks and ultra-low noise microwave generation for improved timing and synchronization in communication, navigation, and guidance systems.

It is appreciated, therefore, that implementations of the invention provide a specifically-designed surface-emitting semiconductor laser system, which includes a semiconductor laser chip disposed in a resonator cavity and comprising a semiconductor gain medium and a mirror attached to the semiconductor gain medium. An active part of the semiconductor laser chip has an optical path length along an optical axis which corresponds to multiple wavelengths of light in the semiconductor medium and is configured to produce, when pumped by an appropriate source, a standing wave at a wavelength $\lambda$ corresponding to a frequency from the gain spectrum of the gain medium.

The semiconductor gain medium includes a first plurality of quantum wells that are stacked on each other along the optical axis with intermediate spacings of the order of the thickness of the quantum wells to form a multiple quantum well gain element that, in a specific case, spans the majority of a distance representing a half-cycle of the standing wave. The gain medium can be configured such as to include such multiple-quantum-well gain element is repeated multiple times. The semiconductor laser chip optionally has an anti-reflection coating to suppress spurious reflections. The plurality of quantum wells can span a plurality of half-cycles of the standing wave formed within the cavity. The sequence of QWs forming one base MQW unit of the MQW structure of the invention can include any specific number of QWs, starting from at least 3 QWs to 10 QWs. Specific examples of numbers of QWs forming one MQW unit include 3, 4, 5, 6, 7, 8, 9, and 10 QWs. The cumulative MQW structure of an embodiment of the invention may include an integer number of the MQW units (specific examples include 1, 2, 3 4 and 5 MQW units) such that the plurality of quantum wells in the overall, cumulative MQW structure contains any specific number of QWs between 3 QWs and 60 quantum wells.

The gain medium is configured such as to substantially completely bleaches out the inversion generated in the gain medium by the pump source. A spacing between immediately adjacent quantum wells in the cumulative MQW structure of the invention is in the range from about 0.01 to about 0.15 times the wavelength $\lambda$. It is noted that, generally, not all spacings between the QWs in a MQW structure of the invention have to be equal. A sub-wavelength spacing between adjacent quantum wells can be sufficiently large to provide sufficiently strong quantum confinement of the carriers to the individual quantum wells, thus constituting a multiple quantum-well structure with each structure having quantized states existing within the individual quantum wells and spatially confined by the energy barrier provided by the separation layers. By "sufficiently large," the separation layers between the QWs have thicknesses on the order of 1 to 100 nm, or 5-12 nm, or 1-5 nm depending on the insulating characteristics of the separation layer between the quantum wells. Alternatively or in addition at least on sub-wavelength spacing between adjacent quantum wells of a plurality of quantum wells can be less than a thickness of the individual quantum wells such that some or all of the carrier wavefunctions are delocalized over more than one quantum well thus constituting a superlattice structure.

Alternatively, a sub-wavelength spacing between adjacent quantum wells of the plurality of quantum wells is chosen in the range between 0.01 and 0.25 times $\lambda/n$, where n is an average refractive index of the semiconductor gain medium; in a related embodiment—in the range 0.01 and 0.35 times $\lambda/n$.

Optionally, in one implementation, the surface emitting semiconductor laser system includes a pump source configured to pump energy into the semiconductor gain medium to produce excited-state electrons in the quantum wells, and a mode-locking element included in the resonator cavity to mode-lock the resonator cavity and to extract light amplification in the form of ultrashort pulses, and an output coupler through which such ultrashort light pulses are transmitted outside the cavity. The mode-locking element can include at least one of a semiconductor saturable absorber mirror element, a self-phase modulation Kerr lens element, and an active modulation element.

The semiconductor gain medium can include a base material that is a compound semiconductor that includes a combination of elements from the groups III and V or the groups II and VI of the periodic table. The semiconductor gain medium can include a second plurality of quantum wells positioned relative to adjacent quantum wells thereof at a second sub-wavelength spacing of the center wavelength $\lambda$.

The first plurality of quantum wells can be disposed such that, with respect to a center of the half-cycle of the standing wave formed during the lasing operation along the optical axis, a group of such QWs is located asymmetrically (in other words, closer to one of the nodes corresponding to this half-cycle than to another nodes corresponding to this half-cycle).

Alternatively or in addition, there can be included a second plurality of quantum wells such that the first plurality of quantum wells are disposed within one half of a wavelength cycle of the wavelength $\lambda$, and the second plurality of quantum wells are disposed within the other half of the wavelength cycle of the wavelength $\lambda$. In this configuration, the second plurality of quantum wells can be offset, along the optical axis, from the antinode of the standing wave by a pre-defined distance.

The optical resonator of the laser system can be an extended resonator with a gap between the semiconductor laser chip and the output coupler. The gap can be filled with gas (such as air for example, or nitrogen) or liquid (such as a cooling liquid or an index-matching liquid).

In a different aspect of the invention, there is provided a resonator structure for generation of stimulated emission. The resonator structure includes a semiconductor gain medium having a plurality of quantum wells. The plurality of quantum wells can include one or more one quantum wells disposed offset a substantial distance from an anti-node of the resonant cavity. A sub-wavelength spacing between adjacent quantum wells of the plurality of quantum wells is in the range 0.01 and 0.15 times the center frequency wavelength $\lambda/n$, where n is an average refractive index of the semiconductor gain medium.

There is additionally provided a method for generation of stimulated emission from the lasers and resonant structures noted above. The method includes pumping the semiconductor gain medium structured according to an embodiment of the invention to form excited state electrons in the gain medium. The method further includes extracting carriers from the excited states in the gain medium. In the method, the step of amplification of light can include gainful utilization of the majority of the inversion. In particular, amplification of light can be configured to extract between 1% to 5% of the inversion; preferably 1% to 65% of the inversion; more preferably 1% to 75% of the inversion; even more preferably 1% to 85% of the inversion from the gain medium; and even more preferably between 1% and 95% of the inversion, with any specifically defined intermediate ranges.

As present research indicates, the commonly-used and relied upon linear net gain consideration plays little, if any, role in the cumulative MQW structure and, as shown below, super intense pulses defined by operation of an embodiment of the invention continue to mode-lock even when there is a net and sizeable linear absorption in the system. In other words, the system exhibits a strong hysteresis. Mode-locking elements such as semiconductor saturable absorbers, Kerr lensing or other active mode-locking contraptions and/or effects play a peripheral role as self-starting elements in an embodiment of the invention, and as a means of sustaining the circulating pulses.

The mode-locking behavior of a cumulative MQW structure of discussed embodiments is not sensitive to the specific nature of the saturable absorber (e.g., a SESAM with a DBR replacing the simple output coupler, a graphene mirror (GSAM), a Kerr Lens mode-locking or even self-Kerr Lens mode-locking (KLM)); nor is it sensitive to a manner in which a mode-locking element is utilized (reflection or transmission mode). Neither does the mode-locking operation of an embodiment depend on the overall cavity length beyond that dictated by the physics of semiconductor mode-locking.

By leaving relatively few unsaturated carriers behind, the additional benefit of a very robust system that can be driven harder without the likelihood of causing pulse breakup can be obtained—pulse breakup typically arises because reservoirs of unused carriers amplify sub-pulses after the growing pulse bleaches out carriers around its central frequency. Conventional RPG mode-locked systems leave very large reservoirs of unsaturated carriers behind due to inefficient extraction of carriers in narrow spectral windows. These RPG systems are limited in how short a pulse they can generate, and are restricted to low gain situations well below any bleaching threshold—as mentioned above, bleaching at high pump levels tends to destabilize the single pulse and cause pulse breakup as discussed in I. Kilen, J. Hader, J. V Moloney, and S. W. Koch, *Ultrafast Nonequilibrium Carrier Dynamics in Semiconductor Laser Mode-Locking,* Optica (2014), incorporated herein in by reference in its entirety, and observed experimentally by S. Husaini and R. G Bedford, *Graphene Saturable Absorber for High Power Semiconductor Disk Laser Mode-Locking,* Appl. Phys. Letts, 104, 161107 (2014), incorporated herein by reference in its entirety.

The MQW structure can be used with any semiconductor quantum well(s) that exhibits gain (inversion) under external pumping and consequently covers a broad swath of wavelengths, extending from the ultraviolet through to the far infra-red, as well as a wide range of possible semiconductor material systems. For example semiconductor disk lasers (also referred to as Vertical External Cavity Surface Emitting Lasers (VECSELs)) have been demonstrated at UV, visible, near-IR and far-IR wavelengths using GaN-based, GaAs-based, GaSb-based and even PbTe-based material systems. Moreover, the MQW structure applies to all possible methods of optimizing either barrier (Step Index (STIN), Graded Index (GRIN)), quantum well (QW) or electrical pumping, because the MQW structure provides the special quantum well arrangement that maximizes extraction of most or almost all carriers during the pulse transit through the chip.

References throughout this specification to "one embodiment," "an embodiment," "a related embodiment," or similar language mean that a particular feature, structure, or characteristic described in connection with the referred to "embodiment" is included in at least one embodiment of the present invention. Thus, appearances of the phrases "in one embodiment," "in an embodiment," and similar language throughout this specification may, but do not necessarily, all refer to the same embodiment. It is to be understood that no portion of disclosure, taken on its own and in possible connection with a figure, is intended to provide a complete description of all features of the invention. Within this specification, embodiments have been described in a way that enables a clear and concise specification to bet written, but it is intended and will be appreciated that embodiments may be variously combined or separated without parting from the scope of the invention. In particular, it will be appreciated that all features described herein at applicable to all aspects of the invention.

In addition, when the present disclosure describes features of the invention with reference to corresponding drawings (in which like numbers represent the same or similar elements, wherever possible), the depicted structural elements are generally not to scale, and certain components are enlarged relative to the other components for purposes of emphasis and understanding. It is to be understood that no single drawing is intended to support a complete description of all features of the invention. In other words, a given drawing is generally descriptive of only some, and generally not all, features of the invention. A given drawing and an associated portion of the disclosure containing a description referencing such drawing do not, generally, contain all elements of a particular view or all features that can be presented is this view, at least for purposes of simplifying the given drawing and discussion, and directing the discussion to particular elements that are featured in this drawing. A skilled artisan will recognize that the invention may possibly be practiced without one or more of the specific features, elements, components, structures, details, or characteristics, or with the use of other methods, components, materials, and so forth. Therefore, although a particular detail of an embodiment of the invention may not be necessarily shown in each and every drawing describing such embodiment, the presence of this particular detail in the drawing may be implied unless the context of the description requires otherwise. In other instances, well known structures, details, materials, or operations may be not shown in a given drawing or described in detail to avoid obscuring aspects of an embodiment of the invention that are being discussed. Furthermore, the described single features, structures, or characteristics of the invention may be combined in any suitable manner in one or more further embodiments.

The invention as recited in claims appended to this disclosure is intended to be assessed in light of the disclosure as a whole, including features disclosed in prior art to which reference is made.

For the purposes of this disclosure and the appended claims, the use of the terms "substantially", "approximately", "about" and similar terms in reference to a descriptor of a value, element, property or characteristic at hand is intended to emphasize that the value, element, property, or characteristic referred to, while not necessarily being exactly as stated, would nevertheless be considered, for practical purposes, as stated by a person of skill in the art. These terms, as applied to a specified characteristic or quality descriptor means "mostly", "mainly", "considerably", "by and large", "essentially", "to great or significant extent", "largely but not necessarily wholly the same" such as to reasonably denote language of approximation and describe the specified characteristic or descriptor so that its scope would be understood by a person of ordinary skill in the art. In one specific case, the terms "approximately", "substantially", and "about", when used in reference to a numerical value, represent a range of plus or minus 20% with respect to the specified value, more preferably plus or minus 10%, even more preferably plus or minus 5%, most preferably plus or minus 2% with respect to the specified value. As a non-limiting example, two values being "substantially equal" to one another implies that the difference between the two values may be within the range of +/−20% of the value itself, preferably within the +/−10% range of the value itself, more preferably within the range of +/−5% of the value itself, and even more preferably within the range of +/−2% or less of the value itself.

The use of these terms in describing a chosen characteristic or concept neither implies nor provides any basis for indefiniteness and for adding a numerical limitation to the specified characteristic or descriptor. As understood by a skilled artisan, the practical deviation of the exact value or characteristic of such value, element, or property from that stated falls and may vary within a numerical range defined by an experimental measurement error that is typical when using a measurement method accepted in the art for such purposes.

Other specific examples of the meaning of the terms "substantially", "about", and/or "approximately" as applied to different practical situations may have been provided elsewhere in this disclosure.

While certain implementations have been described, these implementations have been presented by way of example only, and are not intended to limit the teachings of this disclosure. Indeed, the novel methods, apparatuses and systems described herein may be embodied in a variety of other forms; furthermore, various omissions, substitutions and changes in the form of the methods, apparatuses and systems described herein may be made without departing from the spirit of this disclosure.

What is claimed is:

1. A surface-emitting semiconductor laser system configured to operate in a mode-locked regime, the laser system comprising:
  an optical resonator having an optical axis;
  a semiconductor laser chip within the optical resonator, the semiconductor laser chip containing a semiconductor gain medium,
    wherein said semiconductor gain medium is characterized by a gain spectrum, the gains spectrum having a bandwidth that includes a first wavelength, wherein said semiconductor gain medium has a first multiple quantum well (MQW) unit, said first MQW unit defined by a sequence of at least three first quantum wells (QWs) that are spaced substantially non-equidistantly with respect to one another; and a pump source in operable communication with said semiconductor laser chip and configured to pump energy to the semiconductor gain medium to produce excited-state carriers in the first MQW unit, wherein said semiconductor laser system is configured to form a standing optical wave within said semiconductor laser chip at a frequency of the first wavelength, said standing optical wave having first and second immediately neighboring modes located along the optical axis within the semiconductor gain medium, said first and second nodes formed on the opposite sides of said first MQW unit.

2. A laser system according to claim 1, wherein the first MQW unit is positioned asymmetrically between the first and second immediately neighboring nodes.

3. A laser system according to claim 1, further comprising a mode-lock element disposed in optical communication with the laser chip and configured to define mode-locked pulses of optical radiation inside said optical resonator when said energy is pumped to the laser chip.

4. A laser system according to claim 3, wherein the mode-lock element comprises at least one of a semiconductor saturable absorber mirror element, a self-phase modulation Kerr lens element, and an active modulation element.

5. A laser system according to claim 1, wherein said laser system is configured to define durations, of said mode-locked pulses, each of which durations is shorter than one hundred femtoseconds.

6. A laser system according to claim 1, wherein two neighboring QWs from said at least three first QWs are separated from one another by a first confinement barrier material, the first confinement barrier material having a first thickness that is smaller than a thickness of a QW from the first QWs to delocalize at least one carrier wavefunction over more than one first QW.

7. A laser system according to claim 1, wherein an overall thickness of said first MQW unit, measured along the optical axis, is greater than a half of a distance between the first and second immediately neighboring nodes of said standing optical wave.

8. A laser system according to claim 1, wherein the semiconductor gain medium includes a base material that is a compound semiconductor comprising a combination of elements from (i) groups III and V of the periodic table, or (ii) groups II and VI of the periodic table.

9. A laser system according to claim 1, wherein the pump source is configured to electrically create electrons in a conduction band of the semiconductor gain medium.

10. A laser system according to claim 1, wherein the pump source includes a (p-and-n) doped semiconductor chip.

11. A laser system according to claim 1, further comprising an optical system configured as at least one of a single-pass optical pumping system, a multi-pass Z-cavity optical pumping system, a multi-pass V-cavity optical pumping system, and a linear cavity optical pumping system, said optical system positioned to define optical communication between the semiconductor gain medium and the pump source to create electrons in a conduction band of the semiconductor gain medium with radiation from the pump source.

12. A laser system according to claim 1, wherein said standing optical wave has third and fourth nodes located along the optical axis within the gain medium, said third and fourth nodes being immediately neighboring to one another, wherein said gain medium includes a second MQW unit, said second MQW unit containing at least one second QW, said second MQW unit located between the third and fourth nodes, and wherein the pump source is configured to pump energy to the gain medium to produce excited carriers in all MQW units present in the laser system.

13. A laser system according to claim 12, wherein said at least one second QW includes at least three second QWs that are spaced substantially non-equidistantly with respect to one another.

14. A laser system according to claim 12, wherein a reflector of the optical resonator includes a distributed Bragg reflector (DBR) integrated with the gain medium, wherein said second and third nodes are immediately neighboring to one another such that the first, second, third, and fourth nodes form a sequence of nodes in which the first node is the closest to the DBR;

wherein the first MQW unit includes four first QWs, the second MQW unit includes at least three second QWs; and further comprising a third MQW unit containing multiple third QWs, said third MQW unit located between the second and third nodes.

15. A laser system according to claim 14, QWs of at least one of the second and third MQW units are spaced substantially non-equidistantly with respect to one another.

16. A laser system according to claim 1, wherein said standing optical wave has a third node located along the optical axis within the gain medium, said second and third nodes being immediately neighboring with respect to one another, and wherein said gain medium includes a second MQW unit, said second MQW unit containing a sequence of at least three second QWs, all of said at least three second QWs located between the second and third nodes.

17. A laser system according to claim 16, wherein said at least three second QWs are separated from one another substantially non-equidistantly.

18. A laser system according to claim 1, wherein a reflector of the optical resonator has a reflectance exceeding 99% at the first wavelength, said reflector being one of a distributed Bragg reflector and a simple reflector.

19. A laser system according to claim 18, wherein said optical resonator further comprises an output coupler configured to transmit radiation, generated with the gain medium, outside the optical resonator, wherein said reflector is in integrated with the semiconductor gain medium, and wherein said laser system contains a space between the laser chip and the output coupler.

20. A laser system according to claim 1, wherein said standing optical wave has third and fourth nodes located along the optical axis, the third node located within a space occupied by a reflector of the optical resonator, the fourth node located within the gain medium, said third and fourth nodes being immediately neighboring to one another, wherein said gain medium includes a second MQW unit, said second MQW unit containing at least one second QW, said second MQW unit located between the third and fourth nodes, and wherein the pump source is configured to pump energy to the gain medium to produce excited carriers in all MQW units present in the laser system.

* * * * *